point FFT/IFFT

United States Patent
Karabinis

(10) Patent No.: US 9,705,535 B2
(45) Date of Patent: *Jul. 11, 2017

(54) SYSTEMS/METHODS OF CARRIER AGGREGATION

(71) Applicant: Odyssey Wireless, Inc., Cary, NC (US)

(72) Inventor: Peter D. Karabinis, Cary, NC (US)

(73) Assignee: Odyssey Wireless, Inc., Cary, NC (US)

( * ) Notice: Subject to any disclaimer, the term of this patent is extended or adjusted under 35 U.S.C. 154(b) by 2 days.

This patent is subject to a terminal disclaimer.

(21) Appl. No.: 14/567,807

(22) Filed: Dec. 11, 2014

(65) Prior Publication Data

US 2015/0092733 A1    Apr. 2, 2015

Related U.S. Application Data

(63) Continuation of application No. 14/509,373, filed on Oct. 8, 2014, now Pat. No. 9,124,381, which is a (Continued)

(51) Int. Cl.
*H04B 1/04* (2006.01)
*H04L 5/00* (2006.01)
(Continued)

(52) U.S. Cl.
CPC ............ *H04B 1/04* (2013.01); *H04B 7/0456* (2013.01); *H04B 7/068* (2013.01); *H04B 7/0885* (2013.01);
(Continued)

(58) Field of Classification Search
CPC ..... H04W 72/046; H04L 25/0204; H04B 1/04
See application file for complete search history.

(56) References Cited

U.S. PATENT DOCUMENTS

| 4,635,276 A | 1/1987 | Karabinis |
| 4,882,668 A | 11/1989 | Schmid et al. |

(Continued)

FOREIGN PATENT DOCUMENTS

| EP | 0 869 647 A2 | 10/1998 |
| EP | 1 328 071 A1 | 7/2003 |

(Continued)

OTHER PUBLICATIONS

3G Americas, "UMTS Evolution from 3GPP Release 7 to Release 8 HSPA and SAE/LTE", Jul. 2007, 89 pp.
(Continued)

*Primary Examiner* — Andrew Lai
*Assistant Examiner* — Jamaal Henson
(74) *Attorney, Agent, or Firm* — Coats & Bennett, PLLC

(57) ABSTRACT

Various embodiments of carrier aggregation are provided that increase communications capacity and throughput. According to some embodiments, a receiver may be configured with a plurality of receiver chains and, responsive to an aggregate bandwidth of an overall signal that is to be received by the receiver, a plurality of components of the overall signal, each comprising a bandwidth that is less than a frequency span of the overall signal, are received by a respective plurality of receiver chains. Accordingly, each component of the plurality of components of the overall signal may be received by a respective receiver chain of the plurality of receiver chains of the receiver thus avoiding bandwidth limitations associated with receiver elements.

57 Claims, 24 Drawing Sheets

Related U.S. Application Data continuation of application No. 13/767,537, filed on Feb. 14, 2013, now Pat. No. 8,891,645, which is a continuation of application No. 13/528,058, filed on Jun. 20, 2012, now Pat. No. 8,537,916, which is a continuation of application No. 12/748,931, filed on Mar. 29, 2010, now Pat. No. 8,233,554, said application No. 13/767,537 is a continuation-in-part of application No. 12/481,084, filed on Jun. 9, 2009, now Pat. No. 8,462,860, and a continuation-in-part of application No. 12/978,092, filed on Dec. 23, 2010, now Pat. No. 8,537,910, which is a continuation of application No. 12/620,057, filed on Nov. 17, 2009, now Pat. No. 7,881,393, which is a continuation of application No. 12/372,354, filed on Feb. 17, 2009, now Pat. No. 7,876,845, which is a continuation-in-part of application No. 11/720,115, filed as application No. PCT/US2006/020417 on May 25, 2006, now Pat. No. 8,050,337.

(60) Provisional application No. 61/078,598, filed on Jul. 7, 2008, provisional application No. 61/100,142, filed on Sep. 25, 2008, provisional application No. 61/116,856, filed on Nov. 21, 2008, provisional application No. 61/117,437, filed on Nov. 24, 2008, provisional application No. 61/119,593, filed on Dec. 3, 2008, provisional application No. 61/155,264, filed on Feb. 25, 2009, provisional application No. 61/163,119, filed on Mar. 25, 2009, provisional application No. 61/033,114, filed on Mar. 3, 2008, provisional application No. 60/692,932, filed on Jun. 22, 2005, provisional application No. 60/698,247, filed on Jul. 11, 2005.

(51) Int. Cl.
| | | |
|---|---|---|
| *H04L 27/26* | (2006.01) | |
| *H04B 7/26* | (2006.01) | |
| *H04B 7/0456* | (2017.01) | |
| *H04B 7/06* | (2006.01) | |
| *H04J 11/00* | (2006.01) | |
| *H04W 72/04* | (2009.01) | |
| *H04B 7/08* | (2006.01) | |
| *H04B 7/10* | (2017.01) | |
| *H04L 25/02* | (2006.01) | |
| *H04L 25/03* | (2006.01) | |

(52) U.S. Cl.
CPC ............ *H04B 7/26* (2013.01); *H04J 11/0036* (2013.01); *H04L 5/0007* (2013.01); *H04L 27/265* (2013.01); *H04L 27/2627* (2013.01); *H04L 27/2628* (2013.01); *H04L 27/2633* (2013.01); *H04L 27/2634* (2013.01); *H04L 27/2647* (2013.01); *H04W 72/046* (2013.01); *H04B 7/0842* (2013.01); *H04B 7/10* (2013.01); *H04B 2001/0408* (2013.01); *H04L 25/0204* (2013.01); *H04L 25/0224* (2013.01); *H04L 25/03006* (2013.01); *H04L 25/03343* (2013.01); *H04L 2025/03414* (2013.01)

(56) References Cited

U.S. PATENT DOCUMENTS

| | | |
|---|---|---|
| 5,029,184 A | 7/1991 | Andren et al. |
| 5,117,401 A | 5/1992 | Feintuch |
| 5,394,433 A | 2/1995 | Bantz et al. |
| 5,559,828 A | 9/1996 | Armstrong et al. |
| 5,778,029 A | 7/1998 | Kaufmann |
| 5,835,057 A | 11/1998 | van Heyningen |
| 5,848,160 A | 12/1998 | Cai et al. |
| 5,966,312 A | 10/1999 | Chen |
| 5,974,305 A * | 10/1999 | Matero ............... H04B 1/005 455/180.1 |
| 6,140,935 A | 10/2000 | Hayton et al. |
| 6,141,567 A | 10/2000 | Youssefmir et al. |
| 6,198,730 B1 | 3/2001 | Hogberg et al. |
| 6,243,370 B1 | 6/2001 | Schilling |
| 6,295,461 B1 | 9/2001 | Palmer et al. |
| 6,363,261 B1 | 3/2002 | Raghavan |
| 6,389,002 B1 | 5/2002 | Schilling |
| 6,407,989 B2 | 6/2002 | Schilling |
| 6,415,032 B1 | 7/2002 | Doland |
| 6,433,720 B1 | 8/2002 | Libove et al. |
| 6,466,629 B1 | 10/2002 | Isaksson et al. |
| 6,473,449 B1 | 10/2002 | Cafarella et al. |
| 6,484,260 B1 | 11/2002 | Scott et al. |
| 6,538,787 B1 | 3/2003 | Moeller et al. |
| 6,564,187 B1 | 5/2003 | Kikumoto et al. |
| 6,661,847 B1 | 12/2003 | Davis et al. |
| 6,683,953 B1 | 1/2004 | Kasahara et al. |
| 6,711,145 B2 | 3/2004 | Schilling |
| 6,724,807 B1 | 4/2004 | Krasner et al. |
| 6,765,895 B1 | 7/2004 | Watanabe |
| 6,765,969 B1 | 7/2004 | Vook et al. |
| 6,799,141 B1 | 9/2004 | Stoustrup et al. |
| 6,922,570 B2 | 7/2005 | Awater et al. |
| 6,965,992 B1 | 11/2005 | Joseph et al. |
| 6,980,609 B1 | 12/2005 | Ahn |
| 7,017,047 B2 | 3/2006 | Vanska et al. |
| 7,020,125 B2 | 3/2006 | Schilling |
| 7,020,165 B2 | 3/2006 | Rakib et al. |
| 7,054,301 B1 | 5/2006 | Sousa et al. |
| 7,079,870 B2 | 7/2006 | Vaidyanathan |
| 7,099,678 B2 | 8/2006 | Vaidyanathan |
| 7,113,601 B2 | 9/2006 | Ananda |
| 7,113,760 B1 * | 9/2006 | Petrov ............... H04B 1/30 455/209 |
| 7,117,662 B2 * | 10/2006 | Hirayama ............ F02C 9/28 60/39.27 |
| 7,145,933 B1 | 12/2006 | Szajnowski |
| 7,155,340 B2 | 12/2006 | Churan |
| 7,177,662 B2 | 2/2007 | Trachewsky et al. |
| 7,203,490 B2 | 4/2007 | Karabinis et al. |
| 7,218,693 B2 | 5/2007 | Troulis |
| 7,280,604 B2 | 10/2007 | Giannakis et al. |
| 7,289,972 B2 | 10/2007 | Rieser et al. |
| 7,292,627 B2 | 11/2007 | Tzannes |
| 7,295,637 B2 | 11/2007 | Papathanasiou et al. |
| 7,333,422 B2 | 2/2008 | Amer |
| 7,346,125 B2 | 3/2008 | Washakowski et al. |
| 7,362,695 B2 | 4/2008 | Akahori |
| 7,362,829 B2 | 4/2008 | Ojard |
| 7,395,040 B2 * | 7/2008 | Behzad ............... H04B 1/005 455/168.1 |
| 7,418,053 B2 | 8/2008 | Perlman et al. |
| 7,444,170 B2 | 10/2008 | Karabinis |
| 7,454,175 B2 | 11/2008 | Karabinis |
| 7,483,672 B2 | 1/2009 | Hart et al. |
| 7,505,522 B1 | 3/2009 | Larsson |
| 7,539,241 B1 | 5/2009 | Dick |
| 7,561,212 B2 | 7/2009 | Nakamura |
| 7,613,242 B2 | 11/2009 | Bykovnikov |
| 7,616,704 B2 | 11/2009 | Li et al. |
| 7,668,253 B2 | 2/2010 | Hwang et al. |
| 7,733,940 B2 | 6/2010 | Dooley et al. |
| 7,738,571 B2 | 6/2010 | Costa et al. |
| 7,756,002 B2 | 7/2010 | Batra et al. |
| 7,830,995 B2 | 11/2010 | Ojard |
| 7,876,845 B2 | 1/2011 | Karabinis |
| 7,949,032 B1 | 5/2011 | Frost |
| 7,970,345 B2 | 6/2011 | Cummiskey et al. |
| 7,974,176 B2 | 7/2011 | Zheng |
| 7,986,742 B2 | 7/2011 | Ketchum et al. |
| 8,050,337 B2 | 11/2011 | Karabinis |
| 8,185,931 B1 | 5/2012 | Reeves |
| 8,233,554 B2 | 7/2012 | Karabinis |
| 8,406,276 B2 | 3/2013 | Michaels et al. |

(56) References Cited

U.S. PATENT DOCUMENTS

| | | |
|---|---|---|
| 8,437,470 B2 | 5/2013 | Mantin et al. |
| 8,646,060 B1 | 2/2014 | Ben Ayed |
| 8,660,169 B1 | 2/2014 | Karabinis |
| 2001/0048538 A1 | 12/2001 | Kowalski |
| 2001/0050926 A1 | 12/2001 | Kumar |
| 2002/0065099 A1 | 5/2002 | Bjorndahl |
| 2002/0083330 A1 | 6/2002 | Shiomi et al. |
| 2002/0122499 A1 | 9/2002 | Kannan et al. |
| 2002/0126741 A1 | 9/2002 | Baum et al. |
| 2002/0150109 A1 | 10/2002 | Agee |
| 2002/0159533 A1 | 10/2002 | Crawford |
| 2002/0191534 A1 | 12/2002 | Silvers et al. |
| 2002/0193115 A1 | 12/2002 | Furukawa et al. |
| 2002/0196765 A1 | 12/2002 | Tulino |
| 2003/0043929 A1* | 3/2003 | Sampath .............. H04B 7/0417 375/267 |
| 2003/0053625 A1 | 3/2003 | Bially et al. |
| 2003/0072397 A1* | 4/2003 | Kim .................. H04B 7/0848 375/347 |
| 2003/0095659 A1 | 5/2003 | Ishihara et al. |
| 2003/0107513 A1 | 6/2003 | Abraham et al. |
| 2003/0123582 A1* | 7/2003 | Kim .................. H04B 7/0848 375/347 |
| 2003/0156014 A1 | 8/2003 | Kodama et al. |
| 2003/0161385 A1 | 8/2003 | Chang et al. |
| 2003/0203743 A1* | 10/2003 | Sugar .................. H04B 1/005 455/550.1 |
| 2003/0228017 A1 | 12/2003 | Beadle et al. |
| 2003/0231714 A1 | 12/2003 | Kjeldsen et al. |
| 2004/0001533 A1 | 1/2004 | Tran et al. |
| 2004/0005013 A1 | 1/2004 | Nunally et al. |
| 2004/0039524 A1 | 2/2004 | Adachi |
| 2004/0059225 A1 | 3/2004 | Hao et al. |
| 2004/0080315 A1 | 4/2004 | Beevor et al. |
| 2004/0081127 A1 | 4/2004 | Gardner et al. |
| 2004/0086027 A1 | 5/2004 | Shattil |
| 2004/0093224 A1 | 5/2004 | Vanska et al. |
| 2004/0095907 A1 | 5/2004 | Agee et al. |
| 2004/0132417 A1 | 7/2004 | Maeda et al. |
| 2004/0135723 A1* | 7/2004 | Nakaya .............. H04B 7/0874 342/372 |
| 2004/0136438 A1 | 7/2004 | Fullerton et al. |
| 2004/0139320 A1 | 7/2004 | Shinohara |
| 2004/0151109 A1 | 8/2004 | Batra et al. |
| 2004/0166857 A1 | 8/2004 | Shim et al. |
| 2004/0170430 A1 | 9/2004 | Gorokhov |
| 2004/0252853 A1 | 12/2004 | Blamey et al. |
| 2005/0013238 A1 | 1/2005 | Hansen |
| 2005/0014464 A1 | 1/2005 | Larsson |
| 2005/0084000 A1 | 4/2005 | Krauss et al. |
| 2005/0085197 A1* | 4/2005 | Laroia .................. H01Q 3/24 455/101 |
| 2005/0128938 A1 | 6/2005 | Fang et al. |
| 2005/0130684 A1 | 6/2005 | Kim et al. |
| 2005/0141624 A1 | 6/2005 | Lakshmipathi et al. |
| 2005/0141644 A1* | 6/2005 | Sadowsky ........ H04L 25/03216 375/324 |
| 2005/0207385 A1 | 9/2005 | Gorokhov et al. |
| 2005/0208944 A1 | 9/2005 | Okita et al. |
| 2005/0233752 A1* | 10/2005 | Laroia .................. H04L 5/0007 455/450 |
| 2005/0243938 A1 | 11/2005 | Armstrong et al. |
| 2005/0255878 A1 | 11/2005 | Leinonen et al. |
| 2005/0265275 A1 | 12/2005 | Howard et al. |
| 2005/0281321 A1 | 12/2005 | Bergstrom et al. |
| 2006/0009209 A1 | 1/2006 | Rieser et al. |
| 2006/0039553 A1 | 2/2006 | Suen et al. |
| 2006/0045196 A1 | 3/2006 | Reid |
| 2006/0062320 A1 | 3/2006 | Luz et al. |
| 2006/0062391 A1 | 3/2006 | Lee et al. |
| 2006/0084444 A1 | 4/2006 | Kossi et al. |
| 2006/0088187 A1 | 4/2006 | Clarkson et al. |
| 2006/0094373 A1 | 5/2006 | Hottinen |
| 2006/0120477 A1 | 6/2006 | Shen et al. |
| 2006/0133633 A1 | 6/2006 | Hyvonen et al. |
| 2006/0140249 A1 | 6/2006 | Kohno |
| 2006/0159260 A1 | 7/2006 | Pereira et al. |
| 2006/0165100 A1 | 7/2006 | Huang et al. |
| 2006/0165155 A1 | 7/2006 | Liu et al. |
| 2006/0165191 A1 | 7/2006 | Lin et al. |
| 2006/0171445 A1 | 8/2006 | Batra et al. |
| 2006/0178124 A1 | 8/2006 | Sugar |
| 2006/0189309 A1 | 8/2006 | Good et al. |
| 2006/0199532 A1 | 9/2006 | Soliman |
| 2006/0203758 A1 | 9/2006 | Tee et al. |
| 2006/0209779 A1 | 9/2006 | Rousu et al. |
| 2006/0227889 A1 | 10/2006 | Uchida et al. |
| 2006/0233147 A1 | 10/2006 | Karabinis |
| 2006/0234646 A1 | 10/2006 | Naguib et al. |
| 2006/0239334 A1 | 10/2006 | Kwon et al. |
| 2006/0280116 A1 | 12/2006 | Ji et al. |
| 2007/0004465 A1 | 1/2007 | Papasakellariou et al. |
| 2007/0015460 A1 | 1/2007 | Karabinis et al. |
| 2007/0032890 A1 | 2/2007 | Zhou et al. |
| 2007/0041311 A1 | 2/2007 | Baum et al. |
| 2007/0053449 A1 | 3/2007 | Adachi |
| 2007/0071127 A1 | 3/2007 | Gore et al. |
| 2007/0092018 A1 | 4/2007 | Fonseka et al. |
| 2007/0135051 A1 | 6/2007 | Zheng et al. |
| 2007/0177680 A1 | 8/2007 | Green et al. |
| 2007/0184837 A1 | 8/2007 | Hohl et al. |
| 2007/0194976 A1 | 8/2007 | Reed et al. |
| 2007/0211786 A1 | 9/2007 | Shattil |
| 2007/0216488 A1 | 9/2007 | Kultgen |
| 2007/0233383 A1 | 10/2007 | Churan |
| 2007/0236386 A1 | 10/2007 | Harpak et al. |
| 2007/0238475 A1 | 10/2007 | Goedken |
| 2007/0248194 A1 | 10/2007 | Lu |
| 2007/0271606 A1 | 11/2007 | Amann et al. |
| 2007/0281693 A1 | 12/2007 | Ballentin et al. |
| 2007/0285308 A1 | 12/2007 | Bauregger et al. |
| 2008/0008471 A1 | 1/2008 | Dress |
| 2008/0019341 A1 | 1/2008 | Perlman |
| 2008/0113624 A1 | 5/2008 | Seidel et al. |
| 2008/0144612 A1 | 6/2008 | Honkasalo et al. |
| 2008/0152050 A1 | 6/2008 | Watanabe |
| 2008/0167003 A1 | 7/2008 | Wang et al. |
| 2008/0187066 A1 | 8/2008 | Wang et al. |
| 2008/0215888 A1 | 9/2008 | Barriga et al. |
| 2008/0229108 A1 | 9/2008 | Chase-Salerno et al. |
| 2008/0231454 A1 | 9/2008 | Curcio |
| 2008/0268844 A1 | 10/2008 | Ma et al. |
| 2008/0304605 A1 | 12/2008 | Aziz et al. |
| 2009/0061786 A1 | 3/2009 | Malik et al. |
| 2009/0063111 A1 | 3/2009 | Hollis |
| 2009/0092041 A1 | 4/2009 | Juang |
| 2009/0110033 A1 | 4/2009 | Shattil |
| 2009/0113543 A1 | 4/2009 | Adams et al. |
| 2009/0153367 A1 | 6/2009 | Lee |
| 2009/0168730 A1 | 7/2009 | Baum et al. |
| 2009/0168844 A1 | 7/2009 | Larsson |
| 2009/0213947 A1 | 8/2009 | Rao et al. |
| 2009/0225814 A1 | 9/2009 | Bastug et al. |
| 2009/0252257 A1 | 10/2009 | Sadowsky et al. |
| 2009/0268834 A1 | 10/2009 | Ariyavisitakul et al. |
| 2009/0279422 A1 | 11/2009 | Fonseka et al. |
| 2009/0282472 A1 | 11/2009 | Hamilton, II et al. |
| 2010/0002789 A1 | 1/2010 | Karabinis |
| 2010/0008498 A1 | 1/2010 | Shirai et al. |
| 2010/0024042 A1 | 1/2010 | Motahari et al. |
| 2010/0067591 A1 | 3/2010 | Luo et al. |
| 2010/0070874 A1 | 3/2010 | Adamczyk et al. |
| 2010/0121617 A1 | 5/2010 | Gruener et al. |
| 2010/0208775 A1 | 8/2010 | Weill |
| 2010/0225752 A1 | 9/2010 | Bench et al. |
| 2010/0265845 A1 | 10/2010 | Lampén |
| 2011/0080877 A1 | 4/2011 | Nentwig |
| 2011/0123028 A1 | 5/2011 | Karabinis |
| 2011/0142182 A1 | 6/2011 | Gu |
| 2011/0143700 A1 | 6/2011 | Lagunas Hernandez et al. |
| 2011/0197740 A1 | 8/2011 | Chang et al. |
| 2011/0219423 A1 | 9/2011 | Aad et al. |
| 2011/0222495 A1 | 9/2011 | Li et al. |

(56) References Cited

U.S. PATENT DOCUMENTS

| | | |
|---|---|---|
| 2011/0228989 A1 | 9/2011 | Burton |
| 2011/0314539 A1 | 12/2011 | Horton |
| 2012/0039379 A1 | 2/2012 | Husen et al. |
| 2012/0057651 A1 | 3/2012 | Kim |
| 2012/0099679 A1 | 4/2012 | Yamada et al. |
| 2012/0214443 A1 | 8/2012 | Daigle |
| 2012/0230449 A1 | 9/2012 | Futatsugi et al. |
| 2013/0156218 A1 | 6/2013 | Annacone et al. |
| 2013/0308733 A1 | 11/2013 | Kato et al. |

FOREIGN PATENT DOCUMENTS

| | | |
|---|---|---|
| EP | 1 589 712 A2 | 10/2005 |
| WO | WO 2005/036790 A1 | 4/2005 |
| WO | WO 2007/001707 A2 | 1/2007 |

OTHER PUBLICATIONS

3GPP/LTE Advanced, "3$^{rd}$ Generation Partnership Project: Technical Specification Group Radio Access Network; Evolved Universal Terrestrial Radio Access (E-UTRA); Physical channels and modulation (Release 10)", 3GPP TS 36.211, V10.0.0, Dec. 2010, 103 pp.

Agilent Technologies, "Introducing LTE-Advanced", Application Note, Retrieved from the internet at URL: http://cp.literature.agilent.com/litweb/pdf/5990-6706EN.pdf , Printed in USA, Mar. 8, 2011, 36 pages.

Akan et al. "ATL: An Adaptive Transport Layer Suite for Next-Generation Wireless Internet", *IEEE Journal on Selected Areas in Communications*, vol. 22, No. 5, Jun. 2004, 802-817.

Akyildiz et al. "AdaptNet: An Adaptive Protocol Suite for the Next-Generation Wireless Internet", *IEEE Communications Magazine*, Mar. 2004, 128-136.

Akyildiz et al. "Wireless mesh networks: a survey", *Computer Networks*, vol. 47 (4), 2005, 445-487.

Benvenuto et al., "On the Comparison Between OFDM and Single Carrier Modulation With a DFE Using a Frequency-Domain Feedforward Filter", *IEEE Transactions on Communications*, vol. 50, No. 6, Jun. 2002, pp. 947-955.

Brodersen et al. "CORVUS: A Cognitive Radio Approach for Usage of Virtual Unlicensed Spectrum", *Berkeley Wireless Research Center (BWRC)*, White Paper, 2004, 21 pp.

Brüninghaus et al., "Multi-Carrier Spread Spectrum and Its Relationship to Single Carrier Transmission", *48$^{th}$ IEEE Vehicular Technology Conference*, Ottawa, Ontario, vol. 3, May 18-21, 1998, pp. 2329-2332.

Buddhikot et al. "DIMSUMNet: New Directions in Wireless Networking Using Coordinated Dynamic Spectrum Access", *Proceedings of the Sixth IEEE International Symposium on a World of Wireless Mobile and Multimedia Networks (WoWMoM '05)*, 2005, 8 pp.

Cabric et al. "A Cognitive Radio Approach for Usage of Virtual Unlicensed Spectrum", *Proceedings of the 14$^{th}$ IST Mobile and Wireless Communications Summit*, Jun. 2005, 5 pp.

Cabric et al. "Implementation Issues in Spectrum Sensing for Cognitive Radios", *Proc. 38$^{th}$ Asilomar Conference on Signals, Systems and Computers*, Nov. 2004, 772-776.

Carroll "Chaotic communications that are difficult to detect" *Physical Review E* 67(2):26207-1-26207-6 (2003).

Charalabopoulos et al. "Pre- post- and balanced equalization in OFDM", Vehicular Technology Conference, 2003. VTC 2003—Fall. 2003 IEEE 58$^{th}$ Orlando, FL, USA; Oct. 6-9, 2003; Piscataway, NJ USA, IEEE, US, vol. 5, Oct. 6, 2003, pp. 3145-3148.

Dahlman E. et al. "3G Evolution HSPA and LTE for Mobile Broadband", 2008, Elsevier Ltd., Oxford US, pp. 383-387.

Dahlman E. et al., *3G Evolution: HSPA and LTE for Mobile Broadband*—2d Edition, (Burlington, MA: Academic Press, 2008), Chapter 4, pp. 43-64.

Dahlman, "3G long-term evolution", Telefon AB LM Ericsson, 2005, 36 pp.

DARPA XG Working Group, "The XG Architectural Framework, Request for Comments, V1.0", Prepared by BBN Technologies, Cambridge, MA, US, Jul. 2003, 16 pp.

DARPA XG Working Group, "The XG Vision, Request for Comments, V2.0", Prepared by BBN Technologies, Cambridge MA, US, Jan. 2004, 17 pp.

Digham et al. "On the Energy Detection of Unknown Signals over Fading Channels", *Proc. IEEE ICC 2003*, vol. 5, May 2003, 3575-3579.

Dinis et al., "A Multiple Access Scheme for the Uplink of Broadband Wireless Systems", *IEEE Global Telecommunications Conference*, Nov. 29-Dec. 3, 2004, vol. 6, pp. 3808-3812.

Dollard P.M. "On the time-bandwidth concentration of signal functions forming given geometric vector configurations", *IEEE Transactions on Information Theory*, Oct. 1964, pp. 328-338.

Ekström et al., "Technical Solutions for the 3G Long-Term Evolution", *IEEE Communications Magazine*, vol. 44, No. 3, Mar. 2006, pp. 38-45.

Esteves "The High Data Rate Evolution of the cdma2000 Cellular System", *Appeared in Multiaccess, Mobility and Teletraffic for Wireless Communications*, vol. 5, Kluwer Academic Publishers, 2000, pp. 61-72.

Falconer et al., "Frequency Domain Equalization for Single-Carrier Broadband Wireless Systems", *IEEE Communications Magazine*, vol. 40, No. 4, Apr. 2002, pp. 58-66.

Federal Communications Commission, FCC 03-289, ET Docket No. 03-237, Notice of Inquiry and Notice of Proposed Rulemaking, Nov. 2003, 31 pp.

Federal Communications Commission, FCC 03-322, ET Docket No. 03-108, Notice of Proposed Rule Making and Order, Dec. 2003, 53 pp.

Galda et al., "A Low Complexity Transmitter Structure for OFDM-FDMA Uplink Systems" *IEEE 55$^{th}$ Vehicular Technology Conference*, 2002, vol. 4, May 2002, pp. 1737-1741.

Gardner "Signal Interception: A Unifying Theoretical Framework for Feature Detection" *IEEE Transactions on Communications* 36(8):897-906 (1988).

Gessner et al., "LTD technology and LTE test; a deskside chat", Rohde & Schwarz, Apr. 2009, 92 pp.

Grandblaise et al. "Dynamic Spectrum Allocation (DSA) and Reconfigurability", *Proceeding of the SDR 02 Technical Conference and Product Exposition*, Nov. 2002, 6 pp.

Haykin "Cognitive Radio: Brain-Empowered Wireless Communications", *IEEE Journal on Selected Areas in Communications*, vol. 23, No. 2, Feb. 2005, 201-220.

Haykin, S., *Adaptive Filter Theory*, 1986, Prentice-Hall, pp. 173,301,497.

Hillenbrand et al. "Calculation of Detection and False Alarm Probabilities in Spectrum Pooling Systems", *IEEE Communications Letters*, vol. 9, No. 4, Apr. 2005, 349-351.

Holma et al. "LTE for UMTS—OFDMA and SC-FDMA Based Radio Access" 2009, John Wiley & Sons, Ltd., Chichester UK, pp. 76-82.

Horne "Adaptive Spectrum Access: Using the Full Spectrum Space", *Proc. Telecommunications Policy Research Conference (TPRC)*, Sep. 2003, 15 pp.

Hoven et al., "Some Fundamental Limits on Cognitive Radio", PowerPoint presentation, Wireless Foundations, EECS, University of California at Berkeley, Feb. 11, 2005, 16 pp.

International Preliminary Report on Patentability, PCT International Application No. PCT/US09/01152, Nov. 8, 2010.

International Search Report and Written Opinion, PCT International Application No. PCT/US2009/003495, Nov. 26, 2009.

Invitation to Pay Additional Fees corresponding to International Application No. PCT/US2010/029028; Date of Mailing: Jan. 28, 2011; 11 pages.

Ishii, "Draft2 Report of 3GPP TSG RAN WG1 #40bis in Beijing (Beijing, China, Apr. 4-8, 2005)", R1-050376, Agenda Item 3, 3GPP TSG RAN WG1 Meeting #41, Athens, Greece, May 9-13, 2005, 65 pp.

Ixia "SC-FDMA Single Carrier FDMA in LTE" White Paper, Rev. A, Nov. 2009, 16 pp.

(56) References Cited

OTHER PUBLICATIONS

Jondral "Software-Defined Radio-Basics and Evolution to Cognitive Radio", *EURASIP Journal on Wireless Communications and Networking*, 2005:3, 275-283.
Jungnickel V. et al., "Synchronization of Cooperative Base Stations", *IEEE International Symposium on Wireless Communications Systems*; Oct. 21-24, 2008, 6 pages.
Kanodia et al. "MOAR: A Multi-channel Opportunistic Auto-rate Media Access Protocol for Ad Hoc Networks", *Proceedings of the First International Conference on Broadband Networks (BROADNETS '04)*, Oct. 2004, 600-610.
Karabinis "*Increased Capacity Communications for OFDM-Based Wireless Communications Systems/Methods/Devices*", U.S. Appl. No. 12/748,931, filed Mar. 29, 2010.
Landau H.J. & Pollak H.O., "Prolate spheroidal wave functions, Fourier analysis and uncertainty—III: The dimension of the space of essentially time- and band-limited signals", *Bell System Technical Journal*, 41, pp. 1295-1336, Jul. 1962.
Leaves et al. "Dynamic Spectrum Allocation in Composite Reconfigurable Wireless Networks", *IEEE Communications Magazine*, vol. 42, May 2004, 72-81.
Lim et al., "Channel-Dependent Scheduling of Uplink Single Carrier FDMA Systems" *IEEE 64th Vehicular Technology Conference*, Montreal, Quebec, Sep. 25-28, 2006, pp. 1-5.
Mietzner et al. "Multiple-antenna techniques for wireless communications—a comprehensive literature survey", IEEE Communications Surveys, IEEE, New York, NY, US; vol. 11, No. 2, Apr. 1, 2009, pp. 87-105.
Mitola III "Cognitive Radio for Flexible Mobile Multimedia Communications", *IEEE International Workshop on Mobile Multimedia Communications (MoMuC)*, Nov. 1999, 3-10.
Mitola III et al. "Cognitive Radio: Making Software Radios More Personal", *IEEE Personal Communications*, vol. 6, Issue 4, Aug. 1999, 13-18.
Mitola III, Dissertation "Cognitive Radio—An Integrated Agent Architecture of Software Defined Radio", Royal Institute of Technology, May 8, 2000, 313 pp.
Motorola, "R1-050971 Single Carrier Uplink Options for E-UTRA: IFDMA/DFT-SOFDM Discussion and Initial Performance Results", 3GPP TSG RAN WG1 #42, London, United Kingdom, Agenda Item: 10.3, Aug. 29-Sep. 2, 2005, 30 pp.
Motorola, "Uplink Numerology and Frame Structure", 3GPP TSG RAN1#41 Meeting, Athens, Greece, Agenda Item 13.2, May 9-13, 2005, 10 pp.
Murty R. "Software-defined reconfigurability radios: smart, agile, cognitive, and interoperable", downloaded Nov. 12, 2013 from http://www.siliconinvestor.com/readmsg.aspx?msgid-19066134, 4 pp.
Myung et al., "Single Carrier FDMA for Uplink Wireless Transmission", *IEEE Vehicular Technology Magazine*, Sep. 2006, pp. 30-38.
Nedic, Slobodan et al. "Per-Bin DFE for Advanced OQAM-based Multi-Carrier Wireless Data Transmission Systems." *2002 International Zurich Seminar on Broadband Communications Access—Transmission—Networking*. (2002): 38-1-38-6. Print.
Nokia, "Uplink Considerations for UTRAN LTE", 3GPP TSG RAN WG1 #40bis, Beijing, China, R1-050251, Agenda Item 12.2.1, Apr. 8, 2005, 8 pp.
Notification of Transmittal of the International Search Report and the Written Opinion of the International Searching Authority, or the Declaration, International Search Report, Written Opinion of the International Searching Authority, PCT Application No. PCT/US2009/001152, May 7, 2009.
Price R. et al., "A Communication Technique for Multipath Channels", *Proceedings of the IRE*, 1958, vol. 46, pp. 555-570.
Proakis, Digital Communications, McGraw-Hill Book Company, 1983, pp. 580-583.
Proakis, John G. *Digital Communications*, 1983, McGraw-Hill, pp. 479.
Rumney, "3GPP LTE: Introducing Single-Carrier FDMA", *Agilent Measurement Journal*, Jan. 1, 2008, 10 pp.
Sahai et al. "Some Fundamental Limits on Cognitive Radio", *Allerton Conf. on Commun., Control and Computing*, 2004, Oct. 2004, 11 pp.
Sari et al., "Transmission Techniques for Digital Terrestrial TV Broadcasting", *IEEE Communications Magazine*, vol. 33, No. 2, Feb. 1995, pp. 100-109.
Schilling D.L. et al., "Optimization of the Processing Gain on an M-ary Direct Sequence Spread Spectrum communication System", *IEEE Transactions on Communications*, vol. Com-28, No. 8, Aug. 1980, pp. 1389-1398.
Song et al. "Cross-Layer Optimization for OFDM Wireless Networks—Part II: Algorithm Development", *IEEE Transactions on Wireless Communications*, vol. 4, No. 2, Mar. 2005, pp. 625-634.
Sorger et al., "Interleaved FDMA—A New Spread-Spectrum Multiple-Access Scheme", *IEEE International Conference on Communications*, vol. 2, Jun. 7-11, 1998, pp. 1013-1017.
Taub and Schilling, Principles of Communication Systems, Second Edition, McGraw-Hill Publishing Company, 1986, pp. 729-732.
Torrieri, Principles of Military Communication Systems, Artech, 1981, pp. 65-67.
Tran, Thien-Toan et al., "Overview of enabling technologies for 3GPP LTE-advanced", *EURASIP Journal on Wireless Communications and Networking*, 2012, vol. 54, 12 Pages.
U.S. Appl. No. 60/692,932, filed Jun. 22, 2005, Peter D. Karabinis, "Communications systems, methods, devices and computer program products for low probability of intercept (PLI), low probability of detection (LPD) and/or low probability of exploitation (LPE) of communications information".
U.S. Appl. No. 60/698,247, filed Jul. 11, 2005, Peter D. Karabinis, "Additional communications systems, methods, devices and/or computer program products for low probability of intercept (PLI), low probability of detection (LPD) and/or low probability of exploitation (LPE) of communications information and/or minimum interference communications".
U.S. Appl. No. 61/033,114, filed Mar. 3, 2008, Peter D. Karabinis, "Next Generation (Xg) Chipless Spread-Spectrum Communications (Cssc)".
Weiss et al. "Efficient Signaling of Spectral Resources in Spectrum Pooling Systems", *Proceedings of the 10th Symposium on Communications and Vehicular Technology (SCVT)*, Nov. 2003, 6 pp.
Weiss et al. "Spectrum Pooling: An Innovative Strategy for the Enhancement of Spectrum Efficiency", *IEEE Radio Communications Magazine*, 2004, 8-14.
Widrow B., Stearns S.D., *Adaptive Signal Processing*, 1985, Prentice-Hall, Inc., pp. 183.
Wikipedia contributors, "Orthogonal frequency-division multiplexing," *Wikipedia, The Free Encyclopedia*, http://en.wikipedia.org/w/index.php?title=Orthogonal_frequency-division_multiplexing &oldid=489673844 (accessed Apr. 25, 2012).
Xu et al. "DRiVE-ing to the Internet: Dynamic Radio for IP Services in Vehicular Environments", *Proceedings of the 25th Annual IEEE Conference on Local Computer Networks*, Nov. 2000, 281-289.
Zhang et al., "A Novel Direct Waveform Synthesis Technique With Carrier Frequency Programmable", *IEEE Wireless Communications and Networking Conference*, 2002, pp. 150-154.
Zhang H. et al., "Base Station Cooperation for Multiuser MIMO: Joint Transmission and BS Selection", *2004 Conference on Information Sciences and Systems, Princeton University*, Mar. 17-19, 2004, 6 pages.
Zheng et al. "Collaboration and Fairness in Opportunistic Spectrum Access", *Proceedings IEEE ICC 2005*, vol. 5, May 2005, 3132-3136.
Ziemer and Peterson, Digital Communications and Spread Spectrum Systems, Macmillan Publishing Company, 1985, pp. 348-349.

* cited by examiner

FIG. 2  Simulation results for case 2 with $\underline{B} = \underline{R}$

Receiver observables: $\begin{cases} \underline{b} = \underline{B} + \bar{\underline{a}}\,\underline{R} + \underline{n} \\ \underline{r} = \underline{R} + \bar{\underline{u}}\,\underline{B} + \underline{v} \end{cases}$ Simulation results for case 3; only $\underline{B}$ is transmitted

- Transmitter remains conventional; transmits $\underline{B}$ only.
- Receiver observables: $\begin{cases} \underline{b} = \underline{B} + \underline{n} \\ \underline{r} = \underline{\bar{u}}\,\underline{B} + \underline{v} \end{cases}$ (Case 4)

(Case 5)

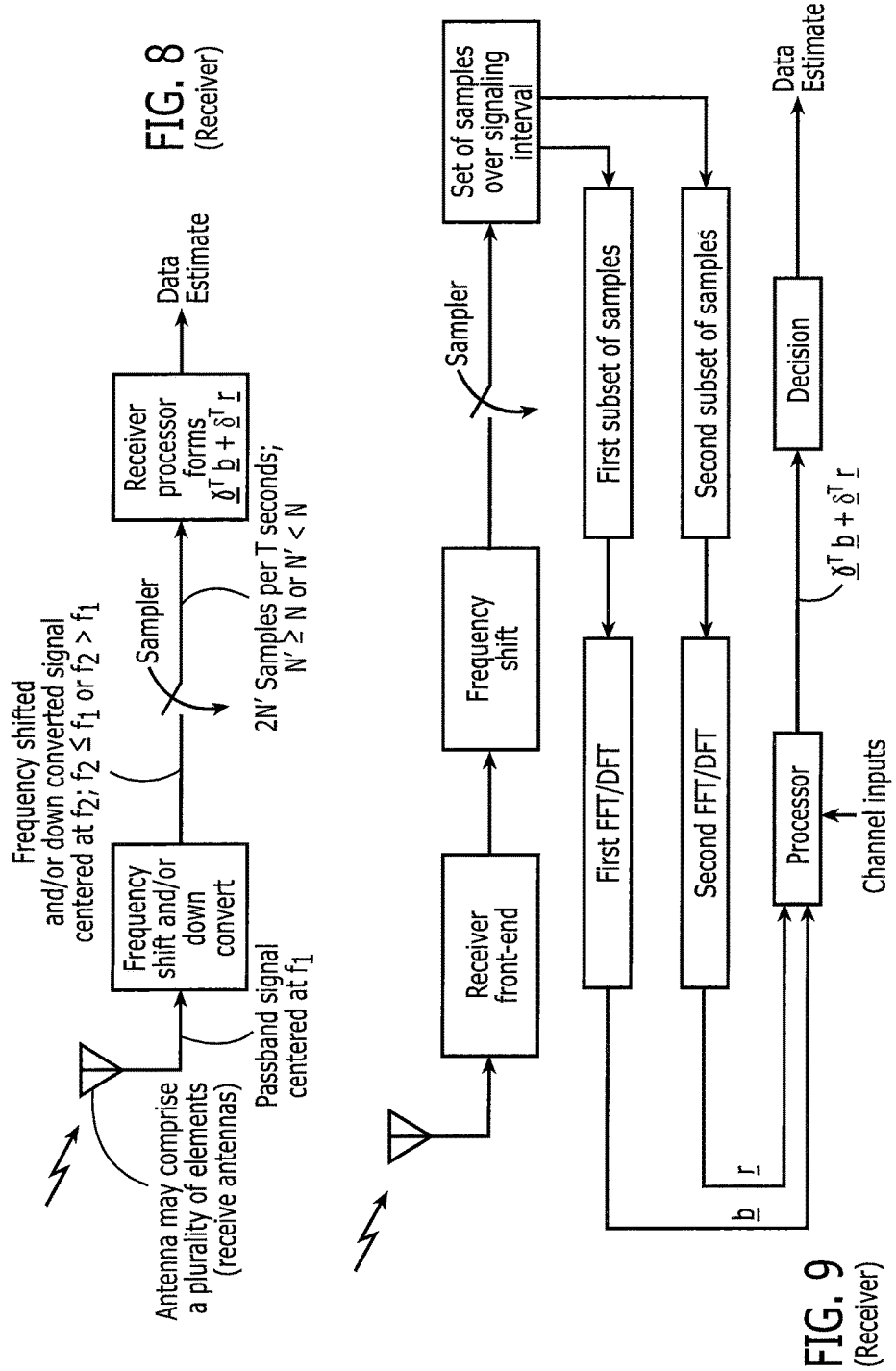

(Receiver)

μ transceivers communicating sequentially
with a BTS and/or a sector thereof

Spatially Matched Receiver

Base Station Architecture
(only one sector is shown; front view)

Base Station Architecture
(three sectors are shown; top view)

Two-Dimensional Antenna Array

Two-Dimensional Antenna Array - Top View

SYSTEMS/METHODS OF CARRIER AGGREGATION

CROSS-REFERENCE TO RELATED APPLICATIONS

This application is a continuation of U.S. patent application Ser. No. 14/509,373, filed Oct. 8, 2014, entitled Systems/Methods of Carrier Aggregation, which itself is a continuation of U.S. patent application Ser. No. 13/767,537, filed Feb. 14, 2013, entitled Systems/Methods of Carrier Aggregation Providing Increased Capacity Communications, which itself is a continuation of U.S. patent application Ser. No. 13/528,058, filed Jun. 20, 2012, entitled Increased Capacity Communications for OFDM-Based Wireless Communications Systems/Methods/Devices, which itself is a continuation of U.S. patent application Ser. No. 12/748,931, filed Mar. 29, 2010, entitled Increased Capacity Communications for OFDM-Based Wireless Communications Systems/Methods/Devices, the disclosures of all of which are incorporated herein by reference in their entirety as if set fully herein.

U.S. patent application Ser. No. 13/767,537 is also a continuation-in-part of U.S. patent application Ser. No. 12/481,084, filed Jun. 9, 2009, entitled Increased Capacity Communications Systems, Methods and/or Devices, which itself claims the benefit of Provisional Application Ser. No. 61/078,598, filed Jul. 7, 2008, entitled Increased Capacity Communications Systems, Devices and/or Methods; Provisional Application Ser. No. 61/100,142, filed Sep. 25, 2008, entitled Additional Systems, Devices and/or methods for Increasing Capacity of Communications Systems; Provisional Application Ser. No. 61/116,856, filed Nov. 21, 2008, entitled Further Systems, Devices and/or Methods for Increasing Capacity of Communications Systems; Provisional Application Ser. No. 61/117,437, filed Nov. 24, 2008, entitled Equalizer-Based Increased Capacity OFDM Systems, Methods and Devices; Provisional Application Ser. No. 61/119,593, filed Dec. 3, 2008, entitled Equalizer-Based Increased Capacity OFDM Systems, Methods and Devices; Provisional Application Ser. No. 61/155,264, filed Feb. 25, 2009 entitled Compact OFDM Systems, Devices and/or Methods; and Provisional Application Ser. No. 61/163,119, filed Mar. 25, 2009, entitled Additional Compact OFDM/OFDMA Systems, Devices and/or Methods, all of which are assigned to the assignee of the present invention, the disclosures of all of which are hereby incorporated herein by reference in their entirety as if set forth fully herein.

U.S. patent application Ser. No. 13/767,537 is also a continuation-in-part of U.S. patent application Ser. No. 12/978,092, filed Dec. 23, 2010, entitled Private, Covert and/or Cognitive Communications Systems and/or Methods Based Upon Pseudo-Randomly Generated Communications Alphabets, which itself is a continuation of U.S. patent application Ser. No. 12/620,057, filed Nov. 17, 2009, entitled Waveforms Comprising a Plurality of Elements and Transmission Thereof which itself is a continuation of U.S. application Ser. No. 12/372,354, filed Feb. 17, 2009, entitled Wireless Communications Systems and/or Methods Providing Low Interference, High Privacy and/or Cognitive Flexibility, and claims priority to U.S. Provisional Application No. 61/033,114, filed Mar. 3, 2008, entitled Next Generation (XG) Chipless Spread-Spectrum Communications (CSSC), and is a continuation-in-part (CIP) of U.S. application Ser. No. 11/720,115, filed May 24, 2007, entitled Systems, Methods, Devices and/or Computer Program Products For Providing Communications Devoid of Cyclostationary Features, which is a 35 U.S.C. §371 national stage application of PCT Application No. PCT/US2006/020417, filed on May 25, 2006, which claims priority to U.S. Provisional Patent Application No. 60/692,932, filed Jun. 22, 2005, entitled Communications Systems, Methods, Devices and Computer Program Products for Low Probability of Intercept (LPI), Low Probability of Detection (LPD) and/or Low Probability of Exploitation (LPE) of Communications Information, and also claims priority to U.S. Provisional Patent Application No. 60/698,247, filed Jul. 11, 2005, entitled Additional Communications Systems, Methods, Devices and Computer Program Products for Low Probability of Intercept (LPI), Low Probability of Detection (LPD) and/or Low Probability of Exploitation (LPE) of Communications Information and/ or Minimum Interference Communications, the disclosures of all of which are hereby incorporated herein by reference in their entirety as if set forth fully herein. The above-referenced PCT International Application was published in the English language as International Publication No. WO 2007/001707.

BACKGROUND OF THE INVENTION

This invention relates to wireless and wireline communications systems, methods and/or devices and more particularly to wireless and wireline communications systems, methods and/or devices that transmit/receive information using an Orthogonal Frequency Division Multiplexed ("OFDM") and/or Orthogonal Frequency Division Multiple Access ("OFDMA") protocol.

In communications systems, wireline and/or wireless, a primary design objective is to reduce or minimize noise and/or interference, while increasing or maximizing desired signal strength, in order to increase or maximize system capacity. Much research has been conducted, and continues to be conducted, towards this objective. It is well known, for example, that a communications receiver that is based upon "matched filter" principles is optimum in terms of maximally rejecting noise while maximally acquiring a desired signal. Further examples relate to the many receiver and/or transmitter "equalization/cancellation" techniques that have been developed to combat effects of non-ideal channels and/or system devices that generate linear and/or non-linear Inter-Symbol Interference ("ISI"), Adjacent Channel Interference ("ACI") and/or Cross Polarization Interference ("CPI").

At the current time, it appears that OFDM/OFDMA-based systems will proliferate as is evident by developments in the standardization and deployment of OFDM/OFDMA-based systems, such as, for example, WiFi, WiMAX and LTE.

SUMMARY OF THE INVENTION

According to some embodiments of the present invention, a communications method is provided comprising: forming a data vector comprising N data elements; N≥2; subjecting the data vector to a transformation and forming a transformed vector responsive to said subjecting; inserting at least one pilot symbol into the transformed vector and forming an augmented vector responsive to said inserting; and transmitting by a transmitter the augmented vector; wherein subjecting the data vector to a transformation occurs prior to said inserting and prior to said forming an augmented vector; the transformation is based upon a Fourier transform and/or a Butler matrix; and wherein transmitting by a transmitter comprises transmitting by the transmitter concurrently a plurality of N sub-carriers.

In some embodiments, the method may further comprise: prior to said transmitting by a transmitter, subjecting the augmented vector to a further transformation that depends upon a characteristic of a channel that exists between the transmitter and a receiver. In some embodiments, the Fourier transform may comprise a Discrete Fourier Transform (DFT) and/or a Fast Fourier Transform (FFT) and/or the Butler matrix may be a truncated Butler matrix; wherein the truncated Butler matrix may be based upon one half of a conventional Butler matrix up to, but not including, a stage of the conventional Butler matrix where amplifiers exist.

In further embodiments of the invention, the method may further comprise: receiving at a receiver a time-domain version of the augmented vector responsive to said transmitting by a transmitter the augmented vector; Fourier transforming the time-domain version of the augmented vector; forming an estimate of the transformed vector responsive to said Fourier transforming the time-domain version of the augmented vector; subjecting the estimate of the transformed vector to an inverse of the transformation that the data vector has been subjected to; and forming an estimate of the data vector responsive to said subjecting the estimate of the transformed vector to an inverse of the transformation.

In additional embodiments, the method may further comprise: estimating at the receiver, responsive to a processing of the at least one pilot symbol by the receiver, a state of a communications channel through which said receiving occurs; and providing data to the transmitter responsive to said estimating.

In yet additional embodiments, the method may further comprise: forming a plurality of data vectors comprising data to be transmitted to a respective plurality of receivers; subjecting each one of the plurality of data vectors to the transformation and forming a respective plurality of transformed vectors responsive to said subjecting each one of the plurality of data vectors to the transformation; inserting at least one pilot symbol into each one of the respective plurality of transformed vectors thus forming a respective plurality of augmented vectors; and sequentially transmitting by the transmitter the respective plurality of augmented vectors to the respective plurality of receivers; wherein sequentially transmitting comprises sequentially transmitting and avoiding overlapping in time between any two of the respective plurality of augmented vectors that are sequentially transmitted by the transmitter.

In other embodiments the method/system provided may additionally comprise: generating a number of replicas of the augmented vector; wherein the number of replicas is equal to, or is greater than, 2; and wherein each one of the number of replicas of the augmented vector is adjusted by dividing a magnitude thereof by the number of replicas that are generated; transmitting by the transmitter the number of replicas of the augmented vector using a respective number of antenna elements; and prior to said transmitting by the transmitter to the receiver the number of replicas of the augmented vector, subjecting each one of the number of replicas of the augmented vector to a further transformation that depends upon a characteristic of a channel that exists between a respective antenna element, of the respective number of antenna elements, and the receiver, so that the number of replicas of the augmented vector that are transmitted using the respective number of antenna elements arrive at the receiver substantially in phase.

In some embodiments, receiving at a receiver comprises receiving at the receiver using a spatial matched filter and/or a spatial rake; wherein receiving at the receiver using a matched filter and/or a spatial rake comprises: estimating at the receiver a number of signal paths arriving at the receiver; estimating at the receiver a respective number of channel characteristics that is associated with the number of signal paths arriving at the receiver; and forming at the receiver a respective number of antenna lobes and/or spatial fingers responsive to said estimating at the receiver a number of signal paths arriving at the receiver and responsive to said estimating at the receiver a respective number of channel characteristics that is associated with the number of signal paths arriving at the receiver.

According to embodiments of the invention, the estimating by the receiver of a number of signal paths arriving at the receiver comprises: forming at the receiver an initial number of antenna lobes and/or spatial fingers; and processing at the receiver a respective initial number of signals that is provided by the initial number of antenna lobes and/or spatial fingers that is formed; wherein the initial number of lobes and/or spatial fingers that is formed at the receiver is greater than the estimated number of signal paths arriving at the receiver. In some embodiments, a combining at the receiver of a respective number of signals that are provided by the respective number of antenna lobes and/or spatial fingers that are formed, is also provided.

In yet further embodiments, the initial number of lobes and/or spatial fingers that is formed at the receiver spans a grid of two-dimensional space.

In order to reduce a complexity and/or a structural load, in some embodiments, receiving at a receiver further comprises: receiving at an antenna of the receiver that is situated at a distance from a processor of the receiver; amplifying following said receiving at an antenna of the receiver; wirelessly transmitting over a short-range link following said amplifying; and receiving at the processor of the receiver responsive to said wirelessly transmitting; wherein, in further embodiments, the antenna of the receiver comprises a two-dimensional lattice of antenna elements.

Embodiments relating to respective/corresponding systems, devices, software, firmware and/or computer programs/algorithms are also presented.

Some embodiments of the present invention provide for receiving a signal comprising N first sub-carriers, wherein $N \geq 2$; generating $2N'$ samples of the signal, wherein $N' \geq N$; performing a first transformation on a first sub-set of the $2N'$ samples; performing a second transformation on a second sub-set of the $2N'$ samples; and combining an element of the first transformation with an element of the second transformation.

In some embodiments, the N first sub-carriers are orthogonal therebetween.

In further embodiments of the invention, the signal further comprises M second sub-carriers; $M \geq 0$; wherein the M second sub-carriers are superimposed on the N first sub-carriers over a frequency interval of bandwidth B Hz that is substantially occupied by the N first sub-carriers and over a time interval of T seconds in duration over which the N first sub-carriers are defined. The M second sub-carriers may be orthogonal therebetween and at least one of the M second sub-carriers may not be orthogonal to at least one of the N first sub-carriers.

The $2N'$ samples may comprise $2N'$ time-domain samples and at least one of the $2N'$ time-domain samples may comprise a complex value. In some embodiments, the signal comprises a bandwidth of B Hz, wherein $B \geq N/T$ and wherein T denotes a signaling interval over which the N first sub-carriers are defined.

In some embodiments of the invention, receiving a signal comprises receiving a passband signal wherein B is centered at a (carrier) frequency $f_1$ and wherein the passband signal is frequency shifted from the (carrier) frequency $f_1$ to a frequency $f_2$ prior to the generating 2N' samples of the signal. In accordance with some embodiments of the invention, $f_2=B/2$, $f_2=0$, $f_2<f_1$ or $f_2 \geq f_1$.

Further to the above, a spacing between two adjacent sub-carriers of the N first sub-carriers may be 1/T Hz, a spacing between two adjacent sub-carriers of the M second sub-carriers may be 1/T Hz and a spacing between a first sub-carrier of the N first sub-carriers and a sub-carrier of the M second sub-carriers that is adjacent to the first sub-carrier of the N first sub-carriers may be 1/2T Hz.

In additional embodiments, the first sub-set of the 2N' samples comprises a first set of N" samples and the second sub-set of the 2N' samples comprises a second set of N''' samples; wherein $1 \leq N'' \leq 2N'$ and $1 \leq N''' \leq 2N'$. In other embodiments, N"=N'''=N', a spacing between two adjacent samples of the first set of N" samples is T/N' seconds, a spacing between two adjacent samples of the second set of N''' samples is T/N' seconds and a spacing between a first sample of the first set of N" samples and a sample of the second set of N''' samples that is adjacent to the first sample of the first set of N" samples is T/2N' seconds.

In some embodiments, the first transformation and the second transformation each comprises a time-domain to frequency-domain transformation. The time-domain may be a discrete time-domain, the frequency-domain may be a discrete frequency-domain and the time-domain to frequency-domain transformation may comprise a Discrete Fourier Transform and/or a Fast Fourier Transform.

Some embodiments further comprise modifying the element of the first transformation and/or modifying the element of the second transformation prior to the combining. In some embodiments, combining comprises: forming $\gamma^T b + \delta^T r$; wherein b comprises the element of the first transformation, r comprises the element of the second transformation, $\gamma^T b$ comprises modifying the element of the first transformation, $\delta^T r$ comprises modifying the element of the second transformation and wherein the superscript T denotes vector (or matrix) transpose and/or conjugate transpose, as appropriate.

Yet further embodiments comprise calculating $\gamma$ and $\delta$ such that a statistical expectation, such as, for example, $E[|\gamma^T b + \delta^T r - B_k|^2]$ is minimized; wherein $E[\bullet]$ denotes statistical expectation, $|\bullet|$ denotes magnitude and $B_k$ denotes a data element that is associated with a $k^{th}$ sub-carrier; k=1, 2, ..., N. In some embodiments, calculating comprises calculating for at least one value of k; k=1, 2, ..., N. Some embodiments further comprise using $\gamma^T b + \delta^T r$ to determine an estimate of $B_k$ for at least one value of k, wherein $\gamma$ and $\delta$ may depend on k.

Further to the above, communicating information may be provided by forming a first Orthogonal Frequency Division Multiplexed ("OFDM") and/or a first Orthogonal Frequency Division Multiple Access ("OFDMA") carrier comprising a first number of sub-carriers that are orthogonal therebetween; forming a second OFDM and/or OFDMA carrier comprising a second number of subcarriers that are orthogonal therebetween but may not be orthogonal to the first number of sub-carriers; superimposing in time and in frequency, the first OFDM/OFDMA carrier with second OFDM/OFDMA carrier such as to generate a level of interference therebetween, that may be substantial interference therebetween; and transmitting the superimposed first and second OFDM/OFDMA carriers. Analogous methods, systems and/or devices may also be provided.

Further embodiments of systems and/or devices may be provided according to the present invention. For example, a communications receiver may be provided comprising a processor that is configured to: receive a signal comprising N first sub-carriers, wherein $N \geq 2$; generate 2N' samples of the signal, wherein $N' \geq N$; perform a first transformation on a first sub-set of the 2N' samples; perform a second transformation on a second sub-set of the 2N' samples; and combine an element of the first transformation with an element of the second transformation.

Additional methods/systems/devices may be provided according to additional embodiments of the present invention wherein first and second portions of an OFDM carrier are formed by a transmitter, via respective first and second operations. The first and second operations may be first and second Discrete Fourier Transforms ("DFTs"), Fast Fourier Transforms ("FFTs"), Inverse Discrete Fourier Transforms ("IDFTs") and/or Inverse Fast Fourier Transforms ("IFFTs").

The first and second portions of the OFDM carrier may be kept separate, may be amplified by respective different/separate first and second power amplifiers of the transmitter and may then be combined/superimposed, after high-power amplification, prior to transmission over a propagation medium. In other embodiments, the first and second portions of the OFDM carrier are kept separate even after the amplification (are not combined) and are used to excite respective first and second different/separate propagation media and/or channels, such as, for example, first and second different wireline propagation media (different first and second twisted-pair, different first and second coaxial cables and/or different first and second fiber-optical propagation media, etc.) and/or different first and second wireless propagation media via respective first and second antennas (or antenna elements).

Some embodiments of the invention provide a communications method comprising:

forming a plurality of components of an overall signal that is to be transmitted by a transmitter such that each one of the plurality of components comprises a characteristic value that is less than a corresponding characteristic value associated with the overall signal;

configuring the transmitter with a plurality of elements corresponding to the plurality of components of the overall signal; and transmitting the overall signal by transmitting by the transmitter the plurality of components of the overall signal by using the corresponding plurality of elements.

According to further embodiments of the invention the method provides a recognition of exceeding by the overall signal that is to be transmitted by the transmitter a limit associated with a subsystem of the transmitter;

avoiding said exceeding by refraining from transmitting the overall signal via said subsystem of the transmitter; and transmitting the plurality of components of the overall signal via the corresponding plurality of elements of the transmitter, thus transmitting the overall signal;

wherein according to some embodiments, the limit is a bandwidth limit.

In some embodiments, the subsystem of the transmitter comprises an antenna of the transmitter and/or an element of the transmitter other than the antenna.

In further embodiments, said overall signal comprises first and second frequency segments that are separated therebetween by a substantial frequency interval over which the overall signal is substantially devoid of frequency content; wherein in some embodiments, the first and second frequency segments comprise an aggregate bandwidth of 100 MHz; the first frequency segment comprises a bandwidth of 40 MHz; and the second frequency segment comprises a bandwidth of 60 MHz.

According to yet additional embodiments, said characteristic value comprises a bandwidth, a number of points of a Discrete Fourier Transform and/or a number of points of an Inverse Discrete Fourier transform.

In further embodiments, said plurality of components of the overall signal comprises first and second components and wherein said plurality of elements corresponding to the plurality of components comprises first and second elements; wherein, according to some embodiments, the first and second elements comprise first and second antennas, first and second power amplifiers, first and second Discrete Fourier Transforms and/or first and second Inverse Discrete Fourier transforms.

According to additional embodiments of the method, said configuring the transmitter with a plurality of elements corresponding to the plurality of components of the overall signal comprises:

configuring the transmitter with the first and second antennas, the first and second power amplifiers, the first and second Discrete Fourier Transforms and/or the first and second Inverse Discrete Fourier transforms; and wherein said transmitting the overall signal by transmitting by the transmitter the plurality of components of the overall signal by using the corresponding plurality of elements comprises:

transmitting the first component by using the first antenna, the first power amplifier, the first Discrete Fourier transform and/or the first Inverse Discrete Fourier Transform; and transmitting the second component by using the second antenna, the second power amplifier, the second Discrete Fourier transform and/or the second Inverse Discrete Fourier Transform.

Further embodiments of the method provide:

receiving information by the transmitter from a receiver;

forming a matrix by the transmitter responsive to said receiving information; and processing the plurality of components by using the matrix prior to transmitting the plurality of components by the transmitter; wherein, according to some embodiments, receiving information comprises receiving channel information; forming a matrix comprises forming the matrix as a product of first and second matrices responsive to receiving the channel information; and wherein said processing the plurality of components by using the matrix comprises multiplying the plurality of components by the matrix.

In yet additional embodiments of the invention, the method further provides:

receiving information by the transmitter from first and second receivers;

forming first and second matrices by the transmitter responsive to said receiving information by the transmitter from the first and second receivers;

processing a first plurality of components by using the first matrix prior to transmitting the first plurality of components by the transmitter; and processing a second plurality of components by using the second matrix prior to transmitting the second plurality of components by the transmitter.

The invention also provides a communications system comprising:

a processor that is configured to form a plurality of components of an overall signal that is to be transmitted such that each one of the plurality of components comprises a characteristic value that is less than a corresponding characteristic value associated with the overall signal; and a transmitter that is configured with a plurality of elements corresponding to the plurality of components of the overall signal and is further configured to transmit the overall signal by transmitting the plurality of components of the overall signal by using the corresponding plurality of elements.

In some embodiments, the processor is further configured to:

recognize that the overall signal that is to be transmitted will exceed a limit associated with a subsystem of the transmitter;

prevent the limit from being exceeded by refraining from sending the overall signal to said subsystem of the transmitter;

form the plurality of components of the overall signal; and send the plurality of components to the transmitter to be transmitted therefrom via the corresponding plurality of elements of the transmitter, thus transmitting the overall signal;

wherein, according to some embodiments, the limit is a bandwidth limit.

According to some embodiments, the subsystem of the transmitter comprises an antenna of the transmitter and/or an element of the transmitter other than the antenna.

In other embodiments, said overall signal comprises first and second frequency segments that are separated therebetween by a substantial frequency interval over which the overall signal is substantially devoid of frequency content; wherein, according to some embodiments, the first and second frequency segments comprise an aggregate bandwidth of 100 MHz; the first frequency segment comprises a bandwidth of 40 MHz; and the second frequency segment comprises a bandwidth of 60 MHz.

According to further embodiments, said characteristic value comprises a bandwidth, a number of points of a Discrete Fourier Transform and/or a number of points of an Inverse Discrete Fourier transform.

In yet other embodiments, said plurality of components of the overall signal comprises first and second components and wherein said plurality of elements corresponding to the plurality of components comprises first and second elements; wherein, according to some embodiments, the first and second elements comprise first and second antennas, first and second power amplifiers, first and second Discrete Fourier Transforms and/or first and second Inverse Discrete Fourier transforms.

In further embodiments of the invention, the transmitter is configured with the first and second antennas, the first and second power amplifiers, the first and second Discrete Fourier Transforms and/or the first and second Inverse Discrete Fourier transforms; and wherein the transmitter is further configured to transmit the first component by using the first antenna, the first power amplifier, the first Discrete Fourier transform and/or the first Inverse Discrete Fourier Transform; and to transmit the second component by using the second antenna, the second power amplifier, the second Discrete Fourier transform and/or the second Inverse Discrete Fourier Transform.

According to additional embodiments of the invention, the transmitter is further configured to:

receive information from a receiver;

form a matrix responsive to the received information; and process the plurality of components by using the matrix prior to transmitting the plurality of components; wherein, according to some embodiments, said information comprises channel information; said matrix comprises a product of first and second matrices; and wherein the transmitter is configured to multiply the plurality of components by said matrix.

In yet additional embodiments according to the invention, the transmitter is further configured to:

receive information from first and second receivers;

form first and second matrices responsive to having received said information from the first and second receivers;

process a first plurality of components by using the first matrix prior to transmitting the first plurality of components; and process a second plurality of components by using the second matrix prior to transmitting the second plurality of components.

Numerous embodiments of systems/methods relating to space division multiplexing may also be provided. For example, according to some systems embodiments of the invention, the transmitter may further be configured to:

transmit first and second signals, to respective first and second receivers, substantially simultaneously therebetween, substantially co-frequency therebetween and devoid of any reliance on any code discrimination therebetween, responsive to a first orientation between the first and second receivers; and transmit the first and second signals, to the respective first and second receivers, substantially simultaneously therebetween while relying on frequency discrimination and/or code discrimination therebetween, responsive to a second orientation between the first and second receivers;

wherein the first orientation between the first and second receivers allows an antenna of the transmitter to form respective first and second antenna patterns that provide a first level of antenna pattern discrimination therebetween; and wherein the second orientation between the first and second receivers allows an antenna of the transmitter to form respective first and second antenna patterns that provide a second level of antenna pattern discrimination therebetween that is less than the first level of antenna pattern discrimination.

Methods embodiments that are analogous to the above may also be provided.

BRIEF DESCRIPTION OF THE DRAWINGS

FIGS. 8, 9, 10 and 11 illustrate receiver methods/systems/devices according to various embodiments of the invention.

DETAILED DESCRIPTION

Figure 1:
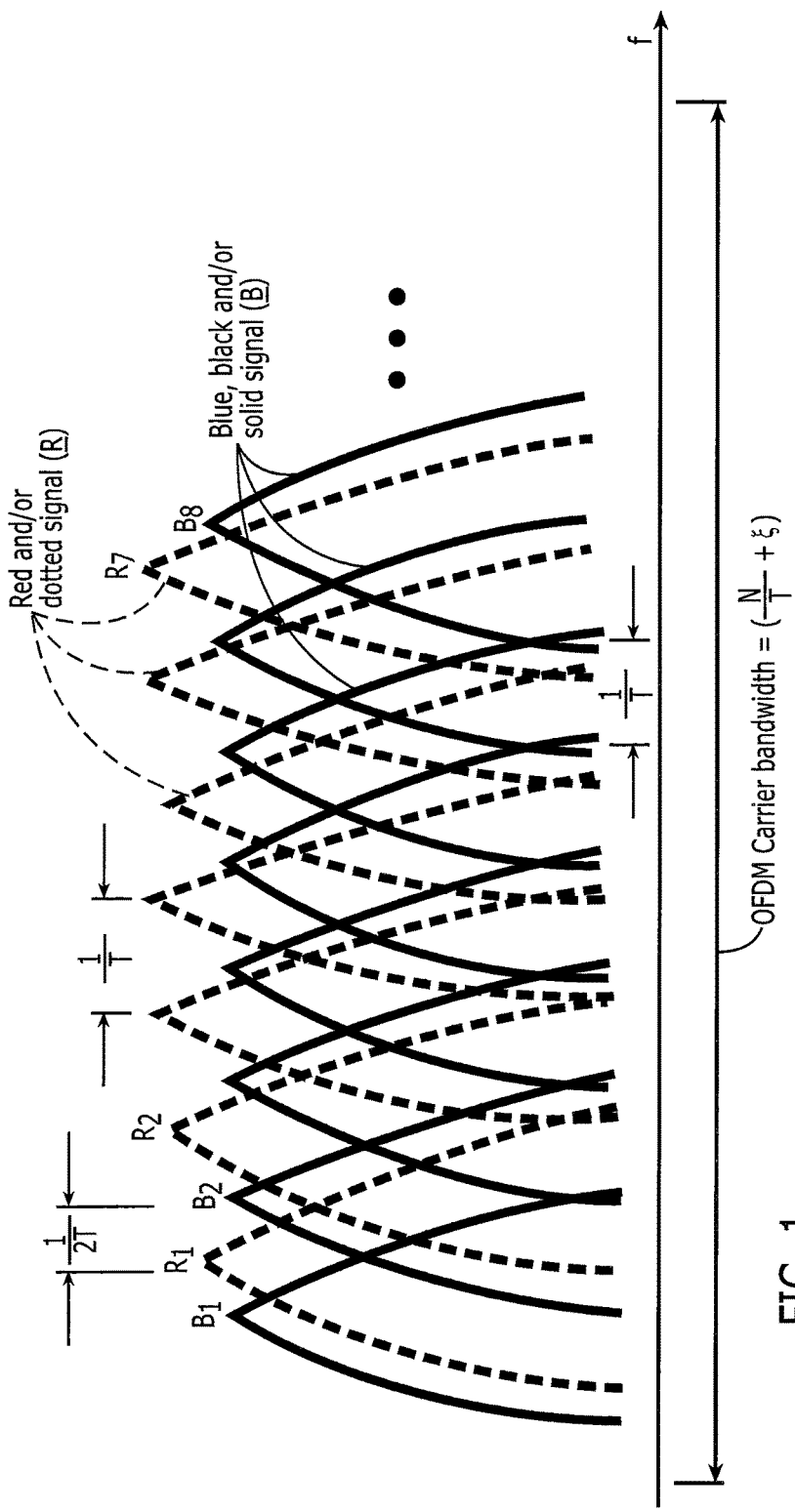
FIG. 1 illustrates a superposition of first and second OFDM/OFDMA carriers according to various embodiments of the invention, where N=number of orthogonal OFDM solid subcarriers, $\xi$=excess bandwidth factor to accommodate sidelobes of subcarriers ($\xi \geq 0$) and T=signaling interval (only the main lobes of the subcarriers are illustrated).

The present application hereby incorporates herein by reference the disclosures of all of the following applications in their entirety as if set forth fully herein: U.S. patent application Ser. No. 12/481,084, filed Jun. 9, 2009, entitled Increased Capacity Communications Systems, Methods and/or Devices, which claims the benefit of Provisional Application Ser. No. 61/078,598, entitled Increased Capacity Communications Systems, Devices and/or Methods, filed Jul. 7, 2008; Provisional Application Ser. No. 61/100,142, entitled Additional Systems, Devices and/or Methods for Increasing Capacity of Communications Systems, filed Sep. 25, 2008; Provisional Application Ser. No. 61/116,856, entitled Further Systems, Devices and/or Methods for Increasing Capacity of Communications Systems, filed Nov. 21, 2008; Provisional Application Ser. No. 61/117,437, entitled Equalizer-Based Increased Capacity OFDM Systems, Methods and Devices, filed Nov. 24, 2008; Provisional Application Ser. No. 61/119,593, entitled Equalizer-Based Increased Capacity OFDM Systems, Methods and Devices, filed Dec. 3, 2008; Provisional Application Ser. No. 61/155,264, entitled Compact OFDM Systems, Devices and/or Methods, filed Feb. 25, 2009; and Provisional Application Ser. No. 61/163,119, entitled Additional Compact OFDM/OFDMA Systems, Devices and/or Methods, filed Mar. 25, 2009, all of which are assigned to the assignee of the present invention.

The present invention now will be described with reference to the accompanying drawings. This invention may, however, be embodied in many different forms and should not be construed as limited to the embodiments set forth herein. Rather, these embodiments are provided to further convey the scope of the invention to those skilled in the art. It will be understood that any two or more embodiments of the present invention may be combined in whole or in part to form at least one or more additional embodiments.

It will be understood that when an element is referred to as being "connected" or "coupled" to another element, it can be directly connected or coupled to the other element or intervening elements may be present. Furthermore, "connected" or "coupled" as used herein may include wirelessly connected or coupled.

The terminology used herein is for the purpose of describing particular embodiments only and is not intended to be limiting of the invention. As used herein, the singular forms "a," "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will be understood that although terms such as first and second are used herein to describe various elements, these elements should not be limited by these terms. These terms are only used to distinguish one element from another element. Thus, a first element below could be termed a second element, and similarly, a second element may be termed a first element without departing from the teachings of the present invention. As used herein, the term "and/or" includes any and all combinations of one or more of the associated listed items. The symbol "/" is also used as a shorthand notation for "and/or". Moreover, as used herein, the term "subset" shall be interpreted to mean a set (a first set) that contains at least one but less than all members/elements of another set (a second set). That is, if S is a subset of SS, then S contains at least one but less than all elements of SS. More specifically, if, for example, $SS=\{s_1, s_2, s_3, s_4, s_5\}$, then $S=\{s_2\}$, for example, is a subset of SS. Also, $S=\{s_1, s_3, s_5\}$ is a subset of SS, etc.

As used herein, the term "transmitter" and/or "receiver" include(s) transmitters/receivers of cellular and/or satellite terminals with or without a multi-line display; Personal Communications System ("PCS") terminals that may include data processing, facsimile and/or data communications capabilities; Personal Digital Assistants ("PDA") that can include a radio frequency transceiver and/or a pager, Internet/Intranet access, Web browser, organizer, calendar and/or a Global Positioning System ("GPS") receiver; and/or conventional laptop and/or palmtop computers or other appliances, which include a radio frequency transceiver. As used herein, the term "transmitter" and/or "receiver" also include(s) any other radiating and/or receiving device, equipment and/or source that may have time-varying and/or fixed geographic coordinates and/or may be portable, transportable, installed in a vehicle (aeronautical, maritime, or land-based) and/or situated/configured to operate locally and/or in a distributed fashion in one or more vehicles (land-mobile, maritime and/or aeronautical). A transmitter and/or receiver also may be referred to herein as a "terminal," "wireless terminal," "mobile device," "radioterminal," "radiotelephone," "base transceiver station," "base station," "access point," and/or "end-user device." In addition, it will be understood that a transmitter and/or receiver may be configured to. operate in a wireless and/or a wired (wireline, cable, fiber, etc.) mode.

Various embodiments of the present invention are based upon the realization that a time-domain to frequency-domain transformation, such as, for example, a Discrete Fourier Transform ("DFT") and/or a Fast Fourier Transform ("FFT"), provides information that is associated with a specific number of frequency-domain points only. For example, an N-point FFT provides information that is associated with precisely N frequency-domain points on a frequency axis; wherein N may be equal to, for example, 2, 4, 8, 16, 32, 64, etc. There may be, however, information that is associated with additional frequency-domain points on the frequency axis, other than the N-points. The information that is associated with the additional frequency-domain points on the frequency axis, other than the N-points, may include what may be termed "interference," but even interference contains energy that may be useful energy, and this interference may lend itself to mitigation/equalization, particularly when a processor is configured to operate on the interference and on other signals that have given rise to and/or are related to the interference. Accordingly, a communications receiver may be configured to observe information associated with, for example, a received Orthogonal Frequency Division Multiplexed ("OFDM") carrier, comprising N sub-carriers, by subjecting a time-domain representation of the received OFDM carrier to an N-point FFT, as is conventionally done, providing an N-dimensional vector of values that is associated with an N-dimensional data vector that is associated with the N sub-carriers of the OFDM carrier.

The time-domain representation of the received OFDM carrier, however, may additionally be subjected to a second N-point FFT (or to a second M-point FFT, wherein M may be greater than, or less than, N) to provide frequency-domain information associated with, for example, N (or M) "transition," "interstitial" or "in-between" frequencies on the frequency axis. The transition, interstitial or in-between frequencies may be selected/located (on the frequency axis) between orthogonally disposed OFDM sub-carriers. Accordingly, the second FFT may provide information containing interference from a plurality of side-lobes of the orthogonally disposed OFDM sub-carriers. However, information containing interference may still be valuable. Just like in time-domain equalization, information containing interference, such as, for example, Inter-Symbol Interference ("ISI"), may be used advantageously to improve communications performance, frequency-domain information, even though it may contain interference, such as, for example, frequency-domain ISI, may also be used advantageously to improve communications performance.

According to embodiments of the present invention, first and second signals may be transmitted by a transmitter. The first signal may be referred to herein as the blue, black and/or solid signal, whereas the second signal may be referred to herein as the red and/or dotted signal. In some embodiments, the first and second signals represent respective first and second OFDM/OFDMA carriers, wherein each one of the first and second OFDM/OFDMA carriers may comprise a plurality of subcarriers, as is illustrated in FIG. 1. (It will be understood that in FIG. 1 even though only three subcarriers are pointed to as being "dotted" and "solid," respectively, this is done to minimize clutter in the Figure. All subcarriers that are drawn in solid traces may belong to the "solid" signal and all subcarriers that are drawn in dotted traces may belong to the "dotted" signal.) The first OFDM/OFDMA carrier may comprise a first number, N, of subcarriers that may be orthogonal therebetween (i.e., any two different subcarriers of the first number N of subcarriers may be orthogonal therebetween over a T-seconds signaling interval) and the second OFDM/OFDMA carrier may comprise a second number, M, of subcarriers that may be orthogonal therebetween (i.e., any two different subcarriers of the second number M of subcarriers may be orthogonal therebetween over the T-seconds signaling interval, as is illustrated in FIG. 1 herein, or over a signaling interval that is different than the T-seconds signaling interval, as is illustrated in FIG. 1 of Provisional Application Ser. No. 61/078, 598, entitled Increased Capacity Communications Systems, Devices and/or Methods, filed Jul. 7, 2008, and incorporated herein by reference in its entirety as if set forth fully herein) wherein M may be equal to N, in some embodiments, or M may be different from N in other embodiments. The first number N of subcarriers may not be orthogonal to the second number M of subcarriers as is illustrated in FIG. 1 herein and/or in FIG. 1 of the above cited Provisional Application (i.e., a subcarrier of the first number N of subcarriers may not be orthogonal to a subcarrier of the second number M of subcarriers). In yet other embodiments, the first and/or second signal may represent a signal that is not based upon OFDM/OFDMA; such as, for example, a Nyquist signal or a half-Nyquist signal.

It will be understood that at least one subcarrier of the second number M of subcarriers may be a subcarrier comprising pilot information and that, in some embodiments, each one of the second number M of subcarriers may be a subcarrier comprising pilot information. Accordingly, in such embodiments, the first signal, comprising the first number N of subcarriers, may be relieved from providing pilot information and may thus be configured to provide additional data, thus increasing a capacity measure thereof (i.e., a capacity measure of the blue, black and/or solid signal). In such embodiments, a receiver may be configured to use a priori pilot-related knowledge in order to mitigate interference from the second signal into the first signal, to determine data associated with the first signal, to use the data associated with the first signal that is determined to mitigate interference from the pilots, to further process the pilots to determine channel-related information and to use the channel-related information that is determined to determine additional data of the first signal over a next signaling interval. According to some embodiments, a number of pilots that is included in the second number M of subcarriers (i.e., in the dotted/red signal) over said next signaling interval is reduced relative to a number of pilots that is included in the second number M of subcarriers prior to said next signaling interval. Accordingly, in such embodiments, the second number M of subcarriers may comprise additional data over said next signaling interval compared to a data content/measure thereof over a signaling interval prior to said next signaling interval. The data may be of the type/mode R=B, as is further described below. In some embodiments, the channel-related information that is determined is used by the receiver and/or is sent by the receiver to a transmitter to be used by the transmitter in transmitting (e.g., pre-distorting) the first signal and/or the second signal. The transmitter may use the channel-related information to pre-distort (at least partially) the first signal and/or the second signal prior to transmission thereof. The second number M of subcarriers (i.e., the dotted/red signal) may be transmitted by the transmitter over a polarization that is different than, and, in some embodiments, is substantially orthogonal to, a polarization used by the transmitter to transmit the solid signal.

Responsive to the first and second signals having been transmitted by a transmitter, a receiver may be configured to process respective first and second signals that, according to some embodiments of the present invention, may represent respective first and second frequency-domain signals (or frequency-domain observables), that may be expressed as $b = B + \bar{a}R + n$ and $r = R + \bar{u}B + v$, respectively. The first and second frequency-domain observables comprise respective desired signal components, B and R, respective components reflecting interference, $\bar{a}R$ and $\bar{u}B$, and respective components reflecting noise, n and v. The quantities b, r, B, R, n and v may represent vector quantities and the quantities $\bar{a}$ and $\bar{u}$ may represent matrix quantities. A signal processor of the receiver may be configured to process the first and/or second frequency-domain observables to determine information (data) associated with the first and/or second transmitted signals.

In some embodiments according to the present invention, a receiver may be configured to acquire a minimum of 2N time-domain samples of a received OFDM/OFDMA signal over a signaling interval, "T," thereof (or over an integer multiple of the signaling interval T; wherein N denotes an FFT/DFT size and/or a number of subcarriers associated with the OFDM/OFDMA signal) and using a first subset of the 2N time-domain samples, that may be a subset comprising N first samples of the 2N time-domain samples, wherein, for example, the N first samples comprise even indexed samples, of the 2N time-domain samples, to form a first FFT/DFT (a conventional FFT/DFT at frequencies k/T); and using a second subset of the 2N time-domain samples, that may be a subset comprising N second samples of the 2N time-domain samples, wherein, for example, the N second samples comprise odd indexed samples, of the 2N time-domain samples, to form a second FFT/DFT at the "in-between" (i.e., at the interstitial or transition) frequencies of $(2k+1)/2T = (k+1/2)/T$; $k=1, 2, \ldots, N$; wherein T denotes the signaling interval. The first FFT/DFT may be used to provide a first N-dimensional vector "b" while the second FFT/DFT may be used to provide a second vector "r," that may be a second N-dimensional vector r. The two vectors, b and r, may then be combined in, for example, a least mean-squared-error sense. It will be understood that, in some embodiments, instead of using the even indexed samples discussed above to form/define b, the odd indexed samples may be used, and instead of using the odd indexed samples discussed above to form/define r, the even indexed samples may be used. Other combinations/subsets of the minimum 2N time-domain samples may also be used, in further embodiments, to form/define b and r.

In other embodiments of the present invention, instead of the above or in combination with the above, a 2N-point DFT/FFT may be performed on the 2N time-domain samples and a first subset of points of the 2N-point DFT/FFT, that may be a first subset of N points of the 2N-point DFT/FFT, comprising, for example, a subset of N even indexed points of the 2N-point DFT/FFT, may be used to define the vector b while a second subset of points of the 2N-point DFT/FFT, that may be a second subset of N points of the 2N-point DFT/FFT, comprising, for example, a subset of N odd indexed points of the 2N-point DFT/FFT, may be used to define the vector r. It will be understood that, in some embodiments, instead of using the even indexed samples/points discussed above to form/define b, the odd indexed samples/points may be used, and instead of using the odd indexed samples/points discussed above to form/define r, the even indexed samples/points may be used. Other sample/point combinations may also be used, in further embodiments, to form/define b and r.

In some embodiments of the invention, prior to acquiring the minimum of 2N time-domain samples discussed above, a received passband OFDM/OFDMA carrier, whose frequency content and/or whose allocated frequency channel may be centered at a frequency $f_c$, may be shifted down (i.e., translated in frequency) not by $f_c$ (as is conventionally done) but instead, may be shifted down by $f_c - N/2T$ (or by any other value). This may be necessary, in some embodiments, to provide uncorrelated and/or independent noise vectors n and v.

In some embodiments of the present invention, a signal processor may be configured to jointly process the first and second frequency domain observables b, r. In other embodiments, the signal processor may be configured to perform first and second signal processing operations sequentially (e.g., over respective first and second substantially non-overlapping time intervals or over respective first and second time intervals that overlap therebetween at least partially) in order to determine information (data) associated with the first and/or second transmitted signal vectors B, R.

The signal processor may be configured to form, for example, $\gamma^T b$ and $\delta^T r$ and to combine $\gamma^T b$ with $\delta^T r$ to form $\gamma^T b + \delta^T r$; wherein the superscript T denotes vector transpose (or matrix transpose) or conjugate transpose, as appropriate, and wherein $\gamma$ and $\delta$ may, according to some embodiments, denote vector quantities that may be complex-valued. The signal processor may be configured to calculate $\gamma$ and $\delta$ such that a statistical expectation, for example, $E[|\gamma^T b + \delta^T r - B_k|^2]$, is minimized; wherein $E[\cdot]$ denotes statistical expectation, $|\cdot|$ denotes magnitude and $B_k$ denotes a data element (complex, imaginary or real-valued) that is associated with a $k^{th}$ sub-carrier that may represent a $k^{th}$ element of B; $k=1, 2, \ldots, N$.

In some embodiments of the present invention, the signal processor may be configured to reduce and/or minimize (or substantially reduce and/or minimize) a mean-squared error quantity, performance index and/or cost function wherein the first and second transmitted signal vectors, B, R, are substantially independent therebetween (this may be referred to herein as "Case 1").

In some embodiments relating to Case 1, the values of $\gamma$ and $\delta$ that minimize $E[|\gamma^T b + \delta^T r - B_k|^2]$ may satisfy the following equations:

$\bar{A}\gamma + \bar{E}\delta = 1_k$; and $\bar{O}\gamma + \bar{U}\delta = \bar{u}1_k$;

wherein $\bar{A} = (\sigma_R^2/\sigma_B^2)\bar{a}\bar{a}^T + (1 + \sigma_n^2/\sigma_B^2)\bar{I}$;

$\bar{E} = \bar{u}^T + (\sigma_R^2/\sigma_B^2)\bar{a}$;

$\bar{O} = \bar{u} + (\sigma_R^2/\sigma_B^2)\bar{a}^T$; and $\bar{U} = \bar{u}\bar{u}^T + (\sigma_R^2/\sigma_B^2 + \sigma_v^2/\sigma_B^2)\bar{I}$;

In the above equations, $1_k$ denotes a column vector that includes all zero entries except for the $k^{th}$ entry thereof which is unity, and all quantities with a bar on top and a bar below represent matrices whose elements may be complex-valued, real, and/or imaginary. Further to the above, elements of the matrix $\bar{u}$ represent levels of interference (leakage) from the blue sub-carriers, B, to the red sub-carriers R, $\bar{I}$ denotes an identity matrix, $\sigma_n^2$ denotes variance of a component/element of n, $\sigma_R^2$ denotes variance of a component/element of R, $\sigma_B^2$ denotes variance of a component/element of B, elements of the matrix $\bar{a}$ represent levels of interference (leakage) from the red sub-carriers, R, to the blue sub-carriers B; and $\sigma_v^2$ denotes variance of a component/element of v.

It will be understood that when the symbol "T" is used as a superscript, it will be interpreted to denote vector transpose, matrix transpose and/or conjugate transpose (of a vector or a matrix, as appropriate), not only in the above equations but throughout this specification, unless otherwise specified. It will further be understood that the symbol "T" may also be used to denote a time interval (e.g., a signaling interval) when it is not used as a superscript. Unless otherwise specified, when "T" is used in any way other than a superscript, it will be interpreted to represent a time interval.

In deriving the above equations, the quantities B, R, n and v may be assumed to be statistically independent therebetween and each one of the quantities B, R, n and v may be assumed to be of zero mean. In other embodiments, however, a statistical dependence (a non-zero correlation and/or non-zero covariance matrix) may be assumed between any two of the stated vector quantities and equations corresponding to such assumptions may be derived, as those skilled in the art will appreciate.

Figure 2:
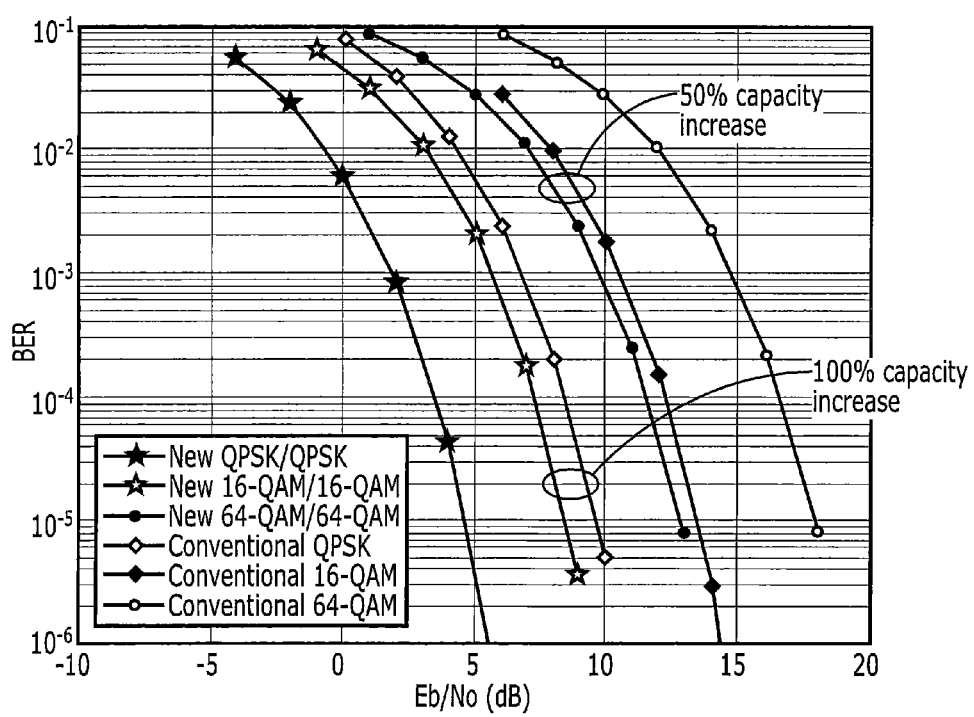
FIG. 2 provides Bit Error Rate ("BER") curves according to embodiments of the invention.

In other embodiments of the present invention, a signal processor may be configured to reduce and/or minimize (or substantially reduce and/or minimize) a mean-squared error quantity, performance index and/or cost function wherein the first and second transmitted signal vectors B, R are substantially dependent therebetween (this may be referred to herein as "Case 2"). In some embodiments, the first and second transmitted signal vectors (B, R) may comprise substantially identical information (data) therebetween (e.g., B=R). Computer simulation results associated with Case 2, wherein B=R, show that a channel capacity measure may be increased by 100% in some embodiments of the invention, and by 50% in other embodiments of the invention, as is illustrated in FIG. 2. This may be a significant finding.

In some embodiments relating to Case 2, the values of γ and δ that minimize $E[|\gamma^T b + \delta^T r - B_k|^2]$ may satisfy the following equations:

$$\overline{\overline{A}}'\gamma + \overline{\overline{E}}'\delta = \overline{a}'1_k; \text{ and}$$

$$\overline{\overline{O}}'\gamma + \overline{\overline{U}}'\delta = \overline{u}'1_k;$$

wherein $$\overline{\overline{A}}' = \overline{a}'(\overline{a}')^T + (\sigma_n^2/\sigma_B^2)\overline{\overline{I}};$$

$$\overline{\overline{E}}' = \overline{a}'(\overline{u}')^T;$$

$$\overline{\overline{O}}' = \overline{u}'(\overline{a}')^T; \text{ and}$$

$$\overline{\overline{U}}' = \overline{u}'(\overline{u}')^T + (\sigma_v^2/\sigma_B^2)\overline{\overline{I}};$$

wherein, as before, $1_k$ denotes a column vector with all zero entries except for the $k^{th}$ entry thereof which is unity, and all quantities with a bar on top and a bar below represent matrices whose elements may be complex-valued, real-valued and/or imaginary-valued. Furthermore, $\overline{a}' = \overline{\overline{I}} + \overline{a}$ and $\overline{u}' = \overline{\overline{I}} + \overline{u}$; wherein $\overline{a}$ and $\overline{u}$ are as defined above relative to Case 1 with the elements of matrix $\overline{a}$ representing levels of interference (i.e., leakage) from the red sub-carriers, R, to the blue sub-carriers, and with the elements of the matrix $\overline{u}$ representing levels of interference (leakage) from the blue sub-carriers, B, to the red sub-carriers. Also, as defined earlier in connection with Case 1 above, $\sigma_n^2$ denotes variance of a component of n, $\sigma_v^2$ denotes variance of a component of v, $\sigma_B^2$ denotes variance of a component of B and $\overline{\overline{I}}$ denotes an identity matrix. In deriving the above equations, B, n and v have been assumed to be statistically independent therebetween and each of zero mean. In other embodiments, however, a statistical dependence (a non-zero correlation and/or non-zero covariance matrix) may be assumed between any two of the stated vector quantities and equations corresponding to such assumptions may be derived, as those skilled in the art will appreciate.

It may be observed that in embodiments relating to Case 2, the signal processor may be viewed as performing voltage addition of first and second signals received, responsive to the first and second signals that are transmitted comprising the substantially identical (e.g., B=R) information (data) therebetween. It may also be observed that in accordance with embodiments relating to Case 2, the signal processor may be viewed as providing increased desired signal power/energy by making use (and taking advantage) of signal samples at frequencies that conventional receivers neglect. Upon reflection, an analogy may be drawn between the signal processor described herein with respect to Case 2 (and Case 3, as discussed below herein) and a time-domain equalizer or a time-domain rake receiver. As is the case with a time-domain equalizer and/or a time-domain rake receiver, coherently combining desired signal components that are dispersed in time, the signal processor used herein combines coherently desired signal components that may be viewed as being dispersed in frequency.

Figure 3:
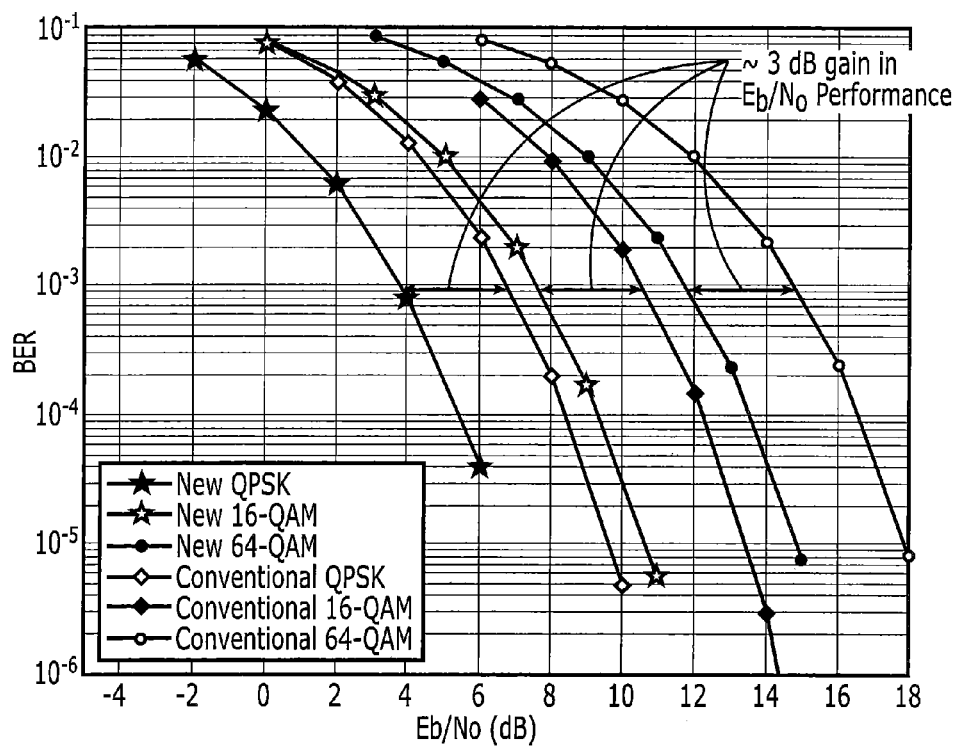
FIG. 3 provides further BER curves according to further embodiments of the invention.

In some embodiments of the present invention that are associated with what may be referred to herein as Case 3, only one of the first and second signals (B, R) is transmitted (for example, only B is transmitted) and a receiver processor may be configured, in some embodiments, substantially as in Case 1 with R→0, (i.e., with each element/component of the vector R set to zero) to process the receiver observables that, in some embodiments, may be b=B+n and r=$\overline{u}$B+v. Computer simulation results associated with Case 3 (see FIG. 3), show that a power efficiency measure (e.g., $E_b/N_0$) may improve by up to 3 dB over that provided by conventional OFDM/OFDMA systems, devices and/or methods.

As stated earlier, and as may be appreciated by those skilled in the art, according to various embodiments of the present invention, the receiver processor may be envisioned as functioning as a frequency-domain equalizer (that may be viewed as a frequency-domain fractionally-spaced equalizer) and/or as a frequency-domain rake receiver that collects a maximum (or near maximum) available/desired signal energy to increase/maximize capacity and/or power efficiency of communications. This may be achieved, in some embodiments, by utilizing energy of a plurality of frequency-domain points whose respective "noise" components are, at least partially, uncorrelated and/or independent therebetween but whose "desired" signal components comprise a level of correlation/dependence therebetween.

It will be understood that any embodiment or combination/sub-combination of embodiments described herein and/or in any of the U.S. Provisional Applications cited herein may be used to provide wireless and/or wireline systems, devices and/or methods. It will also be understood that even though embodiments are presented herein in terms of a receiver processor reducing/minimizing a mean-squared error quantity, performance index and/or cost function (i.e., a recursive and/or non-recursive receiver processor that yields a Least Mean Squared Error ("LMSE")), any other quantity, performance index, algorithm (recursive and/or non-recursive) and/or cost function other than LMSE (such as, for example, zero-forcing, least squares, maximum likelihood, maximum a posteriori probability, etc.) may be used in lieu of LMSE or in conjunction with LMSE. Recursive and/or non-recursive algorithms/receiver processors may also be used whether embodied as software, hardware and/or firmware. It will also be understood that the principles described herein are applicable to any wireline and/or wireless transmitter/receiver system, device and/or method, including radar transmitter/receiver systems, devices and/or methods. Furthermore, it will be understood that according with Multiple Input Multiple Output ("MIMO") embodiments of the invention, the solid signal may, at least partially, be transmitted from a first antenna and the dotted signal may, at least partially, be transmitted from a second antenna.

Figure 4A:
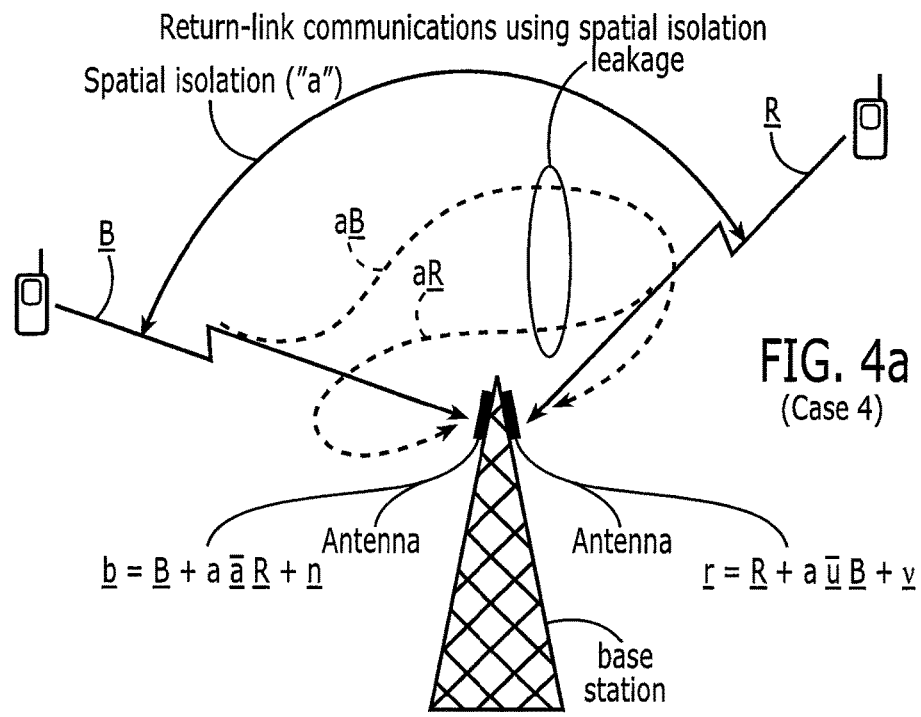
FIG. 4a illustrates systems/methods/devices of return-link communications according to embodiments of the invention that use a spatial discrimination between two or more receiver/transmitter antennas.
Figure 4B:
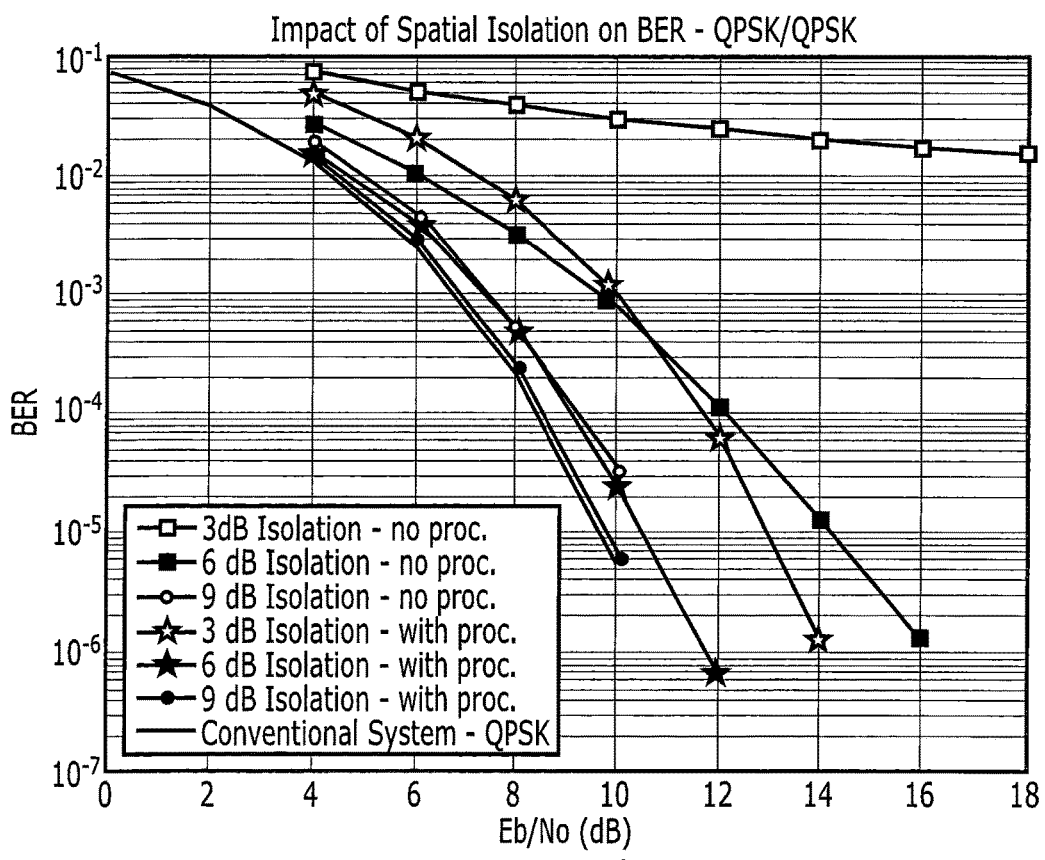
FIG. 4b provides BER curves that are associated with methods, systems and/or devices that are based upon FIG. 4a; Return Link—BER for the black or the red signals with antenna spatial isolation between the two (N=256, QPSK/QPSK)

Further embodiments may be provided as is illustrated by FIG. 4a. These embodiments may be referred to herein as "Case 4." In these embodiments, a spatial isolation between first and second antennas of a base station (or any other device) is used (relied upon) to attenuate (suppress) matrices $\bar{a}$ and $\bar{u}$ by an amount "a" ($|a|<1$). A receiver processor as in embodiments relating to Case 1 may be used to process received observable vectors b and r (expressed as $b=B+a\bar{a}R+n$; and $r=a\bar{u}B+v$) to derive information (data) associated with transmitted respective first and second end-user device signal vectors B and R, as is shown in FIG. 4a. Computer simulation results are presented in FIG. 4b. Configurations/embodiments of providing return-link communications as illustrated by FIG. 4a, advantageously allow first and second end-user devices to send/transmit return-link information (data) to a base station (and/or any other system element) using respective first (B, blue, or solid) and second (R, red, or dotted) carriers/signals that are transmitted, by the respective first and second end-user devices, staggered in frequency therebetween but substantially co-channel, using substantially the same resources of an available frequency space, channel and/or bandwidth, as is illustrated in FIG. 1, thus increasing a spectral efficiency measure of the return-link communications. In some embodiments, the staggering in frequency may be equal (or approximately equal) to 1/2T (i.e., one half of the inverse of a signaling interval as is illustrated in FIG. 1). In other embodiments, the staggering in frequency may be equal to one or more other values and/or may vary across the available frequency space.

Figure 5A:
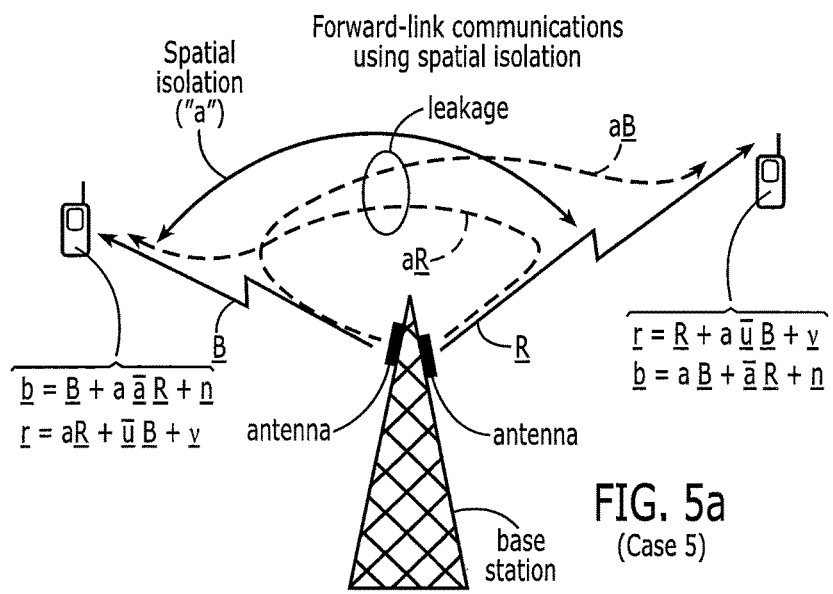
FIG. 5a illustrates systems/methods/devices of forward-link communications according to embodiments of the invention that use a spatial discrimination between two or more receiver/transmitter antennas.

Additional embodiments of the present invention may be provided as is illustrated in FIG. 5a. In these additional embodiments, which may be referred to herein as relating to "Case 5," a spatial isolation "a" between first and second antennas of a base station and/or first and second antennas of respective first and second end-user devices is used to provide forward-link communications from the base station to the first and second end-user devices, as is illustrated in FIG. 5a. A receiver processor (at each end-user device), that may, according to some embodiments, be configured substantially as in Case 1, may be used to process received observable vectors b and r (as received by each end-user device) to derive information (data) associated with transmitted signal vectors B and R, as is shown in FIG. 5a. Computer simulation results are presented in FIG. 5b. Configurations/embodiments of providing forward-link communications as is illustrated in FIG. 5a, advantageously can allow first and second end-user devices to receive information (data) from a base station using respective first (B, blue, or solid) and second (R, red, or dotted) carriers that are staggered in frequency therebetween and transmitted by the base station substantially co-channel, using substantially the same resources of an available frequency space/channel/bandwidth, as is illustrated in FIG. 1, thus increasing a spectral efficiency measure of the forward-link communications. In some embodiments, the staggering in frequency may be equal (or approximately equal) to 1/2T (i.e., one half of the inverse of a signaling interval as is illustrated in FIG. 1). In other embodiments, the staggering in frequency may be equal to one or more other values and/or may vary across the available frequency space.

Still further embodiments of the present invention may be provided. These still further embodiments may be referred to herein as relating to "Case 6." In accordance with these still further embodiments, an intentionally-introduced attenuation factor ("a") may be used to simulate a spatial isolation that may not be present because either first and second end-user devices are proximate to one another or because the first and second signals (i.e., the blue/solid and red/dotted signals) are transmitted by a base station in the same direction and are both aimed at a given (same) end-user device. Accordingly, the base station may transmit B and aR (instead of B and R); wherein $|a|<1$.

For a first embodiment relating to Case 6, a receiver processor at an end-user device may be configured substantially as in Case 1 and may first be used to process the received observable vectors $b=B+a\bar{a}R+n$ and $r=aR+\bar{u}B+v$ to derive information (data) associated with transmitted signal vectors B. Once an estimate of B has been derived, it may be used to perform a cancellation of components related to B (that is, cancellation of the term $\bar{u}B$ in r, without noise enhancement of r) thus deriving an estimate of R. Thus, in embodiments of the invention relating to Case 6, a two-stage (or a multi-stage) sequential receiver processor may be used.

For a second embodiment relating to Case 6, a receiver processor at a first end-user device, that may, according to some embodiments, be configured substantially as in Case 1, may first be used to process the received observable vectors b and r to derive information (data) associated with transmitted signal vector B. Once an estimate of B has been derived, the estimate of B may be relayed by the first end-user device to a second end-user device via a link (that may be a short-range link that is established directly between the first and second end-user devices) and the estimate of B may be used by the second end-user device to perform cancellation of components related to transmitted signal vector B (without noise enhancement) thus deriving an estimate of R. Thus, in embodiments of the invention relating to Case 6, a sequential receiver processor may be used wherein the sequential receiver processor may be distributed between the first and the second end-user devices and wherein a processor component that is associated with the second end-user device receives a first data estimate from the first end-user device and uses the received first data estimate from the first end-user device to derive a second data estimate that is intended for the second end-user device; wherein the first data estimate is intended for the first end-user device but is sent by the first end-user device to the second end-user device to aid the second end-user device to derive the second data estimate that is intended for the second end-user device.

Alternatively or in combination with the above, the sequential receiver processor may be included in its entirety in the second and/or in the first end-user device so that, in some embodiments, the second end-user device may not have to rely upon receiving the first data estimate from the first end-user device. Instead, the second end-user device may itself derive the first data estimate (even though the first data and/or any estimate thereof is not intended for the second end-user device) and then, the second end-user device may use the first data estimate that it has derived to derive the second data estimate (that is intended for the second end-user device). In some embodiments, the second end-user device may be configured to derive the first data estimate (via signal processing that is not associated with the first end-user device; via signal processing that is at the second end-user device) and to also receive the first data estimate from the first end-user device (as derived via signal processing that is associated with the first end-user device and is at the first end-user device). It will be understood that the term first end-user device may, in some embodiments, comprise a plurality of first end-user devices (that may be networked therebetween and/or may be configured to communicate therebetween directly or via intervening elements) and/or the term second end-user device may, in some embodiments, comprise a plurality of second end-user devices (that may be networked therebetween and/or may be configured to communicate therebetween directly or via intervening elements).

Accordingly, providing forward-link communications using embodiments associated with Case 6, may advantageously allow first and/or second end-user devices to receive information (data) from a base station using first (B, blue, or solid) and second (R, red, or dotted) carriers that are staggered in frequency therebetween and transmitted by the same base. station substantially co-channel, using substantially the same resources of an available frequency space/channel/bandwidth, as is illustrated in FIG. 1, thus increasing a spectral efficiency measure of the forward-link communications. In some embodiments, the staggering in frequency may be equal (or approximately equal) to 1/2T (i.e., one half of the inverse of a signaling interval as is illustrated in FIG. 1. In other embodiments, the staggering in frequency may be equal to one or more other values and/or may vary across an available frequency space. It will be understood that in some embodiments, one or more repeats of aR, over respective one or more signaling intervals, by a transmitter that is transmitting aR, may be used to increase an aggregate signal energy associated with a reception/detection of R (since |a|<1). Accordingly, a probability of error associated with the reception/detection of R may be reduced at a reduction of capacity associated with the second/red signal, R.

It will be understood that even though principles of frequency-domain coherent combining of signal samples have been disclosed herein, the principles disclosed herein are also applicable to coherent combining of time-domain signal samples. Accordingly, first and second time-domain pulse trains may be transmitted, for example, that may be staggered therebetween by, for example, one half of a signaling interval (or any other interval), creating a time-domain interleaved/staggered blue-red pulse train analogous to the interleaved/staggered blue-red frequency-domain pulse train of FIG. 1. It will also be understood that one or more pilot signals, that may be transmitted by a transmitter that is also transmitting the first and/or the second signals, may be used by a receiver to determine/estimate one or more parameters that are needed for signal processing at the receiver. Further, it will also be understood that receiver signal processing embodiments, as described herein, may also be used to reduce a level of intermodulation interference by reducing a power requirement of a transmitter, as will surely be appreciated by those skilled in the art. Also, those skilled in the art will recognize that one or more subcarriers of the dotted signal (i.e., of the dotted OFDM carrier; see FIG. 1) may be configured to carry/transport Forward Error Correction ("FEC") information to further aid in improving communications performance at a receiver.

According to further embodiments of the present invention, first and second receiver chains, comprising respective first and second Low Noise Amplifiers ("LNAs"), may be used by a receiver to derive the frequency-domain observable vectors b and r, respectively. These further embodiments of the present invention may, for example, relate to a multi-antenna receiver/transmitter, method and/or device and/or to a MIMO receiver/transmitter, method and/or device, as will be appreciated by those skilled in the art. Accordingly, the noise vectors n and v may be statistically independent therebetween. It will be understood that a receiver, comprising the first and second receiver chains and/or any other configuration/embodiment associated with the present invention, may be a receiver of a mobile or transportable device (e.g., a receiver of a wireless terminal or computer) or a receiver of a fixed device (e.g., a receiver of a base station, DSL/cable modem or any other access point in a home or business). It will also be understood that in some embodiments, respective first and second antennas that may be associated with the first and second receiver chains may be spaced apart (i.e., may be at a distance) therebetween and/or may be configured to preferentially receive electro-magnetic energy over respective first and second polarizations that may be different therebetween. In other embodiments, the first and second antennas may be substantially co-located. In further embodiments, the first and second antennas may comprise a single antenna subsystem that may be used to provide respective first and second signals to the first and second receiver chains/LNAs.

Those skilled in the art will appreciate that, in some embodiments, a receiver comprising a single receiver chain (and a single antenna subsystem) may be used instead of a receiver comprising two receiver chains (and two respective antennas) as described above. In some embodiments, a correlation that may exist between the noise vectors n and v may not substantially degrade a communications performance, such as, for example, a bit error-rate, or the communications performance may be degraded by a small/acceptable amount. In some embodiments, a correlation that may exist between the noise vectors n and v may not substantially degrade communications performance if the quantity $\delta^T$ (of the decision variable $\gamma^T b + \delta^T r$) is complex-valued and/or represents a rotation. In rotating r, the noise v is also rotated, de-correlating n and v.

Further to the embodiments described above and/or in the U.S. Provisional Applications cited herein, including all combinations and/or sub-combinations thereof, a transmitter may be configured to transmit a signal vector B for the solid signal and the transmitter may also be configured to transmit a signal vector $R = \bar{a}^{-1} B$ for the dotted signal (wherein "$\bar{a}^{-1}$" denotes inverse of $\bar{a}$). Accordingly, a receiver may be configured to derive frequency-domain observable vectors $b = 2B + n$ and $r = (\bar{a}^{-1} + \bar{u}) B + v$. Further, a receiver processor may be configured to combine the two frequency-domain observable vectors b and r, yielding $b'_k = \gamma^T b + \delta^T r$, such as, for example, a mean-squared performance measure between $b'_k$ and $B_k$ (a $k^{th}$ element of B) is minimized or reduced. It will be understood that the superscript "T" on a vector denotes transpose or conjugate transpose (i.e., Hermitian transpose), as appropriate. Furthermore, it will be understood that $B_k$ may be complex-valued and denotes the $k^{th}$ element of the data vector B (k=1, 2, . . . , N). Also, it will be understood that the receiver vectors $\gamma$ and $\delta$ may, in some embodiments, take-on different values for different values of the index k.

In some embodiments, a receiver may be configured to generate at least 2N samples of a received signal, $x(t) + N(t)$, over at least a signaling interval, T, thereof. That is, letting the received signal be $y(t) = x(t) + N(t)$, wherein x(t) denotes a desired signal component and N(t) denotes noise and/or interference, the receiver may be configured to generate a set of 2N samples, $\{y(t_1), y(t_2), y(t_3), y(t_4), y(t_5), \ldots, y(t_{2N})\}$, and to use a first subset of the 2N samples, comprising, for example, N of the 2N samples, that may comprise, for example, odd indexed samples $\{y(t_1), y(t_3), y(t_5), \ldots\}$ of the 2N samples, to form a first Discrete Fourier Transform ("DFT") and/or a first Fast Fourier Transform ("FFT"), that may be a first N-point DFT and/or a first N-point FFT at the frequencies k/T; k=1, 2, . . . , N; and to use a second subset of the 2N samples, comprising, for example, M of the 2N samples, that may comprise, for example, even indexed samples {y($t_2$), y($t_4$), y($t_6$), . . . } of the 2N samples, to form a second DFT and/or a second FFT, that may be a second M-point DFT and/or a second M-point FFT at the frequencies (2n+1)/2T; n=1, 2, . . . , M. In some embodiments, M=N; in other embodiments, M<N; in further embodiments, M>N. The first subset of the 2N samples may also be referred to herein as the first set of samples or the first set of N discrete-time samples and the second subset of the 2N samples may also be referred to herein as the second set of samples or the second set of N discrete-time samples.

It will be understood that the first subset of the 2N samples may, in accordance with some embodiments of the invention, comprise a number of samples that is not equal to a number of samples associated with the second subset of the 2N samples. Similarly, the same may be stated with respect to the terminology "first set of samples" and "second set of samples," and with respect to the terminology "first set of N discrete-time samples" and "second set of N discrete-time samples." To further clarify, the "N" in "first set of N discrete-time samples" and the "N" in "second set of N discrete-time samples" does not necessarily constrain these terms to be associated with an equal number "N" of samples. A number of samples associated with the "first set of N discrete-time samples" may be different than a number of samples that is associated with the "second set of N discrete-time samples."

Figure 10:
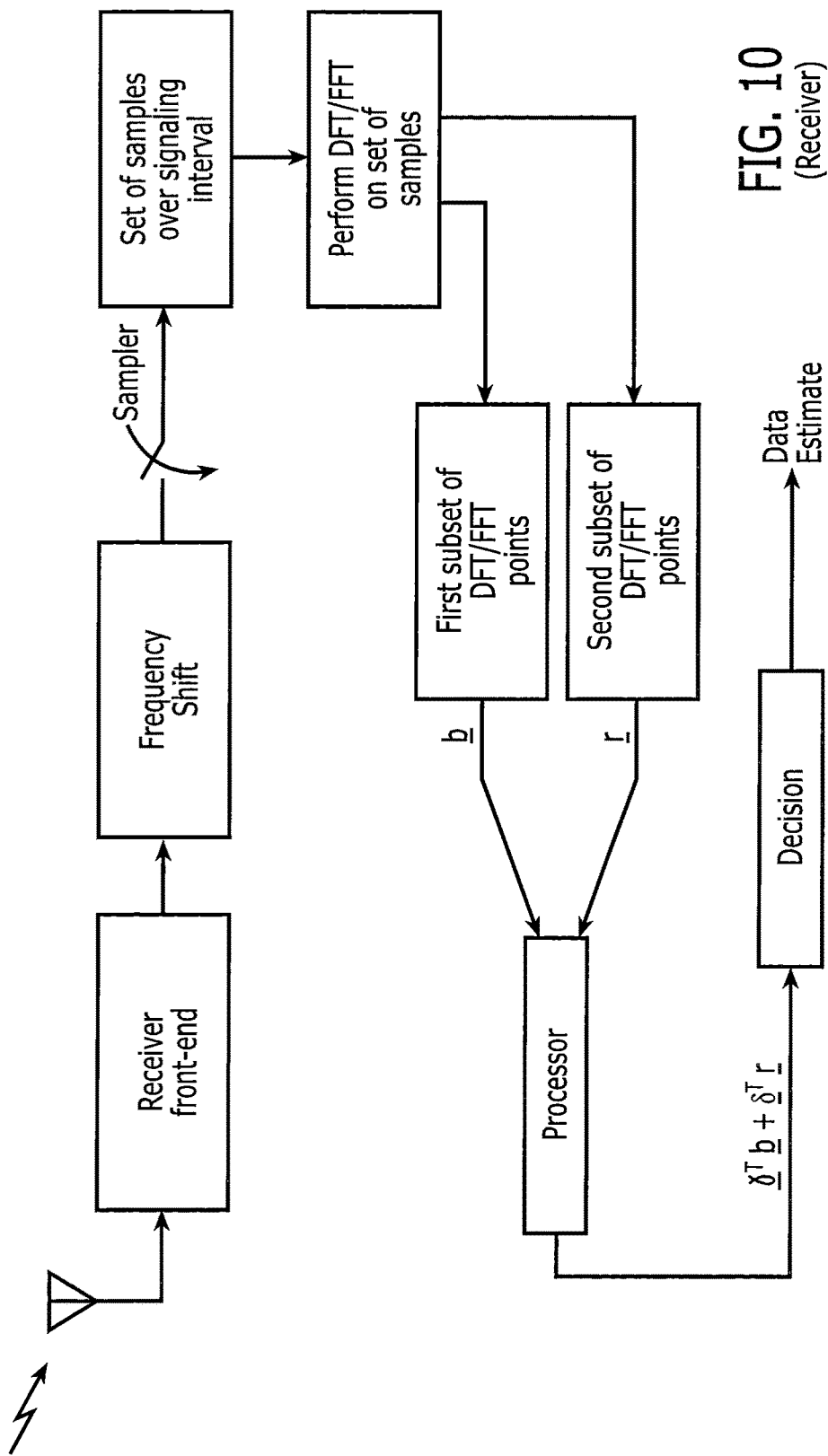
Figure 11:
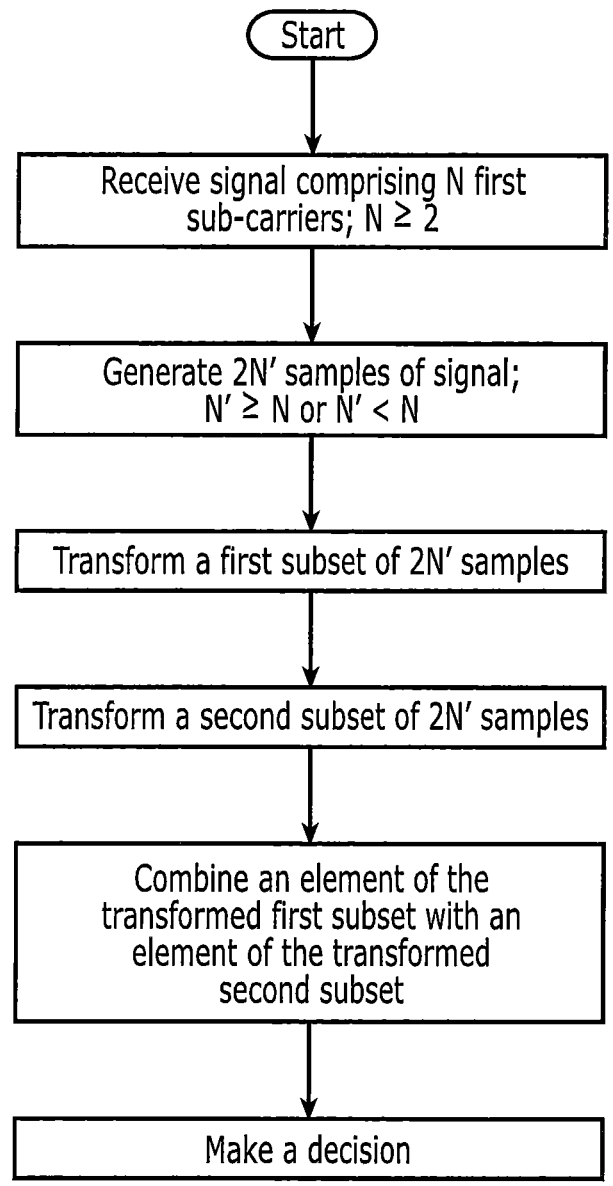

In reference to FIG. 1, it will be understood that, according to embodiments of the present invention, a transmitted/received signal may comprise $N_0$ first sub-carriers (the solid sub-carriers of FIG. 1) that may be orthogonal therebetween and $M_0$ second sub-carriers (the dotted sub-carriers of FIG. 1) that may be orthogonal therebetween but may not be orthogonal to the $N_0$ first sub-carriers (e.g., in some embodiments of the invention, at least one of the $M_0$ second sub-carriers is not orthogonal to any one of the $N_0$ first sub-carriers; or at least one of the $M_0$ second sub-carriers is not orthogonal to at least one of the $N_0$ first sub-carriers); wherein $N_0 \geq 2$ and $M_0 \geq N_0$ or $M_0 < N_0$, and wherein $M_0 \geq 0$. Further, it will be understood that a receiver may be configured to generate 2N' samples of the transmitted/received signal; wherein $N' \geq N_0$; and to perform a first transformation on a first sub-set of the 2N' samples, comprising N'' samples; wherein $N'' \leq 2N'$; and to perform a second transformation on a second sub-set of the 2N' samples, comprising N''' samples; wherein $N''' \leq 2N'$; and to combine an element of the first transformation with an element of the second transformation (as is further illustrated by the flow-chart of FIG. 11 and by FIGS. 8, 9 and 10). In some embodiments, N''=N'''=N'.

In some embodiments, the signal y(t)=x(t)+N(t) may be a passband signal, centered at a carrier frequency $f_c$ and comprising a bandwidth N/T (i.e., the signal y(t) may occupy and/or be allocated frequencies from $f_c$−N/2T to $f_c$+N/2T), and a receiver may be configured to generate any desired number of samples of y(t) over a T-seconds signaling interval thereof. In other embodiments, the passband signal y(t) may be shifted and/or translated in frequency so as to be centered substantially at the frequency N/2T after it has been frequency shifted/translated (thus comprising frequency content from substantially zero Hz to N/T Hz after it has been frequency shifted/translated), and the receiver may be configured to generate samples of y(t) by operating on the frequency shifted/translated version of y(t). In further embodiments, the passband signal y(t) may be shifted/translated in frequency so as to be centered substantially at zero frequency after it has been frequency shifted/translated (and thus comprise frequency content from substantially −N/2T Hz to N/2T Hz), and the receiver may be configured to generate samples by operating on this frequency shifted/translated version of y(t).

In yet further embodiments, the passband signal y(t) may be shifted/translated in frequency so as to be centered substantially at a frequency $f_c'$; wherein $f_c'$ may be smaller than $f_c$ or greater than $f_c$; and the shifted/translated signal may thus comprise frequency content from substantially $f_c'$−N/2T Hz to $f_c'$+N/2T Hz, and the receiver may be configured to generate samples by operating on this frequency shifted/translated version of y(t). In some embodiments, the desired number of samples over the T-seconds signaling interval is 2N. In other embodiments, the desired number of samples over the T-seconds signaling interval is N. In further embodiments, the desired number of samples over the T-seconds signaling interval may be any desired number of samples that may differ from N or 2N.

Accordingly, a receiver may be configured, in some embodiments, to generate at least 2N time-domain samples of the received signal x(t)+N(t) over at least the T-seconds signaling interval using a receiver sampling rate of at least 2N/T. In further embodiments, the receiver may be configured to generate at least N time-domain samples of the received signal x(t)+N(t) over at least the T-seconds signaling interval using a receiver sampling rate of at least N/T. It will be understood that, in some embodiments, a receiver sampling rate may exceed N/T. and/or 2N/T, while in other embodiments, a receiver sampling rate may be smaller than N/T and/or 2N/T. In some embodiments, a receiver sampling rate may depend upon an autocorrelation function that is associated with N(t). Given that a spectrum of y(t), on a positive frequency axis, is centered at a frequency $f_c'$, and thus the spectrum of y(t) comprises frequency content from substantially $f_c'$−N/2T Hz to substantially $f_c'$+N/2T Hz, an autocorrelation function of N(t), subject to ideal passband filtering of y(t) about $f_c'$, may be shown to be:

$$R(\tau)=2\eta_o(N/T)\{[\sin \pi(N/T)\tau]/[\pi(N/T)\tau]\} \cos 2\pi f_c'\tau;$$

wherein $\eta_o$ may be a constant and may represent a noise density, such as a noise power spectral density or a noise energy spectral density.

Accordingly, setting $2\pi f_c'\tau=\pi/2$ yields $R(\tau)=0$ for $\tau=1/(4f_c')$. We thus observe, that if, for example, we set $f_c'$=N/2T, we will have $R(\tau)=0$ for $\tau$=T/2N and, a receiver that is configured to sample at a rate of 2N/T will yield 2N samples over T; wherein each sample of the 2N samples comprises a noise component that is uncorrelated from any other noise component associated with any other of the 2N samples. Those skilled in the art know that uncorrelated noise components imply independent noise components, assuming Gaussian noise statistics. Accordingly, if all 2N noise components are independent therebetween, and a first set of the 2N samples is used to form b, while a second set of the 2N samples is used to form r; wherein the second set of the 2N samples does not intersect (i.e., does not have any elements in common with) the first set of the 2N samples, the n and the v noise vectors will be uncorrelated and independent therebetween.

It may be observed from the R(τ) equation above that if $f_c'$ is, for example, doubled, a sampling rate of the receiver may also be doubled, while the receiver may continue to provide samples of y(t) comprising noise components that are uncorrelated and/or independent therebetween. Accordingly, in some embodiments, a receiver may be configured to shift/translate, in frequency, a received signal y(t) such as to center a spectrum of y(t) at a value of $f_c'$ that allows the receiver to take more than 2N samples of y(t), over T, while maintaining noise components between samples uncorrelated and/or independent. As such, the more than 2N samples may now be used to define more than two subsets. The more than two subsets of the more than 2N samples may be used to provide more than two DFTs and/or FFTs, which may be combined, according to the principles disclosed herein, to allow further improvements in communications performance and/or capacity.

Specifically, $R(\tau)=0$ for $\tau=1/(4f_c')$, as was stated earlier. Accordingly, if, for example, we set $f_c'=N/T$, we will have $R(\tau)=0$ for $\tau=T/4N$ and, a receiver that is configured to sample at a rate of 4N/T will yield 4N samples over T; wherein each sample of the 4N samples comprises a noise component that is uncorrelated from any other noise component associated with any other of the 4N samples. Thus, if all 4N noise components are independent therebetween, a first subset of the 4N samples comprising, for example, N samples, may be used via a first N-point FFT to form a "b'," at, for example, the frequencies (k+N)/T; k=1, 2, . . . , N; while a second subset of the 4N samples comprising, for example, N samples, may be used to form a "r'," at, for example, the frequencies (k+N+1/2)/T; k=1, 2, . . . , N; wherein, as before, the second subset of the 4N samples does not intersect the first subset of the 4N samples, thus allowing the n' noise vector (i.e., the noise component of b') and the v noise vector (i.e., the noise component of r') to be uncorrelated and independent therebetween. But there are still 2N samples that have not been used. These remaining 2N samples may be used to form a further b" at, for example, the frequencies (k+N+1/4)/T; k=1, 2, . . . , N; and a further r" at, for example, the frequencies (k+N+3/4)/T; k=1, 2, . . . , N; and wherein at least some of b', r', b" and r" (and in some embodiments all of b', r', b" and r") may be combined therebetween, for example, using a LMSE criterion, or any other criterion, as has previously been discussed herein. This technique may clearly be applied to any case wherein a number of samples of y(t), over T, is an integer multiple of N. In other embodiments, the number of samples of y(t), over T, may not be an integer multiple of N.

In some embodiments, a second set of samples (or a second set of discrete-time samples), that may comprise N samples, may be based upon a first set of samples (or a first set of discrete-time samples), that may comprise N samples. In further embodiments, the second set of samples may be derived from the first set of samples by multiplying the first set of samples by a sinusoidal function or by an exponential function that may be a complex exponential function (e.g., a complex sinusoidal function). In additional embodiments, the first set of samples may be used to generate a first Discrete Fourier Transform ("DFT") and/or a first Fast Fourier Transform ("FFT"), at frequencies of k/T; k=1, 2, . . . , N; and the second set of samples may be used to generate a second DFT and/or a second FFT at frequencies of (2n+1)/2T; n=1, 2, . . . , M; wherein M may be equal to N, M may be greater than N or M may be less than N.

It will be understood that any embodiment or combination/sub-combination of embodiments described herein and/or in any of the U.S. Provisional Applications cited herein may be used to provide wireless and/or wireline systems, devices and/or methods. It will also be understood that even though embodiments of the present invention are presented herein in terms of a receiver processor that is configured to reduce/minimize a mean-squared error quantity, performance index and/or cost function (i.e., a receiver processor that yields one or more Least Mean Squared Error ("LMSE") receiver observables), any other quantity, performance index and/or cost function other than LMSE and/or any variation of LMSE (such as, for example, Kalman, fast Kalman, LMS/Newton, sequential regression, random-search, lattice structure/predictor, zero-forcing, least squares, recursive least squares, maximum likelihood sequence estimation, maximum a posteriori probability, maximum ratio combining and/or any variations, combinations and/or sub-combinations thereof, etc.) may be used, as will be appreciated by those skilled in the art, in lieu of LMSE or in conjunction and/or in combination with LMSE.

It will be understood that in some embodiments such as, for example, in OFDM/OFDMA embodiments, wherein a plurality of spatially diverse channels and/or communications links may be associated with a single carrier, wherein the plurality of spatially diverse cannels and/or communications links may correspond to a respective plurality of users, a respective plurality of receiver vectors (in γ and/or in δ) may be used to accommodate the plurality of channels/users. Each channel of the plurality of channels may be associated with a different signal-to-noise ratio, necessitating, according to some embodiments, its own (individually optimized) γ and/or δ vectors. The γ and/or δ vectors may be updated (iteratively and/or non-iteratively) responsive to, for example, one or more measurements of, for example, a channel's signal-to-noise ratio.

In a conventional OFDM system, an OFDM carrier, comprising a plurality of sub-carriers, may be amplified, prior to transmission, via a single Power Amplifier ("PA"). As such, owing to an output power requirement of the conventional OFDM system, the PA may be driven to operate (at least to some extent) in a non-linear region thereof, generating non-linear distortion which may adversely impact the conventional OFDM system, particularly when the OFDM carrier includes at least some sub-carriers that are based upon a high-order modulation alphabet, such as, for example, 64-QAM, 128-QAM, 256-QAM, 1024-QAM, etc.

Figure 6:
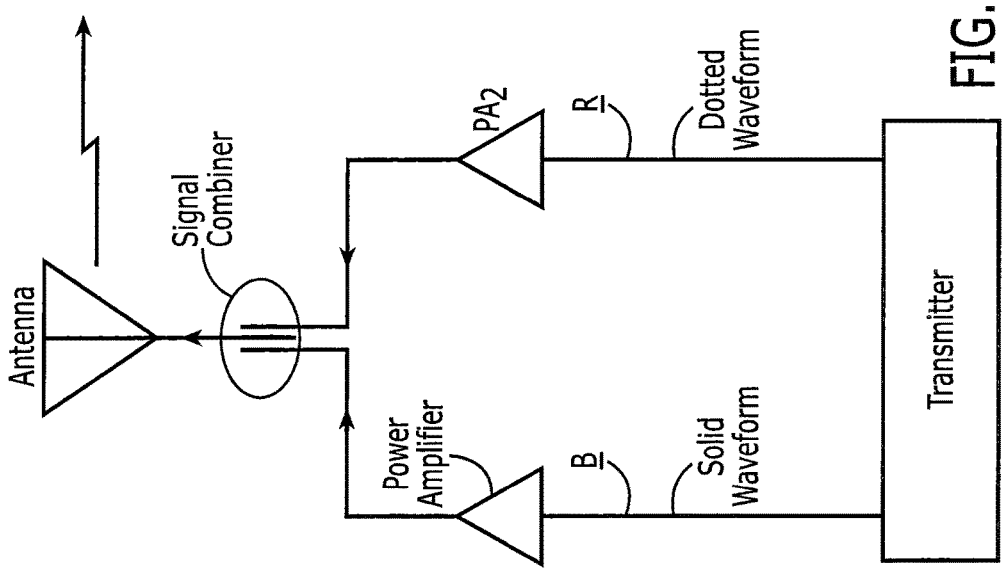
FIG. 6 illustrates methods/systems/devices according to embodiments of the invention.

In some embodiments of the present invention, at least two PAs are provided wherein at least a first one of the at least two PAs is used to amplify at least a portion of the "solid" waveform/signal (see FIG. 1), at least a second one of the at least two PAs is used to amplify at least a portion of the "dotted" waveform/signal (see FIG. 1) and wherein respective outputs of the at least two PAs are combined, using a signal combiner, prior to the two amplified signals being transmitted over one or more propagation media/channels via one or more antennas. FIG. 6 is illustrative of a wireless OFDM/OFDMA system and/or method, according to various embodiments of the present invention. It will be understood, however, that the principles disclosed herein are also applicable to non-wireless OFDM/OFDMA systems and/or methods. It will also be understood that the respective outputs of the at least two PAs of FIG. 6 need not be combined, according to some embodiments of the present invention, but instead, may be used to excite respective at least first and second antenna elements (not illustrated in FIG. 6) or respective at least first and second non-wireless transmission media. Further to the above, it will be understood that the label "Solid Waveform" as it appears in FIG. 6 means "at least a portion of the Solid Waveform," or "at least some subcarriers of the Solid Waveform." Similarly, it will be understood that the label "Dotted Waveform" as it appears in FIG. 6 means "at least a portion of the Dotted Waveform," or "at least some subcarriers of the Dotted Waveform." Accordingly, each one of the PAs, as illustrated in FIG. 6, may operate at a lower output power level, providing greater linearity, reducing a non-linear distortion thereof and allowing for improved performance of an OFDM/OFDMA carrier, that may include at least some sub-carriers that are based upon a high-order modulation alphabet, such as, for example, 64-QAM, 128-QAM, 256-QAM, 1024-QAM, etc.

Figure 7:
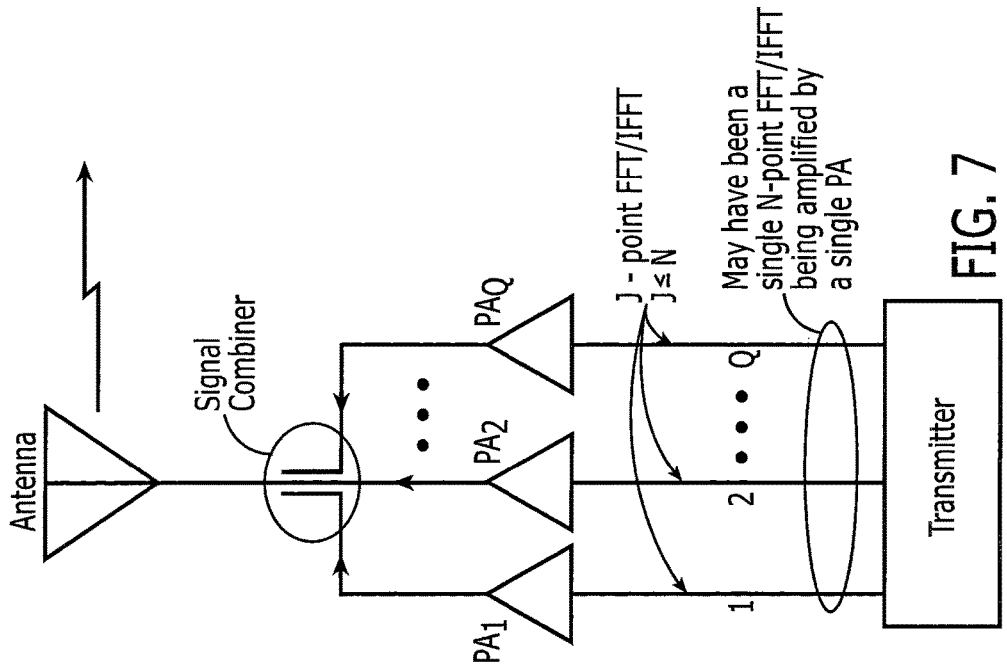
FIG. 7 illustrates methods/systems/devices according to embodiments of the invention.

According to further embodiments of the present invention, an OFDM/OFDMA carrier comprising N sub-carriers (N≥2), which may conventionally be based upon a single N-point FFT and/or a single N-point IFFT (or a single N-point DFT/IDFT) may instead be based upon Q, Q≥2, J-point FFTs and/or Q J-point IFFTs (or Q J-point DFTs/IDFTs), wherein J≤N in some embodiments. In other embodiments, however, J>N. (It will be understood that, according to some embodiments, at least one FFT and/or IFFT of the Q "J-point FFTs and/or IFFTs" may be based upon and/or include a number of points that is different than J.) Each one of the Q "J-point FFTs and/or IFFTs," which may be representing a grouping of less than N sub-carriers (and in some embodiments a grouping of up to N sub-carriers or more), may be provided to one of Q respective PAs, as is illustrated in FIG. 7. (It will be understood that FIG. 7 is only illustrative and assumes a wireless environment and that the principles disclosed herein also apply to any other non-wireless environment and/or transmission medium.) Following amplification, Q respective outputs of the Q respective PAs may be combined by a signal combiner and used to excite an antenna or antennas (or any other element of a wireless/non-wireless transmission medium), as is, for example, illustrated in FIG. 7. It will be understood that in some embodiments, at least a first and a second output of respective first and second PAs, of the Q PAs, may be used to excite respective first and second antennas (not illustrated in FIG. 7). Some embodiments of systems, methods and/or devices according to FIG. 6 and/or FIG. 7 are devoid of the signal combiner that is illustrated in FIG. 6 and in FIG. 7. In such embodiments, there is a one-to-one correspondence between a number of PA outputs and a number of antenna elements, wherein each PA output is associated with, and is used to excite/feed/drive, a respective antenna element.

It will also be understood that any OFDM/OFDMA system/method/device, conventional or otherwise, including wireless and non-wireless (i.e., wireline, cable, fiber optical, etc.) systems, methods and/or devices, or any other multi-carrier system, method and/or device (that may not be based upon OFDM/OFDMA principles), may be based on a transmitter architecture/method as is described herein and is illustrated in FIG. 6 and/or FIG. 7, to reduce (or minimize) an output power level requirement of one or more individual PAs, improve linearity associated with amplification and/or reduce (or eliminate) a communications performance penalty due to non-linear distortion, while increasing a system throughput (or capacity) by allowing higher-order constellation/modulation alphabets to be used, such as, for example a 256-QAM or even a 1024 QAM constellation/modulation alphabet. In will also be understood that embodiments as described herein and illustrated in FIGS. 8, 9, 10 and/or 11, may be combined in part or in whole with embodiments as described herein and illustrated in FIGS. 6 and/or 7.

Additional embodiments relating to pre-distortion of data by a transmitter will now be presented. In Provisional Application No. 61/163,119, filed on 25 Mar. 2009 and incorporated herein by reference in its entirety as if set forth fully herein, at the top of page 3 thereof, it is stated that "the vector R may be set equal to $\epsilon B$ . . . " and that " . . . $\epsilon$ may be a scalar (complex-valued, real or imaginary) or a matrix (complex-valued, real or imaginary)." Accordingly, a second data vector, such as, for example, the data vector R, may be generated via a transformation, that may be a linear and/or a non-linear transformation, of a first data vector, such as, for example, the data vector B, such that an element/component of the second data vector (e.g., an element/component of R) may depend upon a plurality of elements/components of the first data vector (e.g., may depend upon a plurality of elements/components of B), wherein the element/component of the second data vector may comprise a linear and/or non-linear combination of elements/components of the first data vector. In some embodiments of the invention, the second data vector (e.g., the data vector R) may comprise a frequency-shifted version of at least some elements/components/dimensions of the first data vector (e.g., the data vector B) and, the second data vector, may, according to some embodiments, also include a phase rotation relative to the first data vector; wherein the phase rotation may be 90° (or $\pi/2$ radians), in some embodiments. The phase rotation may be used advantageously to further de-correlate noise/interference components of the second data vector (R) relative to noise/interference components of the first data vector (B) at a receiver that is configured to process the two data vectors (B and R), for example, as described earlier.

Further to the above, in Provisional Application No. 61/119,593, that was filed on 3 Dec. 2008 and is incorporated herein by reference in its entirety as if set forth fully herein, towards the middle of page 3 thereof, it is stated that "In additional embodiments, a signal (solid and/or dotted), or at least a portion thereof, may be subjected to a partial pre-distortion by a transmitter, whereby a residual level of interference remains therein upon reception by a receiver, and may also be subjected to equalization by the receiver in order to reduce the residual level of interference." Accordingly, a partial pre-distortion level may be provided by a transmitter to a signal (e.g., to a data vector) such that a level of interference remains upon reception of the signal by a receiver and the receiver may then be relied upon to further process the signal in order to reduce the level of interference that remains.

Based on the above, additional embodiments of systems/devices/methods may be provided wherein a content/element/component of a signal, wherein said signal may comprise, for example, an OFDM/OFDMA carrier comprising N data elements and/or N sub-carriers (that may be orthogonal therebetween), may be subjected to a pre-distortion, that may be a partial pre-distortion, such that the content/element/component of the signal may be spread, for example, in frequency and/or in time, over an available/predetermined frequency space (and/or time space) in order to provide frequency/time diversity protection. In some embodiments, said signal may comprise, for example, an OFDM/OFDMA carrier comprising N data elements and/or N sub-carriers that may be orthogonal therebetween, non-orthogonal therebetween or partially orthogonal therebetween (e.g., a second element/subcarrier is orthogonal to a first element/subcarrier while a third element/subcarrier is not orthogonal to the first element/subcarrier).

Accordingly, the data vector C' may be generated from the data vector C in many different ways, by subjecting C to linear and/or non-linear processing. In some embodiments, C' may be generated from C by subjecting C to a linear transformation (e.g., by multiplying C by a matrix, that may, according to some embodiments of the present invention, be a square N×N matrix). In some embodiments, C' may comprise N elements/components/dimensions, wherein at least one element/component/dimension of C' comprises a linear superposition of elements/components/dimensions of C and wherein, in some embodiments, each element/component/dimension of C' comprises a linear superposition of elements/components/dimensions of C. In some embodiments, the linear superposition of elements/components/dimensions of C comprises a rotation (and is devoid of amplitude modification) wherein the elements/components/dimensions of C are each rotated (by an angle that is negative, positive or zero) and are then summed therebetween to form the linear superposition. According to further embodiments of the present invention, the linear superposition of elements/components/dimensions of C is based upon/includes all N elements/components/dimensions of C, as would be the case, for example, if the N elements/components/dimensions of C were subjected to a Fourier transform, such as, for example, a Fast Fourier Transform (FFT) and/or a Discrete Fourier Transform (DFT).

The data vector C' may be augmented by one or more pilot symbols and then transmitted over a plurality of frequency/time channels that may be orthogonal therebetween. Prior to the augmentation of C' by the one or more pilot symbols, C' is limited to N elements/components/dimensions and/or data sub-carriers. In some embodiments, following the augmentation of C' by the one or more pilot symbols, the augmented C', denoted as AC', may comprise N+P, P≥1, elements/components; wherein P of said pilot symbols are associated with respective P pilot sub-carriers that are provided over-and-above the N data sub-carriers. In other embodiments, following the augmentation of C' by the one or more pilot symbols, C' remains limited to N elements/dimensions; wherein said pilot symbols are provided as imbedded within the N elements/dimensions and/or data sub-carriers of C'.

Accordingly, in some embodiments, AC' may be transmitted over N+P frequency/time channels wherein, in some embodiments, a first portion of the N+P frequency/time channels may occupy a first frequency/time interval and wherein a second portion thereof may occupy a second frequency/time interval that may not be contiguous with the first frequency/time interval. The N+P frequency/time channels may correspond to respective N+P sub-carriers that may be orthogonal therebetween. It will be understood that the terminology that is used above, in referring to the first and second non-contiguous frequency/time intervals, refers to embodiments wherein AC' is transmitted using, for example, frequencies from $f_x$ to $f_x+\Delta_x$ and frequencies from $f_y$ to $f_y+\Delta_y$, wherein $\Delta_x+\Delta_y$ denotes an aggregate RF bandwidth that is required for the transmission of AC', using an OFDM/OFDMA technology, over a signaling interval T.

In some embodiments, $f_y$ is separated from $f_x+\Delta_x$ by a substantial frequency interval over which an authority for the transmission of AC' has not been provided; wherein said authority may be a regulatory/government/industrial authority or any other authority that may relate to a commercial, business, financial, political and/or interference concern. For example, according to a broadband embodiment, the aggregate RF bandwidth may have a value of 100 MHz ($\Delta_x+\Delta_y=100$ MHz), that may not be available contiguously (i.e., may not be available as one continuous block of spectrum) to an entity desiring to transmit AC'. Accordingly, the entity may select to transmit AC' using, for example, the following parameters: $f_x=1$ GHz, $\Delta_x=40$ MHz, $f_y=1.4$ GHz and $\Delta_y=60$ MHz. It will be understood that any other set of values for the parameters listed above may be used to define a broadband (or non-broadband) embodiment. It will also be understood that the broadband (or non-broadband) embodiment may be based upon a Time Division Duplex (TDD) protocol and/or a Frequency Division Duplex (FDD) protocol.

In an analogous way to using non-contiguous frequency intervals, as described above, two or more non-contiguous time intervals may be used, according to further embodiments, in conjunction with (or without the use of) two or more non-contiguous frequency intervals to transmit an augmented (by the one or more pilot symbols) vector C' and/or a sequence of augmented vectors C'.

It will be appreciated by those of skill in the art that by having constructed C' based upon C, as is illustrated above, at least one data element/component of C', and in some embodiments each one of the N data elements/components of C' comprises a value (complex, imaginary or real) that is related to (i.e., is a function of and/or depends upon) a plurality of data elements/components of C and that according to further embodiments, at least one data element/component of C', and in some embodiments each one of the N data elements/components of C' comprises a value (complex, imaginary or real) that is related to (i.e., is a function of and/or depends upon) all N data elements/components of C. Stated differently, at least one element/component of C is distributed (e.g., a power and/or energy content thereof is distributed) over at least first and second elements/components/dimensions of C'. Accordingly, if during transmission of C' the second element/component of C', for example, is degraded due to a channel anomaly such as, for example, a fade and/or interference, a receiver that is configured to receive and process C' in order to derive an estimate of C may still be able to derive a reliable estimate of C based upon a frequency/time diversity that is provided by C'.

Figure 12:
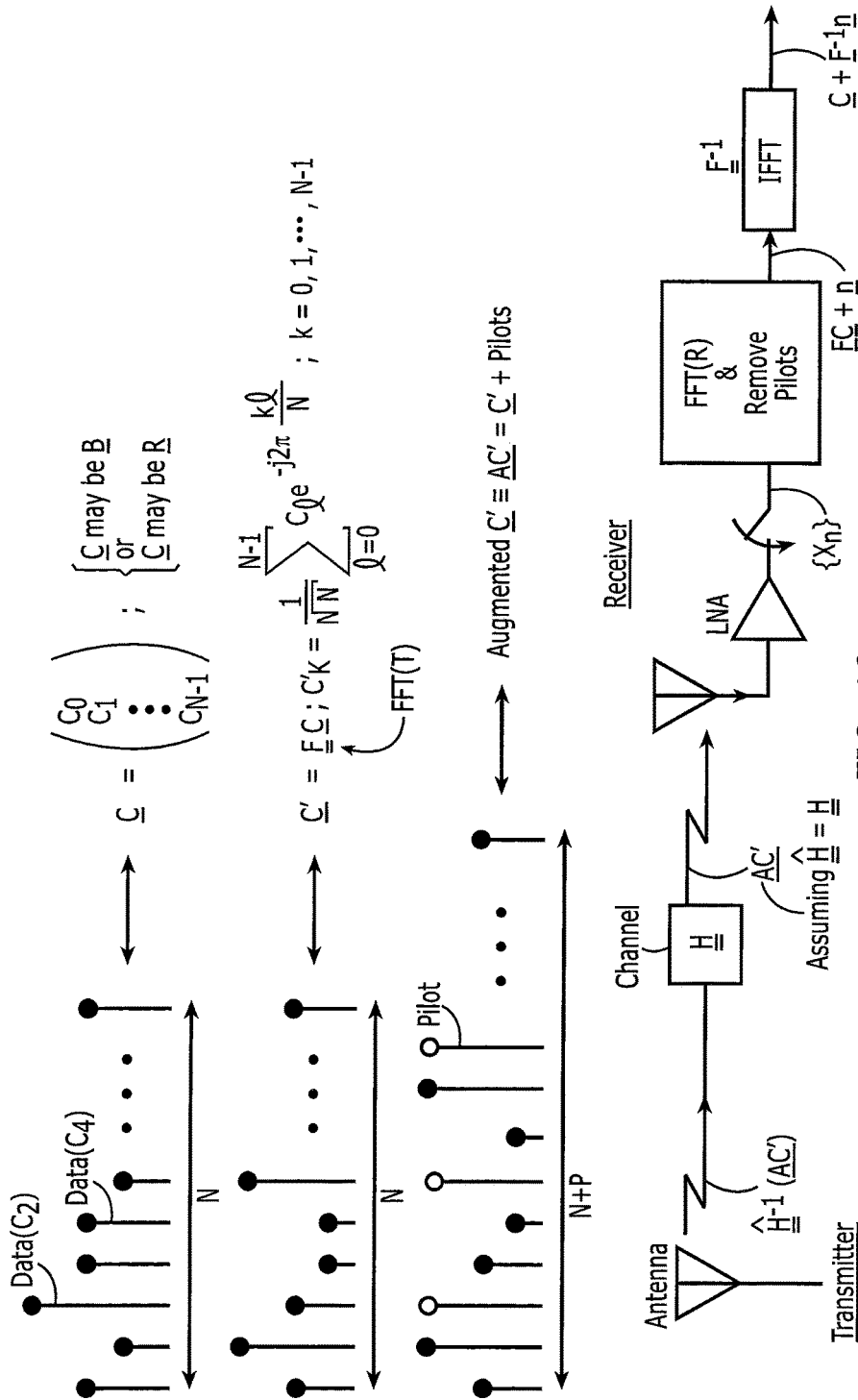
FIG. 12 illustrates a transformation that may be imposed on a data vector by a transmitter, prior to the transmitter transmitting the data vector, in order to distribute elements of the data vector over an available space (frequency space) and/or provide diversity/robustness against channel impairments such as fading and/or interference.

It will be understood that in some embodiments, prior to transmission of AC' AC' may be further pre-distorted/transformed by using a channel matrix, whose elements comprise (and/or are based upon) an inverse of a channel response and/or a complex conjugate of a channel response. Having further pre-distorted/transformed AC' by, for example, having multiplied AC' by the channel matrix, as the further pre-distorted vector AC' propagates through the channel, a channel-induced degradation, such as, for example, a channel fading may be reduced. The channel matrix may be used, as described above, to further pre-distort/transform the vector AC' in any Time Division Duplex (TDD) embodiment and particularly in broadband TDD embodiments wherein a signaling interval T is small compared to a variation that may be experienced by the channel matrix. Other embodiments that are not based upon TDD may also use a channel matrix to further pre-distort/transform the vector AC'. FIG. 12 illustrates embodiments of systems/methods that are based upon the above description.

As is illustrated in FIG. 12 (top trace), a data vector C, that may, according to some embodiments, be a data vector that is defined in a frequency domain, comprising N data elements ($C_0$, $C_1$, . . . , $C_{N-1}$) is to be transmitted by a transmitter. Each one of the N data elements may be real-valued, imaginary-valued or complex-valued and each one of the N data elements may take-on values from any desired signal constellation such as, for example, BPSK, QPSK, 16-QAM, 64-QAM, 256-QAM, etc. Prior to transmission of C by the transmitter, C is subjected to a transformation (pre-distortion) which, as is illustrated by the second trace of FIG. 12, may be based upon a Fourier Transform, which may be based upon a N-point Discrete Fourier Transform (DFT) and/or a Fast Fourier Transform (FFT) with any desired/appropriate scaling factor, such as, for example, $(1/N)^{1/2}$, instead of the conventional scaling factor of 1/N. The Fourier transform operation is labeled as "FFT(T)" in FIG. 12; "FFT" for Fast Fourier Transform and "(T)" for Transmitter. It will be understood, however, that what is shown in FIG. 12 is illustrative, may relate to some embodiments, and that, in other embodiments, C may be subjected to any other transformation/pre-distortion (linear or otherwise) as desired and/or appropriate. A transformed C will be denoted as C'. In some embodiments, in addition to the above (or instead of the above), a number of null subcarriers may be added to C' (or to C) so that a dimensionality of C' (or C) increases beyond N; wherein each one of the null subcarriers comprises zero amplitude/magnitude and may be placed/positioned anywhere, as desired, on a frequency axis. In further embodiments, in addition to the above (or instead of the above), one or more subcarriers of C' (or C) that include a non-zero amplitude/magnitude may be deleted and replaced with respective null subcarriers each comprising a zero amplitude/magnitude. This technique of deleting and replacing one or more non-zero amplitude/magnitude subcarriers of C' (or C) with respective null subcarriers may be used, in some embodiments, to provide a frequency-domain pulse position modulation system/method/device as will be appreciated by those skilled in the art. It is understood that the one or more subcarriers of C' (or C) that are deleted and replaced by null subcarriers may be kept and transmitted over one or more successive signaling intervals.

Following the transformation (pre-distortion) of C, as is described above and/or is illustrated by the second trace of FIG. 12, a number P (P≥1) of pilot symbols (e.g., pilot sub-carriers) may be added to the transformed C, denoted as C', thus forming an Augmented C', denoted as AC' in FIG. 12. It will be understood that in some embodiments, in forming AC' from C', one or more elements of C' may be rearranged (e.g., the first element of C' ($C'_0$) may become the last element of AC' ($AC'_{N+P-1}$)). It will also be understood that pilot symbols may be inserted in locations other than those illustrated by the third trace of FIG. 12. Those skilled in the art will appreciate that C may initially including only M data elements (M≤N); C may then be mapped onto N≥M subcarriers (with at least one subcarrier having zero magnitude if M<N) thus generating a frequency-domain version/representation of C; an N-point FFT may then be performed on C, following the mapping of C onto the N subcarriers, in order to generate C'; the pilot symbols may then be added to C' in order to create AC', as described earlier, and then a N+P point IFFT may be performed on AC' prior to transmission thereof over a channel. Further to the above, prior to transmission of AC' over the channel, AC' may be operated upon by another matrix (see bottom trace of FIG. 12), that, according to some embodiments, depends upon a channel matrix/characteristic and may be an estimate of an inverse of the channel matrix/characteristic and/or an estimate of a complex conjugate of the channel matrix/characteristic. The bottom trace of FIG. 12 illustrates that, prior to transmitting AC', AC' may be pre-multiplied by a matrix that, in some embodiments, may be an estimate of an inverse of the channel matrix. Further, the bottom trace of FIG. 12 illustrates that, provided that the estimate of the inverse of the channel matrix is accurate, a channel-induced distortion (or a channel-induced amplitude and/or phase perturbation) may be substantially negated by the pre-multiplied AC', allowing AC' to be received by a receiver, substantially devoid of channel-induced distortion/perturbation, as is illustrated by the bottom trace of FIG. 12. It will be understood that the matrix which is used to pre-multiply AC', as is discussed above and is illustrated by the bottom trace of FIG. 12, may be any matrix, including but not limited to an estimate of an inverse of the channel matrix (or a variant thereof) and an estimate of a complex conjugate of the channel matrix or a variant thereof.

Figure 13:
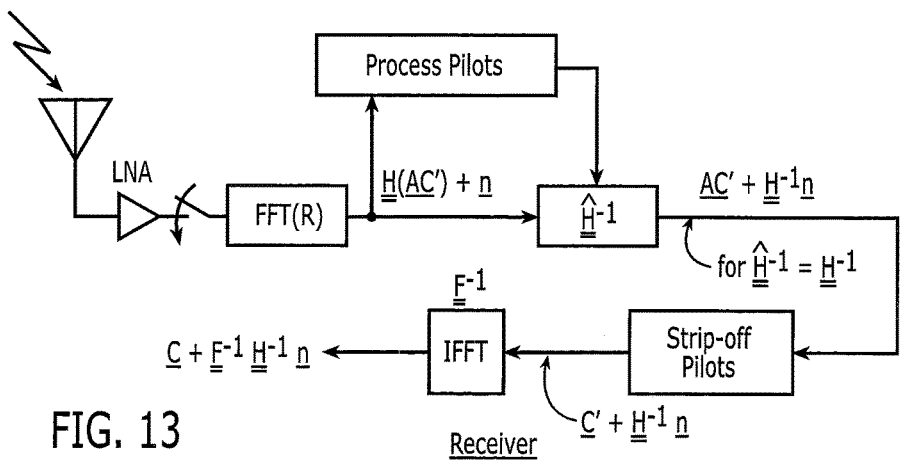
FIG. 13 illustrates functions of a receiver according to embodiments of the invention.

In further embodiments, AC' may be transmitted by a transmitter devoid of any pre-distortion and/or pre-multiplication by a matrix that is related to a channel matrix or to an estimate of the channel matrix. In such embodiments, a receiver may be relied upon to compensate for a channel-induced distortion, as is illustrated in FIG. 13. The receiver of FIG. 13 is configured to force the channel-induced distortion to zero by estimating and using an inverse of a channel matrix. However, as those skilled in the art know, other receiver processors, such as, for example, Least Mean Squared Error (LMSE) may be used instead of (or in combination with) the receiver of FIG. 13.

In some embodiments, the matrix that is used to pre-multiply AC' comprises at least one element that is determined pseudo-randomly in accordance with a statistical distribution, such as, for example, a statistical distribution that is Normal/Gaussian, Bernoulli, Geometric, Pascal/Negative Binomial, Exponential, Erlang, Weibull, Chi-Squared, F, Student's t, Rice, Pareto, Poisson, Binomial, Uniform, Gamma, Beta, Laplace, Cauchy, Rayleigh, Maxwell and/or any other statistical distribution. In some embodiments each one of the elements of the matrix that is used to pre-multiply AC' is determined pseudo-randomly in accordance with a statistical distribution. It will be understood that, in some embodiments, different elements of the matrix that is used to pre-multiply AC' may be determined pseudo-randomly by respective different statistical distributions; however, this may not be necessary in some embodiments. Accordingly, in some embodiments, all elements of said matrix that is used to pre-multiply AC' are determined based upon one statistical distribution. It will also be understood that a statistical distribution may be a truncated statistical distribution wherein a random variable that is associated with the statistical distribution is precluded from taking-on values over one or more ranges.

In further embodiments, the matrix that is used to pre-multiply AC' comprises a first matrix and a second matrix and, in some embodiments, the matrix that is used to pre-multiply AC' comprises a product of the first matrix and the second matrix wherein the first matrix is multiplied from the right (i.e., post-multiplied) by the second matrix. In some embodiments, the first matrix is related to the channel matrix (or an estimate of the channel matrix) and the second matrix is not related to the channel matrix (is independent of the channel matrix) and includes at least one element that is determined pseudo-randomly based upon a statistical distribution, as discussed above. Said second matrix that includes at least one element that is determined pseudo-randomly, may be used to scramble and/or further pre-distort/alter AC' prior to transmission thereof to thereby provide increased communications security, covertness and/or privacy. In some embodiments of the invention, the second matrix may be used to scramble/alter at least one (and in some embodiments all) of the data elements of AC' while leaving at least one (and in some embodiments all) of the pilot symbols of AC' unscrambled/unaltered. In further embodiments, all pilot symbols of AC' are also scrambled.

It will be understood that any element, row and/or column of said second matrix, may be generated pseudo-randomly (as mentioned above) using, for example, one or more of the teachings of application Ser. No. 12/620,057, entitled Waveforms Comprising a Plurality of Elements and Transmission Thereof, filed on 17 Nov. 2009 and assigned to the assignee of the present invention, the disclosure of which is hereby incorporated herein by reference in its entirety as if set forth fully herein. Further, the disclosures of all Applications that are cited in the "CLAIM FOR PRIORITY" section of application Ser. No. 12/620,057 are assigned to the assignee of the present invention and the disclosures of all of which are hereby incorporated herein by reference in their entirety as if set forth fully herein.

Specifically, the following is a reproduction of Page 35, lines 15-23 of PCT Application No. PCT/US2006/020417, filed May 25, 2006, which corresponds to PCT Publication No. WO 2007/001707, published Jan. 4, 2007: In embodiments of the invention where a bandwidth of a signal to be transmitted by a transmitter (such as the transmitter illustrated in FIG. 7) exceeds a bandwidth limit associated with an antenna and/or other element of the transmitter, the signal may be decomposed/segmented/divided into a plurality of components, each component of the plurality of components having a bandwidth that is smaller than the bandwidth of the signal. Accordingly, a transmitter may be configured with a corresponding plurality of antennas and/or a corresponding plurality of other elements to transmit the plurality of components. Analogous operations for reception may be included in a receiver.

It will be understood that an element of said second matrix may be real-valued, imaginary-valued or complex-valued. Further, it will be understood that, in some embodiments, a magnitude/amplitude remains substantially invariant in going from element-to-element of said second matrix, while a phase changes in going from element-to-element of said second matrix, and that, in such embodiments, it is a pseudo-random variation of said phase that changes from element-to-element of said second matrix, that is used to provide said scrambling. It will also be understood that in some embodiments wherein a transmitter is configured to use said second matrix (alone or in combination with said first matrix), to scramble and transmit one or more data vectors, a receiver may be configured so as to know said second matrix in order to descramble the one or more scrambled data vectors that it receives from said transmitter.

Still referring to the bottom trace of FIG. 12, a receiver may be configured to receive a time-domain version of a vector signal (e.g., AC'), comprising at least one data element and at least one pilot symbol, via an antenna (that may comprise a plurality of antenna elements), amplify the time-domain version of the vector signal via one or more Low Noise Amplifiers (LNAs), sample the amplified time-domain version of the vector signal via one or more samplers (thus generating a discrete-time signal $\{x_n\}$; wherein the subscript "n" denotes discrete time and is to be distinguished from the vector n which denotes noise) and perform a Fourier transform on $\{x_n\}$; wherein the Fourier transform that is performed on $\{x_n\}$ is denoted as FFT(R) in FIG. 12; "(R)" for Receiver; and wherein the FFT(R) may be a Fast Fourier Transform. An output of the FFT(R) may be used to provide a measure of the at least one pilot symbol which may be processed to derive an estimate of the channel matrix. The estimate of the channel matrix may then be used to equalize the at least one data element of the received vector signal. Subsequent to the equalization, the equalized vector signal, minus the at least one pilot symbol thereof, may be subjected to an inverse Fourier transform, which may be an Inverse Fast Fourier Transform, denoted as IFFT in FIG. 12, yielding an estimate of the data vector C of the top trace of FIG. 12.

It will be understood that the channel matrix that is estimated by the receiver and used for said equalization of the received vector signal may also be relayed by the receiver to the transmitter. It will also be understood that relaying an estimate of the channel matrix from the receiver to the transmitter may comprise relaying an "up" or "down" command/increment wherein the transmitter, based upon an initial estimate of the channel matrix, uses the up or down command/increment to update said initial estimate of the channel matrix. It will further be understood that the up or down command/increment may relate to a real component, an imaginary component, an in-phase component, a quadrature component, a magnitude/amplitude and/or a phase of an element of the channel matrix, and that, in some embodiments, a plurality of up or down commands/increments may be relayed from the receiver to the transmitter in order to accommodate a respective plurality of elements of the channel matrix.

It will be understood that the bottom trace of FIG. 12 illustrates an embodiment wherein an estimate of the channel matrix is known by the transmitter and is used by the transmitter to pre-distort AC', prior to transmission thereof, in order to compensate at least partially (i.e., to pre-compensate at least partially) a channel distortion, such as, for example, fading. However, a channel matrix represents a transmission characteristic between a transmitter and a receiver, as is illustrated by the bottom trace of FIG. 12, and in embodiments where a transmitter needs to serve a plurality of receivers, there is a corresponding plurality of channel matrices, each one of which is associated with a respective one of the receivers. Accordingly, in such embodiments, the transmitter may be configured to sequentially, in time, communicate with the plurality of receivers such that over a first time interval $0 < t \le \tau_1$ the transmitter is communicating only with a first receiver, over a second time interval $\tau_1 < t \le \tau_2$ the transmitter is communicating only with a second receiver, etc. Accordingly, over the first time interval the transmitter may use an estimate of a channel matrix that relates to a transmission characteristic and/or response between the transmitter and the first receiver, and over the second time interval the transmitter may use an estimate of a channel matrix that relates to a transmission characteristic and/or response between the transmitter and the second receiver.

Figure 14:
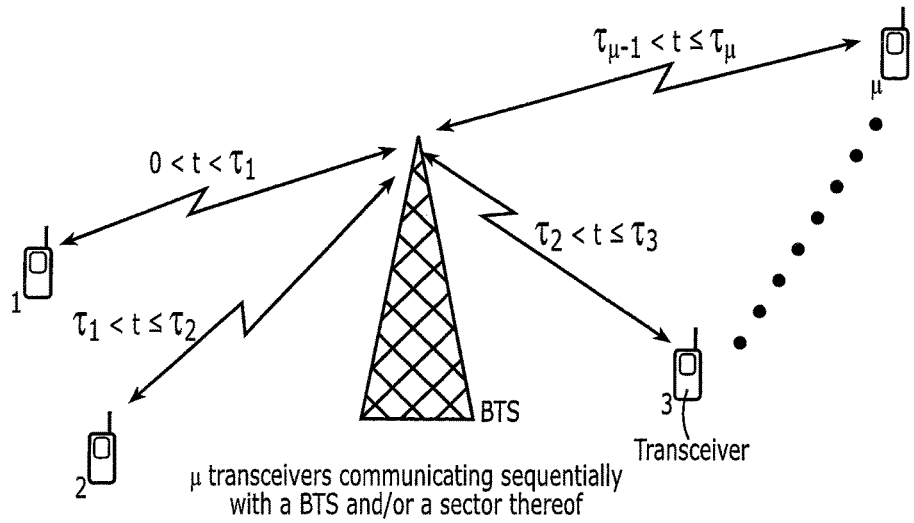
FIG. 14 illustrates functions of a transmitter that is communicating sequentially in time with a plurality of transceivers.

Accordingly, in some embodiments, a Base Transceiver Station (BTS) and/or a sector thereof, that may be of any physical structure and/or size, and may be fixed, transportable and/or mobile, may be configured to only transmit information (data, voice, signaling, pilot signals, etc.) to a first transceiver over a portion of a first time interval, to only receive information (data, voice, signaling, pilot signals, etc.) from the first transceiver over a portion of the first time interval, to only transmit information (data, voice, signaling, pilot signals, etc.) to a second transceiver over a portion of a second time interval and to only receive information (data, voice, signaling, pilot signals, etc.) from the second transceiver over a portion of the second time interval; wherein the first and second time intervals do not overlap therebetween. It will be appreciated that over at least a portion of an $i^{th}$ time interval ($\tau_{i-1} < t \le \tau_i$) the BTS and/or the $i^{th}$ transceiver may use an entire available frequency space/channel owing to all other transceivers associated with the BTS not using any time/frequency resources during the $i^{th}$ time interval. FIG. 14 illustrates systems/methods based on the above, wherein communications (including data, voice, signaling, pilot signals, etc.) between a BTS and/or a sector thereof and a plurality of transceivers (e.g., mobile terminals, transportable terminals, fixed terminals, terminals installed on vehicles, etc.) occur sequentially in time over a respective plurality of non-overlapping (e.g., mutually exclusive) time intervals.

Figure 15A:
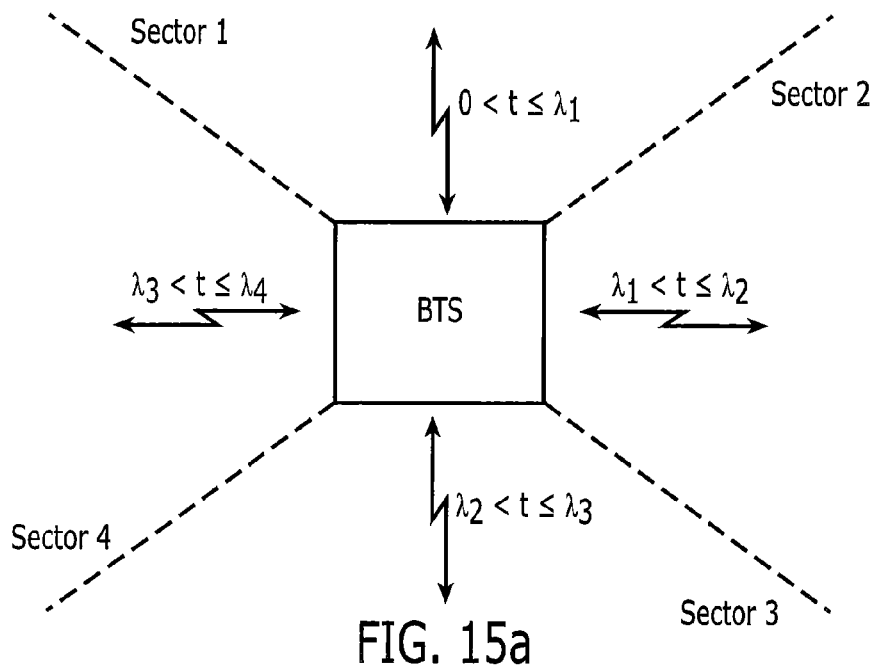
FIG. 15a illustrates functions of a base station according to embodiments of the invention.

According to further embodiments of the present invention, a BTS may be configured such that its sectors take turns in transmitting over mutually exclusive time intervals, as is illustrated in FIG. 15a. In some embodiments, at least two sectors of the BTS are configured to receive simultaneously in order to maximize signal energy at the BTS from a transmitting transceiver (e.g., mobile terminal). It will be understood that a BTS, such as that illustrated in FIG. 14 and/or FIG. 15a, may be configured to provide service based upon a Time Division Duplex (TDD) protocol and/or a Frequency Division Duplex (FDD) protocol (such as, for example, WiFi, WiMAX, UMB and/or LTE).

Figure 16:
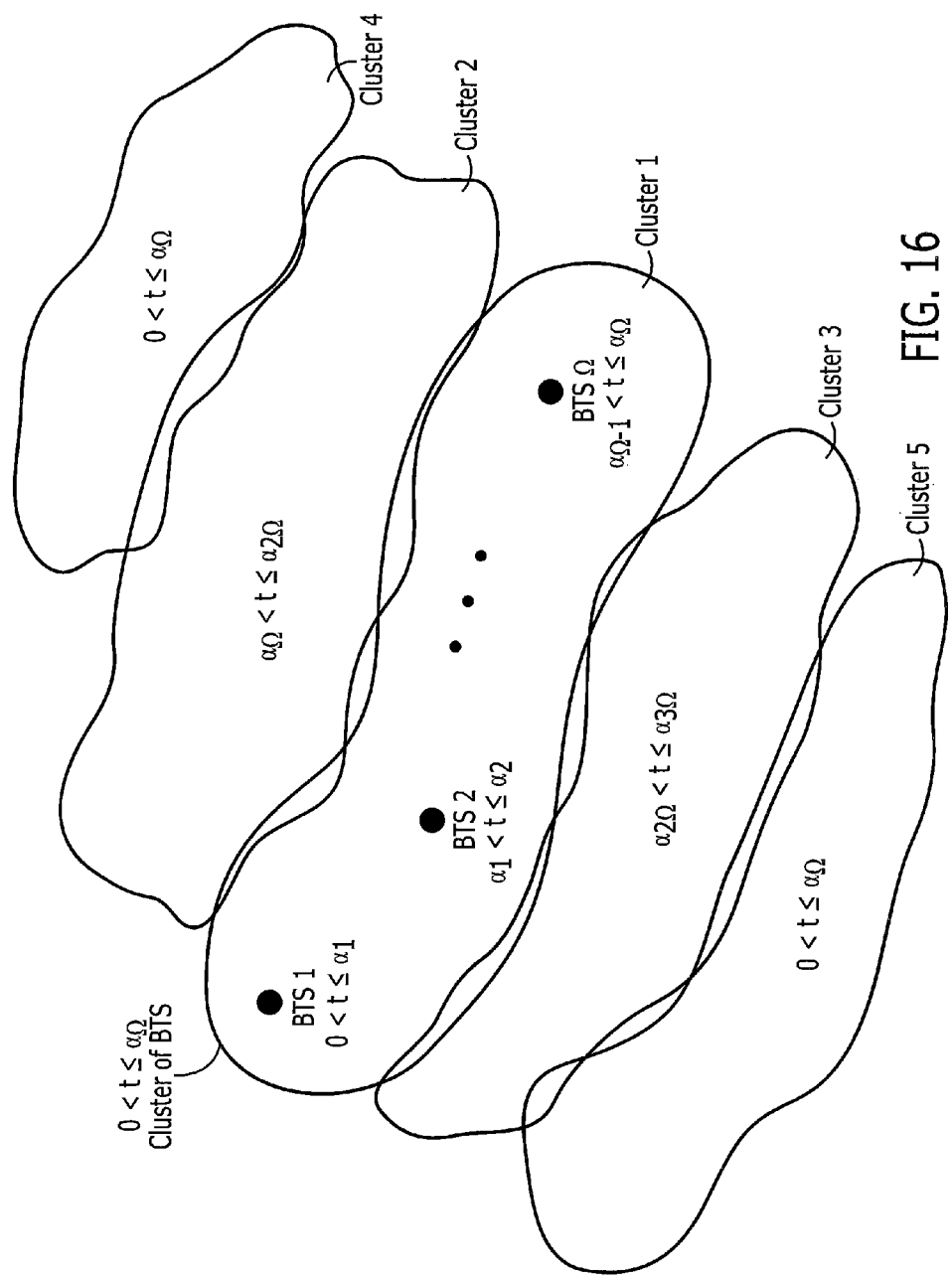
FIG. 16 illustrates functions of and/or coordination between clusters of proximate base stations according to embodiments of the invention.

In yet other embodiments of the invention, as illustrated in FIG. 16, a first cluster of BTS (Cluster 1), comprising a number of $\Omega \geq 1$ BTSs and at least one transceiver (a radioterminal) that is communicating therewith (not illustrated in FIG. 16), communicate over a first time interval ($0 < t \leq \alpha_\Omega$) while at least one other cluster of BTS (including at least one transceiver/radioterminal that is communicating therewith; e.g., Cluster 2 and/or Cluster 3; see FIG. 16) that is/are adjacent and/or proximate to the first cluster of BTS remains silent (i.e., remains devoid of transmissions) during the first time interval. Furthermore, as is illustrated in FIG. 16, Cluster 4 and/or Cluster 5, being geographically distant from Cluster 1, may be configured to provide communications (i.e., to radiate waveforms) concurrently with Cluster 1, using at least some of the spectrum that is also used by Cluster 1, while avoiding harmful interference with Cluster 1 owing to said being geographically distant relative to Cluster 1.

Still referring to FIG. 16, after Clusters 1, 4 and 5 have provided their respective communications over the time interval $0 < t \leq \alpha_\Omega$, Cluster 2 (and other Clusters associated therewith not shown) provide their respective communications over a time interval, such as, for example, $\alpha_{2\Omega} < t \leq \alpha_{2\Omega}$, as is illustrated in FIG. 16. Similarly, after Clusters 1, 4 and 5 have provided their respective communications over the time interval $0 < t \leq \alpha_\Omega$ and after Cluster 2 (and the other Clusters relating to Cluster 2 not shown) provide their respective communications over the time interval $\alpha_\Omega < t \leq \alpha_{2\Omega}$, Cluster 3 (and other Clusters associated therewith not shown) provide their respective communications over a time interval, such as, for example, $\alpha_{2\Omega} < t \leq \alpha_{3\Omega}$, as is illustrated in FIG. 16. It will be understood that a number of radioterminals per Cluster and a number of BTSs per Cluster may vary from Cluster-to-Cluster and that a time interval that is allocated to a Cluster for the provision of communications may vary from Cluster-to-Cluster. Further, it will be understood that FIG. 16 is only illustrative, that shapes of clusters other than those illustrated in FIG. 16 may be provided and that frequency re-use distances other than what is illustrated in FIG. 16 may be provided.

According to some embodiments, a time interval that is allocated to a Cluster and/or a particular BTS for the provision of communications may depend upon a number of wireless transceivers (i.e., wireless/mobile terminals) that are engaged in communications within the Cluster and/or the particular BTS. In some embodiments, as a time interval that is allocated to a first Cluster and/or BTS for the provision of communications increases, a time interval that is allocated to another Cluster that may be adjacent and/or proximate to the first Cluster decreases in order to maintain substantially invariant a periodicity associated with providing an opportunity for communications.

Figure 5B:
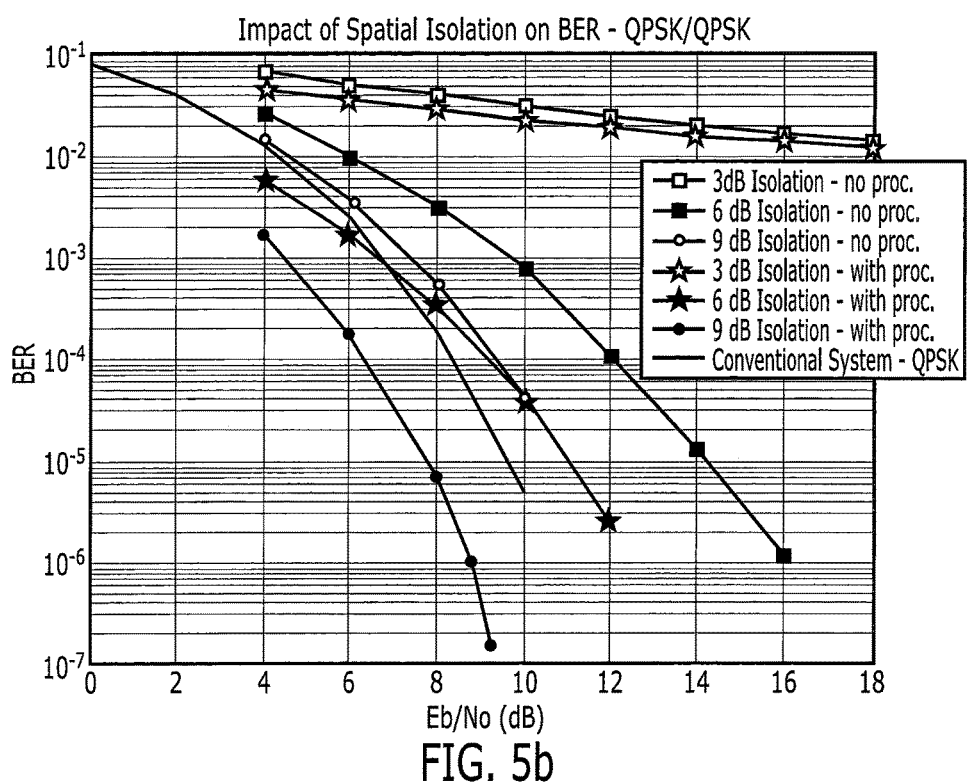
FIG. 5b provides BER curves that are associated with methods, systems and/or devices that are based upon FIG. 5a; Forward Link—BER for the black signal with antenna spatial isolation between the black and the red (N=256, QPSK/QPSK).
Figure 15B:
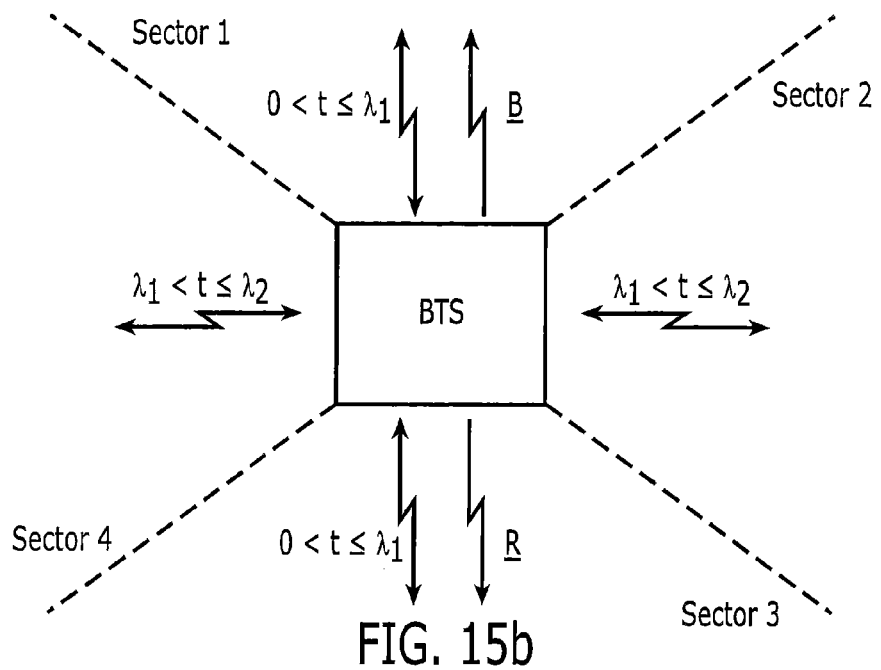
FIG. 15b illustrates functions of a base station according to further embodiments of the invention.

In further embodiments of the invention, a BTS may comprise an even number of sectors (e.g., four sectors), as is illustrated, for example, in FIG. 15a, and the data vector B may be transmitted/radiated over, for example, sector 1 while the data vector R is transmitter/radiated substantially concurrently with the data vector B over substantially an opposite sector, such as, for example, sector 3; wherein at least some of the remaining sectors (i.e., sectors 2 and 4) are kept silent/inactive; as is illustrated in FIG. 5b. Upon having transmitted/radiated B and R substantially concurrently, as described above, and having received at the BTS any responses/transmissions from respective transceivers (mobile terminals), sectors 1 and 3 may go silent/inactive (in terms of transmitting) while sectors 2 and 4 may become active (sectors 1 and 3 may remain active in terms of receiving). In these further embodiments of the invention, B and R may be statistically independent and/or uncorrelated therebetween (i.e., at least some data included in B may be independent/uncorrelated to at least some data included in R) and/or B and R may be congruent in a frequency space (e.g., data elements/sub-carriers of R may not be shifted in frequency relative to data elements/sub-carriers of B). Accordingly, frequency reuse may take place between, for example, sector 1 and sector 3 (e.g., between substantially opposite sectors of a BTS), as is illustrated in FIG. 15b. A sequence of transmissions activity between different BTSs may remain as described earlier or may be modified so that sectors radiating in substantially non-interfering directions are allowed transmissions activity concurrently with sectors 1 and 3 (or sectors 2 and 4) of the BTS of FIG. 15b. Accordingly, significant spatial isolation may advantageously be relied upon to conduct receiver processing as described earlier in reference to FIG. 4a and/or FIG. 5a. It will be understood that, in some embodiments, BTS sectors that are specified as "silent/inactive" are silent/inactive only in that they refrain from transmitting. Such sectors may remain active in terms of receiving.

In yet further embodiments, a transceiver (e.g., a mobile terminal) that is communicating with a BTS may be configured to radiate information based upon a single carrier (as opposed to using a plurality of carriers/sub-carriers as in OFDM) in order to limit a peak-to-average power ratio of a waveform that is being amplified by an amplifier prior to transmission thereof. However, using a single carrier, instead of a plurality of carriers/sub-carriers, may require an equalizer at the BTS receiver if the single carrier is sufficiently broadband. Alternatively, an equalizer at the BTS receiver may not be necessary if the single carrier is sufficiently narrowband. However, limiting the single carrier to a sufficiently narrow bandwidth also limits a data throughput from the transceiver to the BTS. Accordingly, in some embodiments, the transceiver is configured to include a plurality of amplifiers, thus allowing a respective plurality of carriers/sub-carriers to be formed by the transceiver and be distributed over the plurality of amplifiers such that any one of the plurality of amplifiers amplifies a number of carriers/sub-carriers that is less than the plurality of carriers/sub-carriers. In some embodiments, each one of the amplifiers of the plurality of amplifiers is amplifying a single carrier/sub-carrier.

A respective plurality of outputs of the plurality of amplifiers may be combined therebetween and used to excite an antenna of the transceiver, a subset of the respective plurality of outputs may be combined therebetween and used to excite an antenna of the transceiver and/or a single output of the respective plurality of outputs may be used by itself to excite an antenna of the transceiver. In some embodiments, the transceiver is configured with a respective plurality of antennas wherein each antenna of the respective plurality of antennas is excited by a single output of the respective plurality of outputs of the plurality of amplifiers. In further embodiments, the plurality of amplifiers may be arranged in accordance with a Butler matrix architecture. It will be understood that the transceiver may be a mobile terminal, a BTS or any other device that may be mobile, transportable, fixed, localized, distributed in space, installed in/on a vehicle, etc. It will also be understood that at least two antennas of the respective plurality of antennas may be spaced apart therebetween or may be substantially co-located therebetween.

Figure 17:
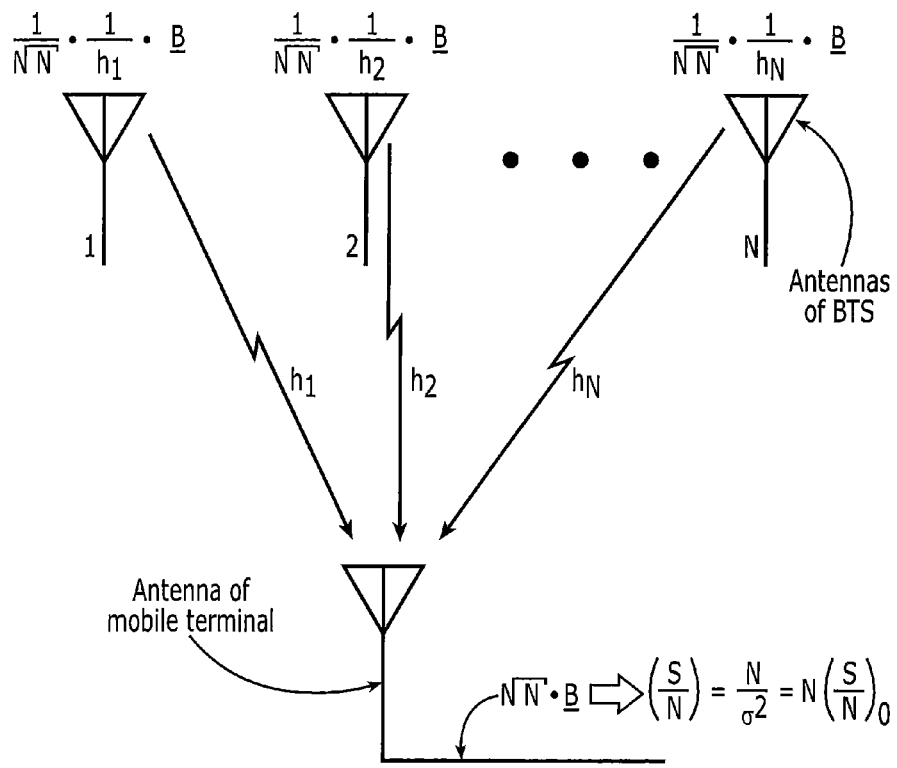
FIG. 17 illustrates a plurality of antennas transmitting a respective plurality of signals (a respective plurality of replicas of a signal vector B) appropriately compensated for a respective plurality of channel characteristics, in order to provide substantial voltage addition at an antenna element of a receiver.

In yet further embodiments of the invention, N antennas are provided (N≥2), each being excited by, and/or radiating, one $N^{th}$ of a total signal power (that may, otherwise, have been radiated by a single antenna, or that may otherwise have been used to excite the single antenna). In addition to the above, in some embodiments of the invention, a signal that is used to excite an $i^{th}$ antenna (or a signal that is being radiated by the $i^{th}$ antenna; i=1, 2, . . . , N) is multiplied by an inverse of a channel response, $1/h_i$ (or by any other function of the channel response) that relates to a propagation characteristic between the $i^{th}$ antenna and an antenna of a transceiver/terminal, that may be a mobile terminal, that is receiving, as is illustrated in FIG. 17. It will be understood that if the channel response and/or propagation characteristic is frequency selective over a bandwidth of B, then the channel response and/or propagation characteristic may be represented by a matrix (which may include complex elements and may be a diagonal matrix) instead of a scalar (which may be a complex scalar), as those skilled in the art will appreciate. Subject to the above, it may be appreciated that a signal-to-noise ratio (and/or a signal-to-interference ratio) at the mobile terminal increases by a factor of N relative to having used a single antenna at the BTS to transmit to the mobile terminal. As those skilled in the art will appreciate, this is a result of N desired signal replicas arriving at the mobile terminal coherently and adding in-phase, on a voltage basis, while the noise/interference variance at the mobile terminal remains invariant, at $\sigma^2$. It will be understood that although the BTS antennas of FIG. 17 are illustrated as transmitting, one or more of these antennas may also be configured to receive and, in some embodiments, at least two of these antennas may be substantially collocated. Further, it will be understood that although a single mobile terminal antenna is illustrated in FIG. 17, two or more mobile terminal antennas may be provided, in some embodiments, and that the two or more mobile terminal antennas may be substantially collocated. Additionally, it will be understood that although FIG. 17 illustrates a specific power distribution across the N antennas, any other power distribution across the N antennas may be provided in other embodiments. Also, in calculating (S/N), FIG. 17 assumes that |B|=1, but this need not be the case in general (wherein |•| denotes magnitude of "•").

The embodiment illustrated in FIG. 17 suggests that the BTS serves each one of a plurality of mobile terminals sequentially, over non-overlapping time intervals (as discussed earlier), since different channel responses would generally apply between the BTS and different mobile terminals. Accordingly, FIG. 17 suggests a broadband embodiment wherein a significant amount of spectrum is available (e.g., an amount of spectrum that is greater than, or equal to, 50 MHz and, in some embodiments, an amount of spectrum that is greater than, or equal to, 100 MHz) in order to sequentially serve different mobiles within a BTS sector, different sectors of the same BTS, different BTSs (up to 3 or 4, or more) of a BTS cluster and/or different BTS clusters, as described earlier in reference to FIGS. 14-16, while maintaining a throughput relative to any mobile at, or above, a desired threshold, and maintaining interference at, or below, a desired limit. It will be understood that in some embodiments, first and second groups of mobiles, first and second groups of sectors of a BTS, first and second BTSs of a BTS cluster and/or first and second BTS clusters may be served via respective different first and second sets of frequencies which may be non-overlapping and mutually exclusive therebetween. In such embodiments, the first and second groups of mobiles, the first and second groups of sectors of a BTS, the first and second BTSs of a BTS cluster and/or the first and second BTS clusters that communicate via the respective different first and second sets of frequencies may communicate concurrently without incurring harmful interference. In some embodiments, the respective different first and second sets of frequencies are provided, at least partially, by respective different first and second entities; wherein the first entity and/or the second entity is a wireless service provider, commercial entity, not for profit entity and/or government entity; so as to share the BTS and/or other wireless network infrastructure.

It will be understood that any of the embodiments described herein (or any element/portion of any embodiment described herein) may be combined with any other embodiment described herein (or element/portion thereof) to provide yet another embodiment. This is stated for clarity of scope of the invention since the number of different embodiments that are provided by the present invention are too numerous to list and describe individually and in whole. For example, elements of the embodiment of FIG. 17 may be combined with elements of the embodiment of FIG. 15b to provide yet another embodiment wherein first and second sectors of a BTS each comprises a plurality of radiating antenna elements and wherein the first sector is configured to radiate waveforms in a first direction based upon B over a time interval and wherein the second sector is configured to radiate waveforms in a second direction, that is substantially opposite to the first direction, based upon R over substantially the same time interval.

We observe that in the future, many devices will be wirelessly connected therebetween and will be configured to communicate therebetween frequently and quite transparently (i.e., without active/explicit human intervention). We also observe that as knowledge increases and as more and more applications for the knowledge are identified (presumably and hopefully for the benefit of humanity) a level of communications between devices will increase. Accordingly, any embodiment of any invention that may be used to increase wireless communications capacity may prove of significant value. For example, it is envisaged that in the future a person (in cooperation with his/her doctor) may have an option to be fitted with a sensing/dispensing device that may be configured to sense/detect/estimate a state of a biological function/parameter of the person, such as, for example, a heart function/rate, a blood state/pressure, a blood sugar level, a blood oxygen level, a mental state, etc. and the sensing/dispensing device may also be configured to communicate wirelessly with at least one predetermined second device. In some embodiments, the sensing/dispensing device may be configured to communicate wirelessly with a predetermined device of the person such as, for example, a wireless communications device of the person (e.g., a mobile phone of the person) and/or with any other device of the person and/or of another person who may be associated with the person (e.g., a person's spouse, parent, guardian, employer, medical provider/doctor/nurse, etc.).

The sensing/dispensing device may be configured to communicate with the at least one predetermined second device over a wireless link, that may be a short-range wireless link, such as, for example, a Bluetooth link, wherein the wireless link may be a bi-directional wireless link, and to relay data to the at least one predetermined second device. The at least one predetermined second device, that may be a wireless communications device of the person (e.g., a mobile phone of the person), may be configured to communicate information to a medical facility/CPU/doctor in response to having received from the sensing/dispensing device data indicating an "out-of-limits" and/or "marginal" reading associated with the person. Accordingly, the medical facility/CPU/doctor may be informed, in substantially real time, of a state of health of the person and an appropriate response may then be relayed back to the person via, for example, the wireless communications device of the person and to the sensing/dispensing device of the person via the wireless link between the wireless communications device of the person and the sensing/dispensing device. Accordingly, the sensing/dispensing device may be configured to dispense a substance to the person in order to remedy the out-of-limits and/or marginal reading. Thus, substantially real-time closed-loop feedback control, using wireless communications, may be provided to regulate a medical state/condition of the person. According to some applications, the regulation of the medical state/condition of the person may be automatic and substantially transparent to the person (i.e., without any cognizant intervention on the part of the person). In other applications, an intervention/action by the person, such as an authorization/approval by the person, may be required prior to dispensing of the substance by the sensing and/or dispensing device.

In further applications, each one of a plurality of home/office devices (such as, for example, a vehicle, a garage door opener, an electrical system, a power meter, a refrigerator, an air conditioner, a heating system, a television/entertainment unit, an alarm system, etc.) may be wirelessly connected, via a respective plurality of wireless links, that may be short-range wireless links, to a transceiver unit that may be installed within the home/office. The transceiver unit may be configured to communicate wirelessly with at least one other transceiver unit that may be associated with another home/office and may also be configured to communicate wirelessly, via a terrestrial base station and/or via a satellite, with one or more service provider facilities. Accordingly, the transceiver unit may receive information, such as state/diagnostic information, from each one of the plurality of home/office devices and, responsive to an undesirable state/diagnostic, the transceiver unit may inform the other transceiver unit and/or at least one relevant service provider facility of the undesirable state/diagnostic. Accordingly, an appropriate response may be provided by the at least one relevant service provider and/or by the other transceiver unit in order to correct the undesirable state/diagnostic. In some embodiments, the transceiver unit may also be configured to communicate with a device, such as a mobile device, of an occupant and/or owner of the home/office responsive to the undesirable state/diagnostic. It will be understood that the transceiver unit may, in some embodiments, be integrated within a computer and/or connected to the computer and that the transceiver unit may be configured to communicate with the at least one other transceiver unit and/or the one or more service provider facilities via the computer using at least one wireline link (cable, DSL, ADSL, fiber optical, etc.) and/or at least one wireless link (terrestrial, satellite, etc.).

In yet additional applications, a mobile device (such as a mobile phone/terminal) may be configured to conduct communications autonomously and without an intervention (i.e., cognizant intervention) by a user of the mobile device. The communications that may be conducted by the mobile device autonomously and without the intervention may be in response to a predetermined Time-of-Day (ToD), Time-of-Month (TOM), Time-of-Year (ToY), Time of Decade (ToD) and/or Time-of-Century (ToC). Further, the communications that may be conducted by the mobile device autonomously and without the intervention may be in response to a predetermined distance of the mobile device relative to a predetermined location/entity (stationary or not), a sensing of the mobile device of a predetermined signal and/or a characteristic thereof, a health state of the user of the mobile device, a noise/sound level in the vicinity of the mobile device, an acceleration of the mobile device, a municipal/city/state/national emergency and/or a time lapse relative to a predetermined point in time. It will be understood that the communications that may be conducted by the mobile device autonomously and without the intervention may be first communications responsive to a first one of a predetermined Time-of-Day (ToD), Time-of-Month (ToM), Time-of-Year (ToY), Time of Decade (ToD), Time-of-Century (ToC), a predetermined distance of the mobile device relative to a predetermined location/entity (stationary or not), a sensing of the mobile device of a predetermined signal and/or a characteristic thereof, a health state of the user of the mobile device, a noise/sound level in the vicinity of the mobile device, an acceleration of the mobile device, a municipal/city/state/national emergency and a time lapse relative to a predetermined point in time; and a second communications responsive to a second one of a predetermined Time-of-Day (ToD), Time-of-Month (ToM), Time-of-Year (ToY), Time of Decade (ToD), Time-of-Century (ToC), a predetermined distance of the mobile device relative to a predetermined location/entity (stationary or not), a sensing of the mobile device of a predetermined signal and/or a characteristic thereof, a health state of the user of the mobile device, a noise/sound level in the vicinity of the mobile device, an acceleration of the mobile device, a municipal/city/state/national emergency and a time lapse relative to a predetermined point in time; wherein the first communications may differ from the second communications. In some applications, the mobile device may be configured to conduct the communications autonomously and without the intervention even though the mobile device has been placed in an off/inactive mode (e.g., has been turned off) and/or even though a battery of the mobile device has been removed from the mobile device (e.g., the mobile device may include a reserve of power that is separate from the battery of the mobile device). In further embodiments, the mobile device may be configured to detect a proximity state between itself and a television/computer and, responsive to the detected proximity state to wirelessly transfer data (e.g., at least one content thereof) to the television/computer (and, in some embodiments, vice versa). The television/computer may be a predetermined television/computer and the proximity state may be detected by estimating a distance between the mobile device and said television/computer and/or by sensing a signal and/or a characteristic thereof.

Accordingly, it may be appreciated that at least some of the above applications, as well as other numerous applications that may occur to those skilled in the art, may be practiced in the future, requiring additional capacity from wireless networks.

Figure 18A:
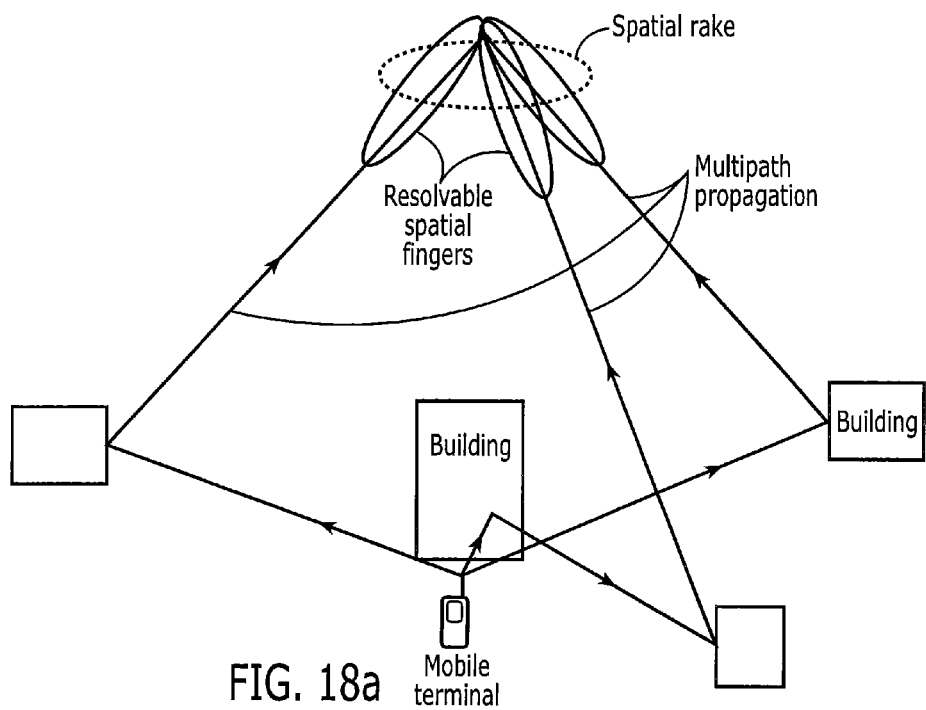
FIG. 18a illustrates a function of a spatial rake receiver and/or a spatial matched filter receiver according to embodiments of the invention.
Figure 18B:
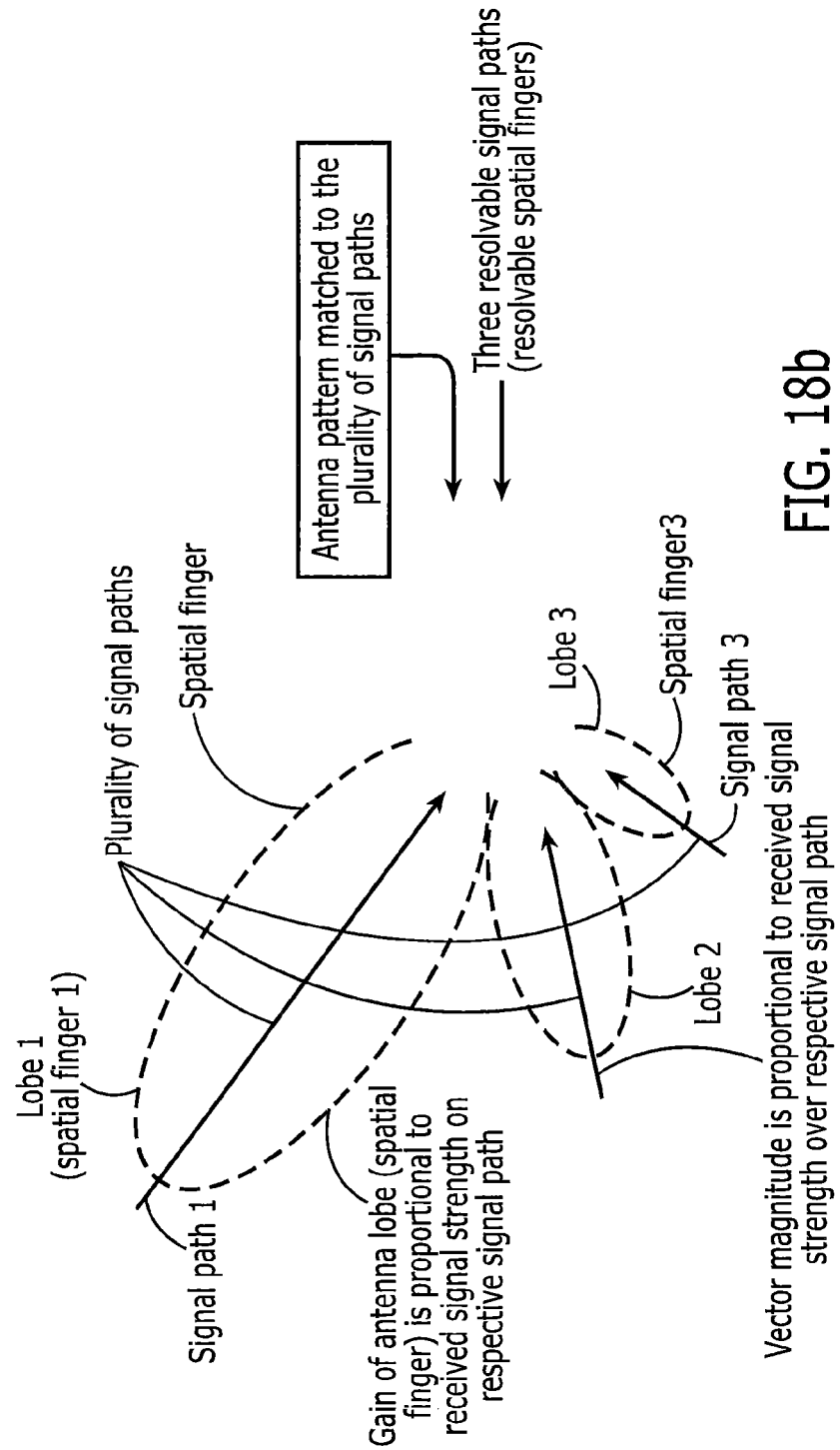
FIG. 18b illustrates further functions/characteristics of a spatial rake receiver and/or a spatial matched filter receiver according to embodiments of the invention.

In further embodiments of the present invention, a system/method is provided (that may be a system/method associated with a receiver and/or a transmitter) that includes a spatial rake. A system/method comprising a spatial rake may improve a signal-to-noise ratio and/or a signal-to-interference ratio and, according to some embodiments, may allow reuse of available radio resources even within a sector of a base station and/or over adjacent sectors of the base station (i.e., co-sector and/or adjacent sector co-channel operation). The well-known rake receiver that is practiced in Code Division Multiplexed (CDM) and/or Code Division Multiple Access (CDMA) wireless communications systems/methods may be viewed as a receiver that rakes-in (i.e., gathers/accumulates) a plurality of replicas of a CDM/CDMA signal; wherein the plurality of replicas are dispersed in time and are resolvable in time. Analogously, a spatial rake may be provided that rakes-in a plurality of replicas of a signal that are dispersed in space and are resolvable in space. As may be appreciated by those skilled in the art, multipath propagation provides a plurality of signal paths, from a transmitter to a receiver, with each path of the plurality of paths characterized by a magnitude (i.e., signal strength) and an angle of arrival; see FIG. 18a. Accordingly, a receiver, comprising a plurality of antenna elements, may be configured to form an antenna pattern, using the plurality of antenna elements, that is optimally (or near optimally) matched to the plurality of signal paths in terms of amplitude (signal strength/gain) and angle of arrival. FIG. 18b illustrates a plurality of signal paths (as in FIG. 18a), comprising three signal paths, and an associated antenna pattern that is matched to the plurality of signal paths. Accordingly, a signal-to-noise ratio and/or a signal-to-interference ratio may be improved, improving a communications performance index such as, for example, a link capacity, a Bit Error Rate (BER), a Quality of Service (QoS), etc.

Figure 19A:
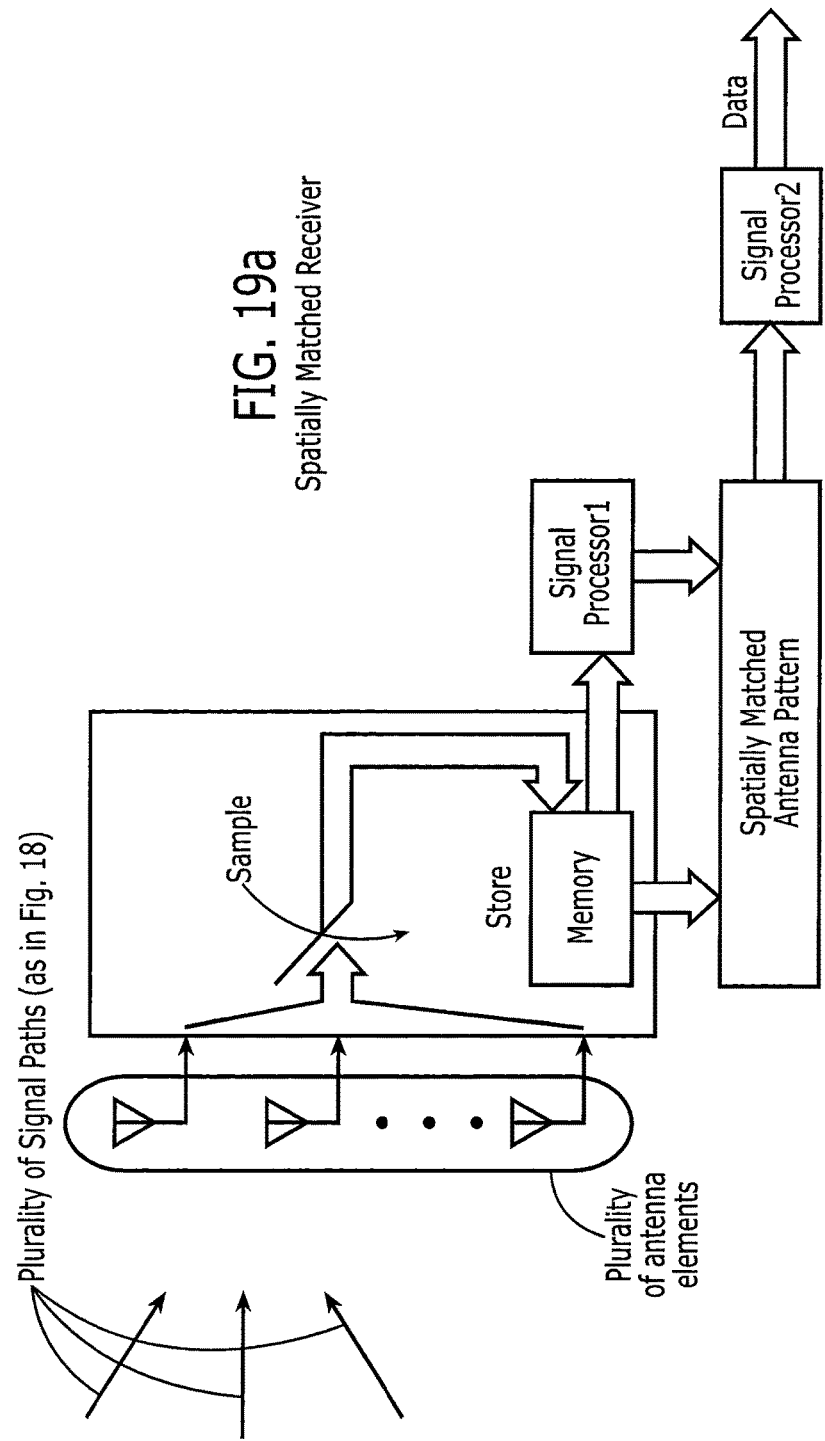
FIG. 19a illustrates functions of a receiver that is configured to form a spatial rake and/or a spatial matched filter according to embodiments of the invention.

A receiver, as illustrated in FIG. 19a, may include the plurality of antenna elements and a first processor, labeled as signal processor 1 in FIG. 19a, that processes a respective plurality of signals, provided to the signal processor 1 by the plurality of antenna elements, to form a plurality of antenna patterns (sequentially in time and/or in parallel in time; depending on a speed of operation of the processor). Each one of the plurality of antenna patterns, also referred to herein as lobes, pencil beams and/or spatial fingers (or simply fingers), may be associated with a respective angle of arrival and may be used by the processor to provide a respective signal strength measure. The respective signal strength measure may be determined by processing one or more pilot signals via a respective antenna pattern (i.e., lobe/finger/pencil beam) of the plurality of antenna patterns. Accordingly, the plurality of antenna patterns that may be formed by the processor, providing a respective plurality of signal strength measures corresponding to a respective plurality of angles of arrival spanning a predetermined interval of space, may be used by the processor to determine/estimate an antenna pattern that is spatially matched (or nearly/approximately spatially matched) to the plurality of signal paths (as illustrated in FIG. 18a and/or in FIG. 18b) arriving at the receiver.

Figure 19B:
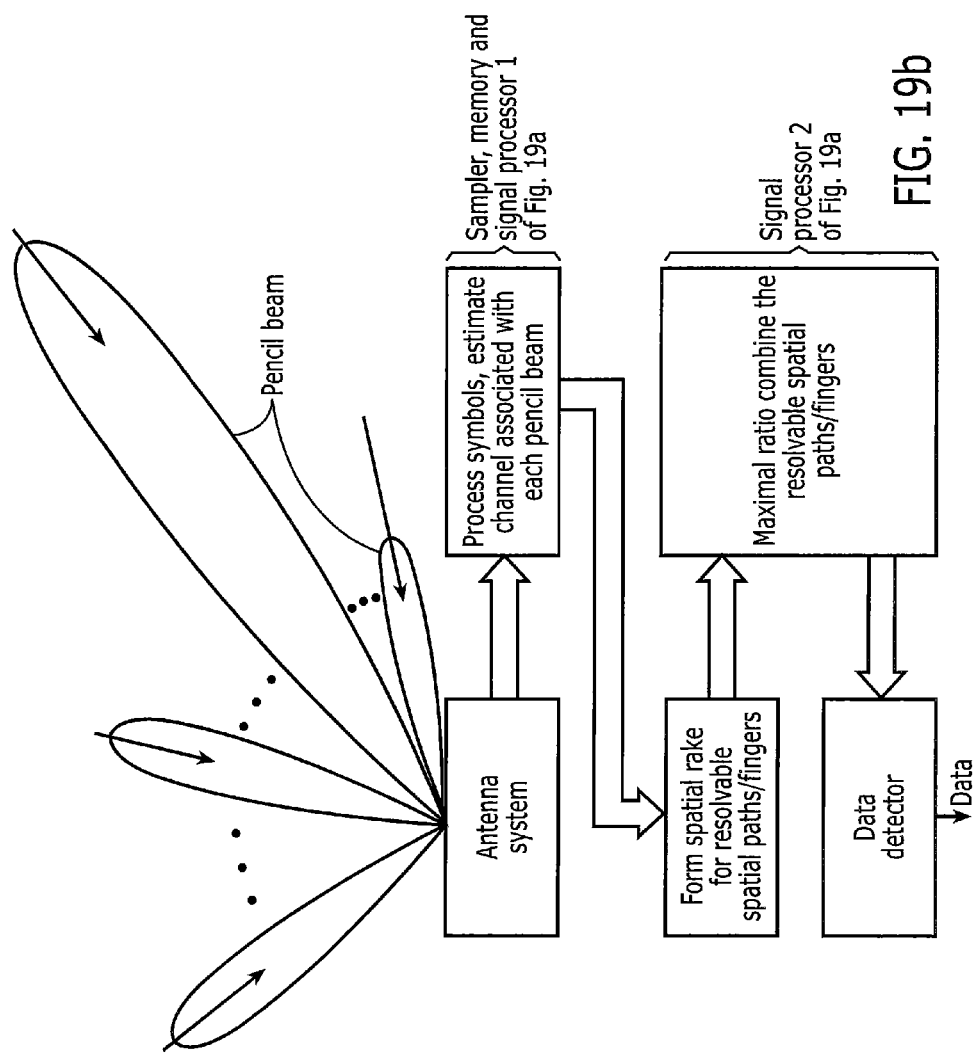
FIG. 19b illustrates further functions of a receiver that is configured to form a spatial rake and/or a spatial matched filter according to embodiments of the invention.

According to some embodiments, as illustrated in FIG. 19a, a receiver may be configured to form a set of signal samples by sampling an output of each one of the plurality of antenna elements, to store the set of signal samples in memory, to provide at least a subset of the set of signal samples to the signal processor 1 (e.g., samples that may be associated with the one or more pilot symbols) so that the signal processor 1 may form the plurality of antenna patterns (lobes/fingers/pencil beams), as discussed above, and determine therefrom the respective plurality of signal strength measures; and, after the processor has estimated an antenna pattern that is spatially matched (or nearly spatially matched) to the plurality of signal paths, responsive to the processor having formed the plurality of antenna patterns, to use the spatially matched (or nearly spatially matched) antenna pattern to process the set of signal samples (or a subset thereof comprising data samples and/or pilot samples) and to provide an output of the spatially matched antenna pattern to a second processor, labeled as signal processor 2 in FIG. 19a, in order to detect data. FIG. 19b provides illustrative additional detail of the receiver that is illustrated in FIG. 19a, for some embodiments.

In further embodiments of the invention, the receiver that has been described above, as illustrated in FIG. 19a and/or in FIG. 19b, may further be configured to detect/estimate a correlation between first and second signals (that may be first and second pilot signals), that are received at respective first and second antenna elements of the plurality of antenna elements. Responsive to the detected/estimated correlation between the first and second signals (and in some embodiments responsive to a detected/estimated correlation between the first and second signals and between at least two more signals) the receiver may be configured to preferentially use signal outputs of at least some of the plurality of antenna elements to perform signal processing that is different than the spatial matched filtering discussed above and illustrated in FIG. 19a and/or in FIG. 19b. Accordingly, in some embodiments, the receiver may be equipped with a plurality of different signal processing algorithms and the receiver may be equipped/configured with adaptivity/agility so as to preferentially use one algorithm of the plurality of algorithms vs. another algorithm of the plurality of algorithms responsive to a value of said detected/estimated correlation (or any other signal property) between the first and second signals (and in some embodiments responsive to a detected/estimated correlation and/or other signal property between the first and second signals and between at least two more signals).

In some embodiments, the receiver may be configured to process a first set of signals, associated with a respective first set of antenna elements, via a first signal processing algorithm and to process a second set of signals, associated with a respective second set of antenna elements, via a second signal processing algorithm. It will be understood that the first signal processing algorithm may differ from, or be the same as, the second signal processing algorithm and that at least one (and, in some embodiments, each one) of the first and second sets of antenna elements may be a subset of the plurality of antenna elements. It will also be understood that the first and second sets of antenna elements may be intersecting or non-intersecting therebetween. In some embodiments, the first signal processing algorithm comprises spatial matched filtering and the second signal processing algorithm also comprises spatial matched filtering.

Accordingly, in some embodiments of the invention, if said correlation and/or other signal property is greater than or equal to a predetermined threshold, the receiver is configured to utilize signal outputs of at least some of the plurality of antenna elements in accordance with a first signal processing algorithm and if said correlation and/or other signal property is less than the predetermined threshold, the receiver is configured to utilize signal outputs of at least some of the plurality of antenna elements in accordance with a second signal processing algorithm that is different than the first signal processing algorithm. In yet further embodiments, the receiver may be configured to utilize signal outputs of at least some of the plurality of antenna elements in accordance with a third (hybrid) algorithm that comprises at least one aspect/element of the first algorithm and at least one aspect/element of the second algorithm. The third (hybrid) algorithm may be used over a transition interval wherein said correlation and/or other signal property is greater than a lower threshold but less than an upper threshold.

Accordingly, in such embodiments, if said correlation and/or other signal property is greater than or equal to the upper threshold, the receiver is configured to utilize signal outputs of at least some of the plurality of antenna elements in accordance with the first signal processing algorithm, if said correlation and/or other signal property is less than or equal to the lower threshold, the receiver is configured to utilize signal outputs of at least some of the plurality of antenna elements in accordance with the second signal processing algorithm and if said correlation and/or other signal property is between the lower and upper thresholds, the receiver is configured to utilize signal outputs of at least some of the plurality of antenna elements in accordance with the third (hybrid) signal processing algorithm. In some embodiments, the first algorithm may comprise spatial matched filtering, as is, for example, described above and illustrated in FIG. 19a and/or in FIG. 19b, and wherein the second algorithm may be devoid of spatial matched filtering and comprise, for example, a Multiple Input Multiple Output (MIMO) algorithm, equalization/rake and/or diversity combining of signal outputs of at least some of the plurality of antenna elements. It will be understood that the term "equalization" as used herein may comprise one or more transversal filters (synchronously and/or fractionally spaced with or without decision feedback) and the term "diversity combining" may comprise maximal ratio combining or any other type of combining (linear and/or non-linear) of signal outputs of at least some of the plurality of antenna elements, in some embodiments. In further embodiments, the second algorithm may also comprise spatial matched filtering.

In additional embodiments, instead of the above, or in combination with any aspect(s) of the above, the receiver may be equipped with a plurality of different signal processing algorithms and the receiver may be configured to provide communications to a first terminal by preferentially using one algorithm (i.e., a first algorithm) of the plurality of algorithms while avoiding/refraining from using any other algorithm of the plurality of algorithms, to provide communications to the first terminal, responsive to a location of the first terminal and/or responsive to a location of a second terminal which, according to some embodiments, the receiver may be serving (currently and/or in the future) using radio resources that are co-channel with radio resources that the receiver is using (or is about to use) to serve the first terminal. In yet other embodiments of the invention, instead of the above, or in combination with any aspect(s) of the above, the receiver may be equipped with a plurality of different signal processing algorithms and the receiver may be configured to provide communications to a terminal by preferentially using one particular/specific algorithm of the plurality of algorithms while refraining from using any other algorithm of the plurality of algorithms, to provide communications to the terminal, responsive to one or more channel characteristics that exist between the terminal and one or more of the receiver's antenna elements. In further embodiments, however, all algorithms of the plurality of different signal processing algorithms may be allowed/enabled/activated to function substantially concurrently and/or independently therebetween providing a respective plurality of outputs. A first output of the plurality of outputs may be given preferential weight over at least one other output of the plurality of outputs and the first output of the plurality of outputs may, accordingly, be used for recovering data, based upon (e.g., responsive to), for example, a signal-to-interference/noise ratio, a bit error-rate and/or any other measure thereof.

It will be understood that even thought in FIG. 19b, and/or in any of the other Figures relating to the present invention, an arrow may be illustrated as providing a unidirectional (i.e., one directional) connection/path, such an arrow may, according to some embodiments, be a bi-directional arrow providing a bi-directional connection/path (or a connection/path in a direction opposite to that illustrated). For example, a system/method/device that may be illustrated in one or more Figures of the present specification may relate to a receiver and may also relate to a transmitter (i.e., may relate to a transceiver), as those skilled in the art will appreciate. Accordingly, for the receiver part, for example, one or more arrows may be illustrated as providing one or more respective paths/connections from an antenna of the receiver to one or more other element(s) of the receiver. For the transmitter part, however, in some embodiments, the one or more paths/connections may have to be reversed in a direction thereof. As may be appreciated by those skilled in the art, in some embodiments, information attained by the receiver may have to be "turned-around" and used by at least one element of the transmitter.

Figure 20:
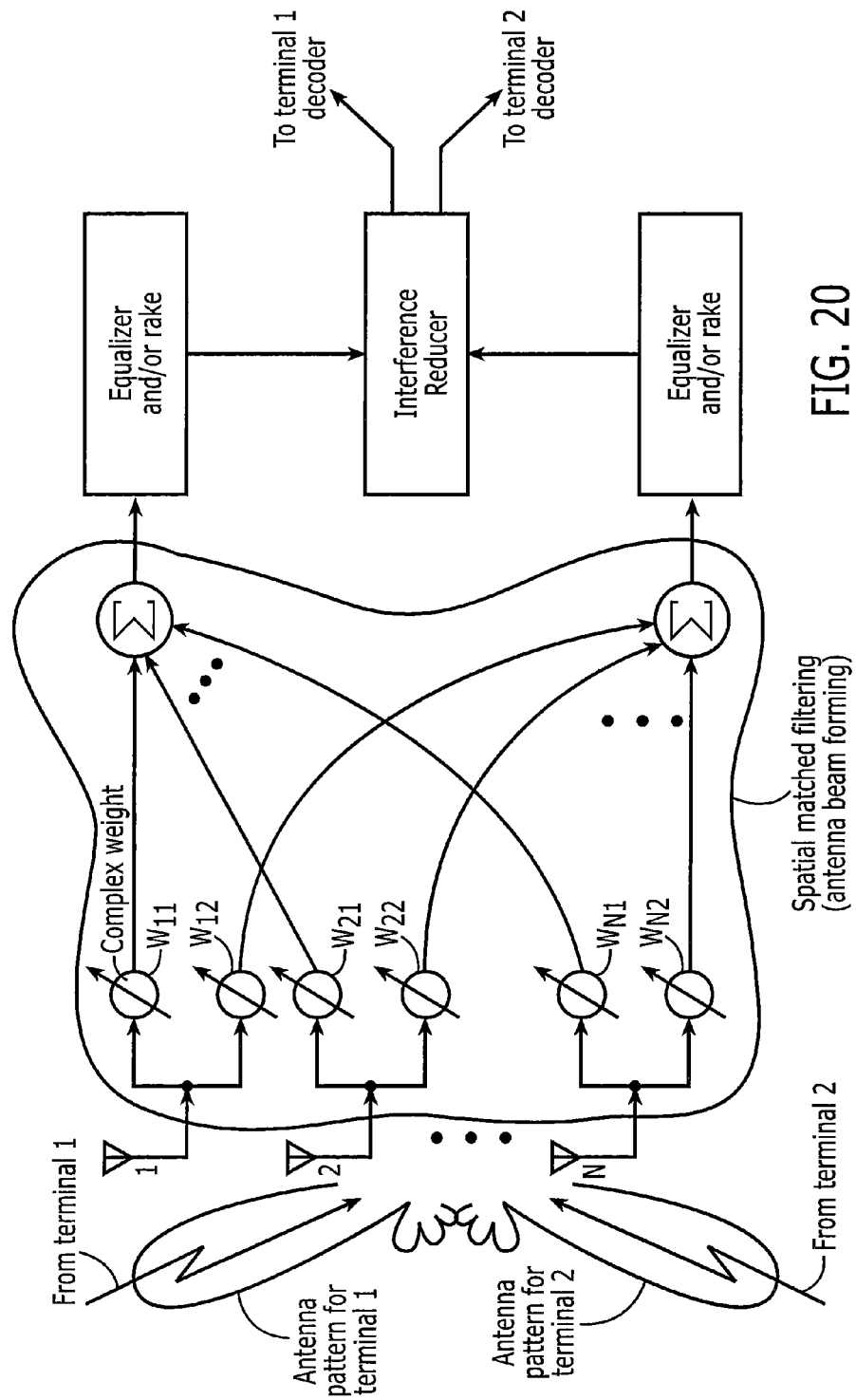
FIG. 20 illustrates yet additional functions of a receiver that is configured to form a spatial rake and/or a spatial matched filter and may further be configured to provide equalization, rake receiver processing in a time domain and/or interference reduction, in a co-channel communications environment (including intra-system co-channel interference and/or inter-system co-channel interference) according to embodiments of the invention; Receiver providing co-channel communications to two terminals concurrently using spatial matched filtering (antenna beam forming), equalizer/rake and/or an interference reducer.

FIG. 20 illustrates a receiver that is providing communications, concurrently and co-channel, to two terminals (not shown), referred to in FIG. 20 as terminal 1 and terminal 2. The receiver that is illustrated in FIG. 20 has detected a relatively high correlation and/or other signal property across at least some of its antenna elements for signals relating to terminal 1 and for signals relating to terminal 2. Accordingly, the receiver has determined that each one of the two terminals (terminal 1 and terminal 2) is associated with at least some resolvable signal paths (as illustrated in FIG. 18a, FIG. 18b, FIG. 19a and/or FIG. 19b) and that the two terminals are sufficiently spaced apart therebetween so as to be served concurrently and co-channel using (for each one of the two terminals) spatial matched filtering, equalization/rake and/or interference reduction. It will be understood that if terminal 1 and terminal 2 are configured to communicate using OFDM/OFDMA signals, the equalizer/rake stage of the receiver of FIG. 20 may not be needed. Further, it will be understood that two different antenna systems, each comprising a plurality (e.g., N≥2) of antenna elements may be used to provide signal inputs to the spatial matched filter coefficients $\{W_{11}, W_{21}, \ldots, W_{N1}\}$ and coefficients $\{W_{12}, W_{22}, \ldots, W_{N2}\}$, respectively, instead of the single antenna system, comprising the plurality of (N≥2) antenna elements, as illustrated in FIG. 20.

Figure 21:
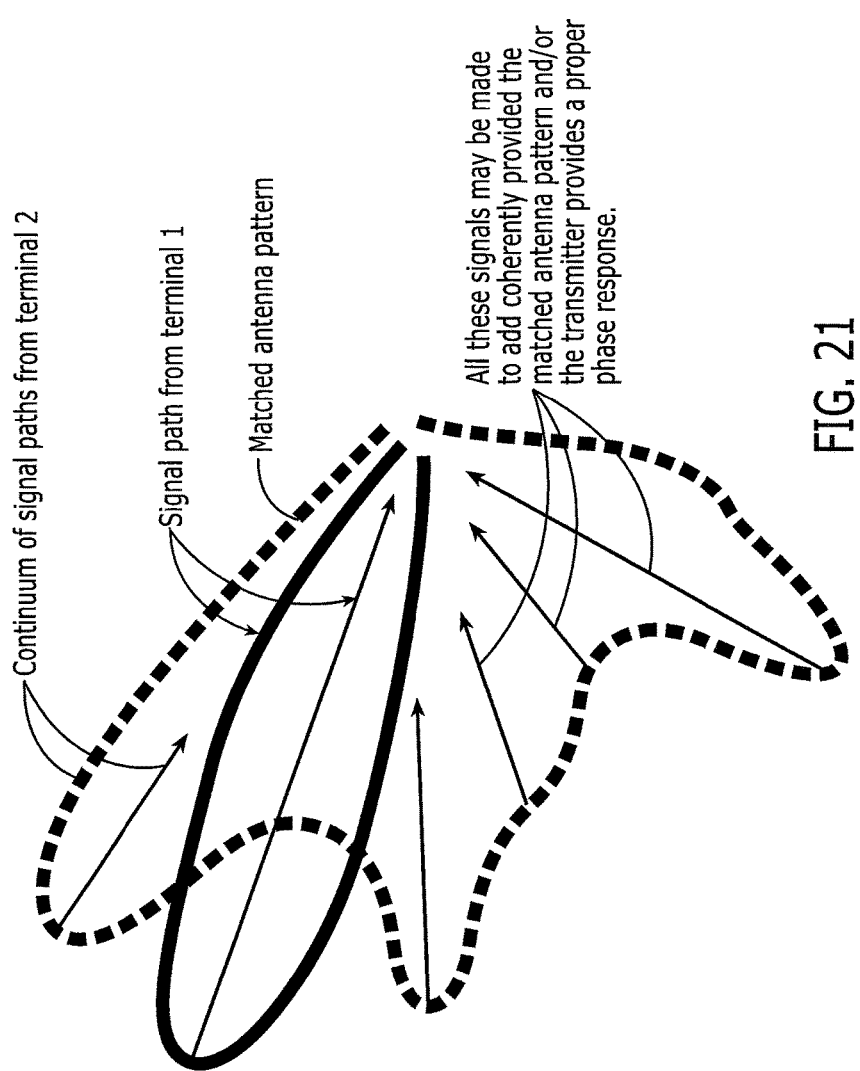
FIG. 21 further illustrates functions/characteristics of a transmitter/receiver that is configured to form/provide a spatial rake and/or a spatial matched filter according to embodiments of the invention.

Although in FIG. 20 only one signal path is illustrated as arriving from terminal 1, only one signal path is illustrated as arriving from terminal 2 and the two respective signal paths from terminal 1 and terminal 2 are illustrated in FIG. 20 as arriving from respective significantly different directions, this need not be the case in general. In some embodiments of the invention, a signal path (or a plurality of signal paths) from, for example, terminal 1 may be limited to a first angle-of-arrival (or a limited/small/narrow continuum of first angles of arrival) while a signal path (or a plurality of signal paths) from terminal 2 may comprise a plurality of second angles of arrival (or a relatively broad/large/wide continuum of second angles of arrival), and the plurality of second angles of arrival may comprise an intersection/overlap with the first angle of arrival, as is illustrated in FIG. 21. In some embodiments, a terminal determines/estimates a position thereof, relays the determined/estimated position to a base station, the base station uses the relayed position of the terminal and, in some embodiments, additional information regarding natural and/or man-made structures to form an antenna pattern, and uses the formed antenna pattern to conduct communications with the terminal.

Figure 22:
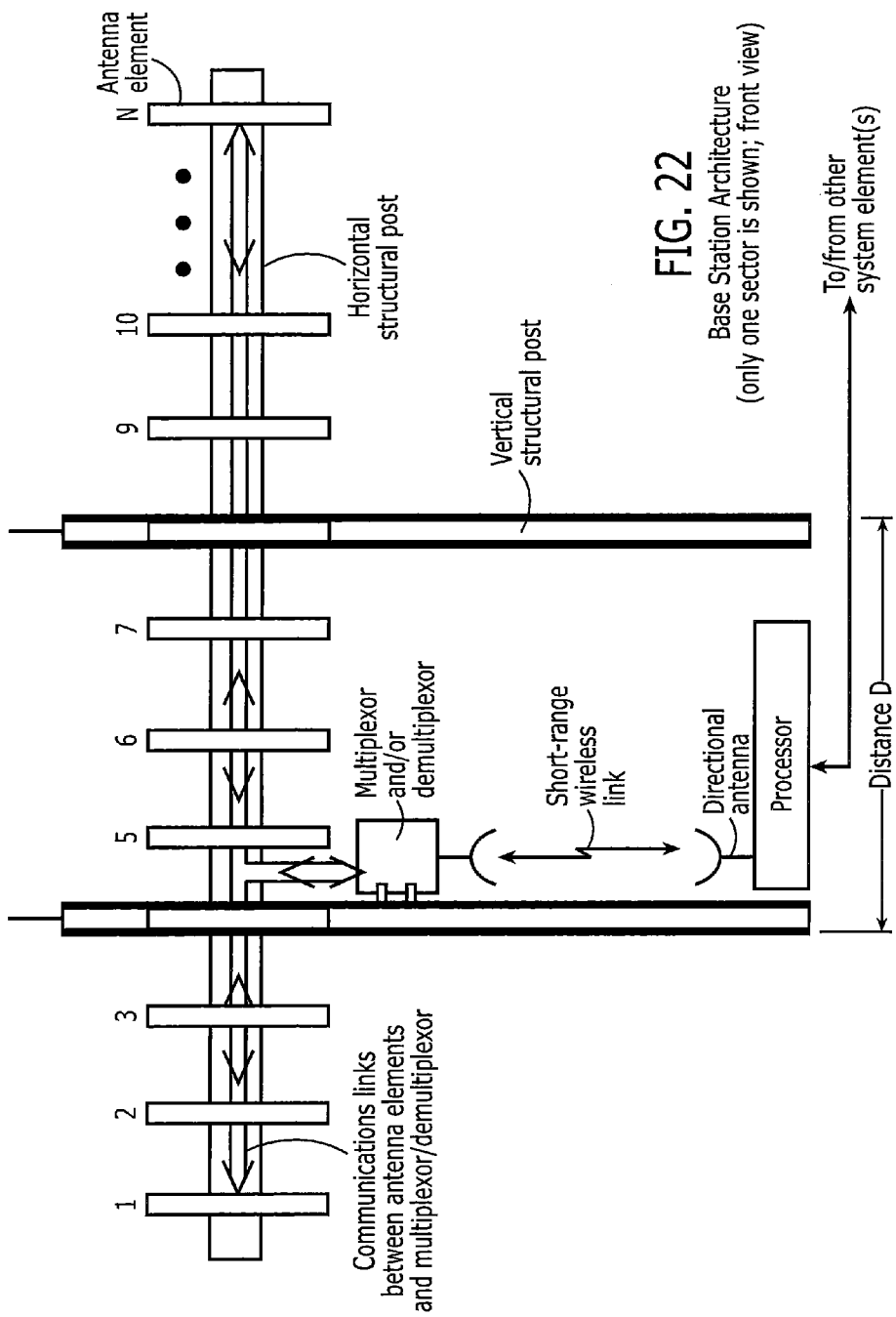
FIG. 22 illustrates an electrical/mechanical architecture of a base station according to embodiments of the invention.
Figure 23:
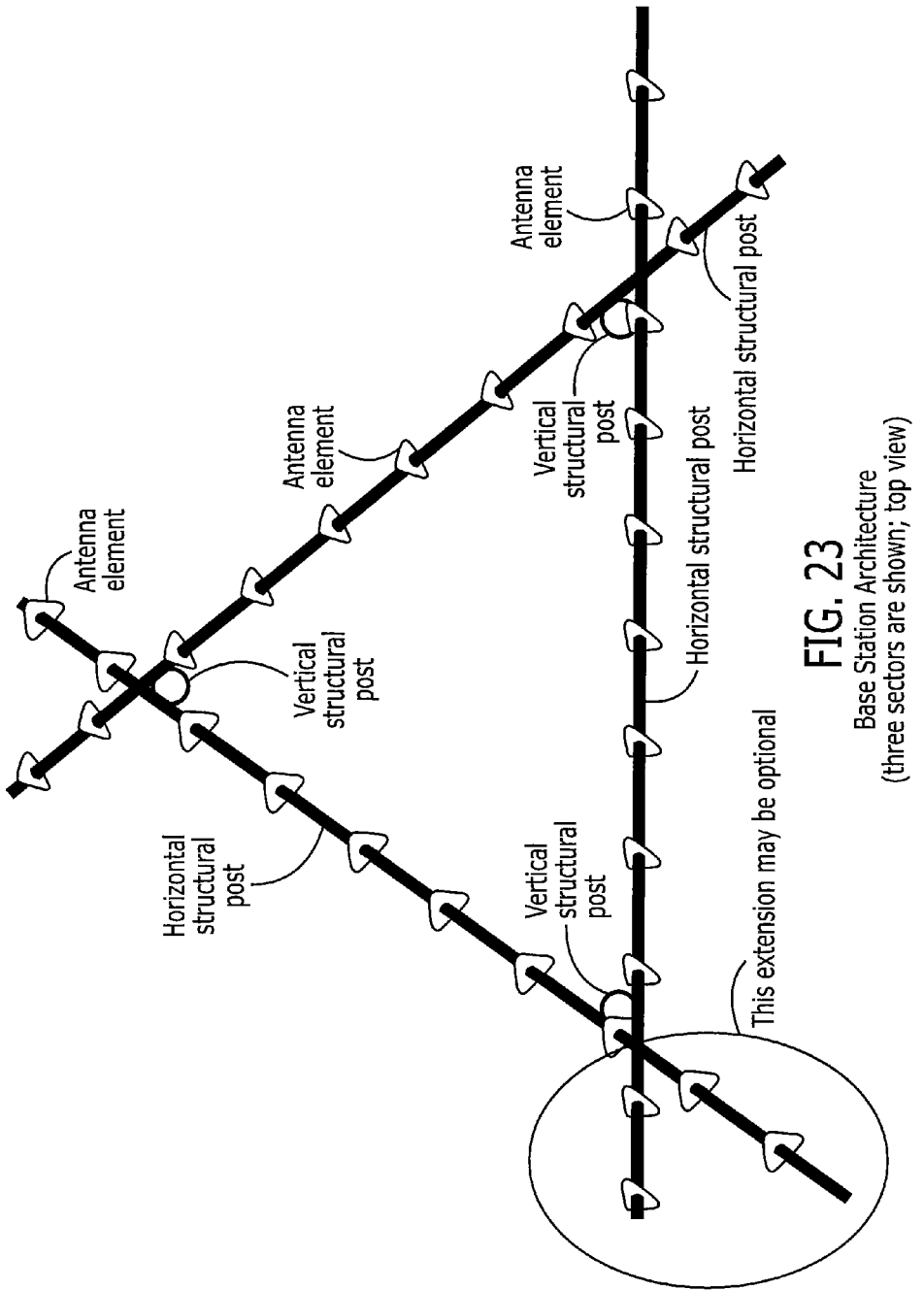
FIG. 23 further illustrates the electrical/mechanical architecture of the base station of FIG. 22 according to embodiments of the invention.

In yet additional embodiments of the present invention, based on a realization that a large number of base station antenna elements may preferably be used at a base station (or at a base station sector) to provide improved communications performance, a base station architecture is provided, comprising electrical and structural/mechanical elements, as is illustrated in FIG. 22 and in FIG. 23, that is capable of accommodating the large number of base station antenna elements. It will be appreciated by those skilled in the art, that providing at least two vertical structural/mechanical support posts (as is illustrated in FIG. 22), on which at least one horizontal structural post may be mounted and used to support a plurality (N≥2) of antenna elements, the plurality (N≥2) of antenna elements may be structurally more sound (and an overall structure of a base station tower may be structurally more sound) allowing the number N of antenna elements to increase. Accordingly, a base station that is based upon an architecture as described above and illustrated in FIG. 22 and FIG. 23 may provide improved communications performance. It will be understood that two or more sectors of the base station may be based upon the architecture described above.

Accordingly, in some embodiments, as a number of antenna elements of a base station is increases in order to provide improved communications performance, an increase in a number of cables may need to be provided between a base/foundation of the base station and the number of antenna elements that are configured on (e.g., at or near the top of) a tower of the base station. For example, if the base station comprises three sectors and each one of the three sectors is based upon an architecture as illustrated in FIG. 22 with, for example, sixteen antenna elements (N=16), then a total of 48 cables may have to be provided between the base/foundation and the plurality (forty eight) of antenna elements. In some embodiments, the vertical structural support posts illustrated in FIG. 22 and in FIG. 23 may be hollow and at least some of the cables may be configured inside of the hollow vertical structural support posts. In further embodiments, however, instead of cables (or in combination with at least some cables) at least one wireless link, that may be configured to be at least one short-range wireless link and, in some embodiments, at least one short-range wireless link that uses (is based upon) at least one directional antenna, may be used to communicate information between the base/foundation of the base station and the plurality of antenna elements that are configured on the tower of the base station, as is illustrated in FIG. 22 and/or FIG. 23.

The at least one wireless link that may be used to communicate information between the base/foundation of the base station and the plurality of antenna elements that are configured on the tower of the base station may be based upon any technology and/or protocol (such as, for example, Time Division Multiplexing (TDM) of a plurality of signals, Code Division Multiplexing (CDM) of the plurality of signals, Orthogonal Frequency Division Multiplexing (OFDM) of the plurality of signals, etc., or any combination thereof) and the multiplexor/demultiplexor that is illustrated in FIG. 22 may be configured in accordance with the technology and/or protocol that is used. Further to the above, the at least one wireless link that may be used to communicate information between the base/foundation of the base station and the plurality of antenna elements that are configured on the tower of the base station may be based upon any frequency band (licensed and/or unlicensed) and, according to some embodiments of the invention, the at least one wireless link may preferentially be based upon frequencies above 10 GHz and, in further embodiments, above 20 GHz, in order to increase a propagation attenuation thereof, such as, for example, an atmospheric absorption thereof, and thus limit a propagation distance thereof, reducing a level of potential interference.

It will be understood that although a single bi-directional wireless link is illustrated in FIG. 22, other embodiments may comprise a plurality of wireless links each one of which may be a short range wireless link and bi-directional (transferring information up and down the tower) or one-directional (transferring information either up or down the tower). Further, each one of the plurality of wireless links may use (be based upon) at least one directional antenna in order to maximize a radiation level thereof in a first predetermined direction (e.g., up and/or down; vertical direction) while minimizing, limiting and/or reducing a radiation level thereof in a second predetermined direction (e.g., in a horizontal direction). In accordance with one specific embodiment, two wireless links may be used wherein a first one of the two wireless links is configured to transfer information from the antenna elements of the tower to the base/foundation of the base station while a second one of the two wireless links is configured to transfer information from the base/foundation of the base station to the antenna elements of the tower. In accordance with this one specific embodiment, the first wireless link may be preceded by at least one Low Noise Amplifier (LNA), that may comprise a plurality of LNAs that may be configured in accordance with a Butler Matrix architecture; and the first wireless link may also be preceded by a multiplexor; an output of the at least one LNA being connected to an input of the multiplexor; both of which (the at least one LNA and the multiplexor) being configured at a height from the base/foundation of the tower (e.g., at the top of the tower, near the top of the tower and/or proximate to the antenna elements of the tower). Further, in accordance with said one specific embodiment, the first wireless link may be followed by a demultiplexor and/or additional electronics that is configured at or near the base/foundation of the tower Continuing with said one specific embodiment, the second wireless link may be preceded by a multiplexor that is configured at (or near) the base/foundation of the tower and the second wireless link may be followed by a demultiplexor an output of which may be connected to an input of a Power Amplifier (PA), that may comprise a plurality of PAs that may be configured in accordance with a Butler Matrix architecture, at (or near) the top of the tower and/or proximate to one or more antenna elements of the tower and configured to drive/excite the one or more antenna elements of the tower that may comprise a plurality of antenna elements as illustrated in FIG. 22 and/or in FIG. 23. A dimensionality of the Butler Matrix architecture may depend upon a number of antenna elements of the tower; and a Butler Matrix of N×N dimension may be used to drive N antenna elements of the tower.

In general, it will be understood that a multiplexor/demultiplexor may include (or be connected to) at least one Low Noise Amplifier (LNA) and/or at least one Power Amplifier (PA) and that the at least one LNA and/or the at least one PA may be configured in accordance with a Butler Matrix architecture, well known to those skilled in the art, in order to provide an amplification redundancy and/or a graceful degradation of performance in the event that one or more amplifier failures occur (at least one redundant amplifier may also be provided so that a redundant amplifier may be used (switched in) to replace a defective amplifier). The at least one PA may comprise a plurality of outputs that may be used to drive/excite a respective plurality of antenna elements situated on a tower of a base station; and the at least one LNA may comprise a plurality of inputs that may be used to receive and amplify a respective plurality of signals from a respective plurality of antenna elements.

It will be understood that each antenna element of the plurality of antenna elements may comprise at least one dipole radiating element, at least one monopole radiating element, at least one patch radiating element and/or any other radiating element such as, for example, waveguide opening(s), coaxial cable opening(s), etc. It will also be understood that each antenna element of the plurality of antenna elements may be linearly polarized (in at least one spatial dimension) and/or circularly polarized (left-hand circular or right-hand circular) and that different antenna elements may comprise different polarizations and/or different mechanical/electrical characteristics therebetween. Further, it will be understood that although FIG. 22 illustrates only a single row of N antenna elements that is used to form an overall antenna of a base station sector, a plurality of rows of antenna elements (of equal or differing number of antenna elements therebetween) may be configured at a respective plurality of elevations on a base station tower to thereby provide antenna beam steering capability along an elevation dimension. Accordingly, a two dimensional antenna array may be formed for a base station sector.

Figure 24:
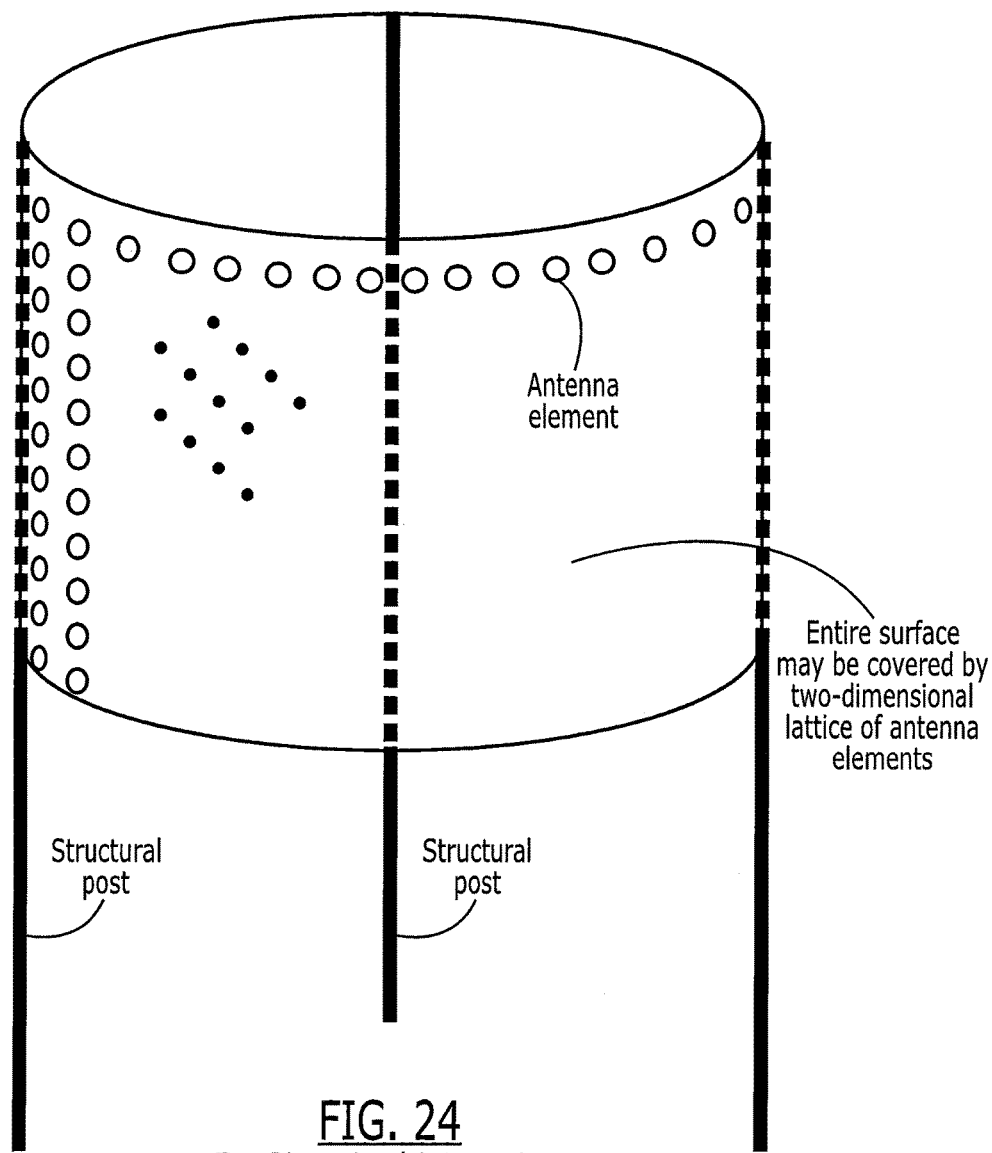
FIG. 24 illustrates a substantially cylindrical electrical/mechanical architecture of a base station comprising a two-dimensional lattice of antenna elements, according to additional embodiments of the invention.
Figure 25:
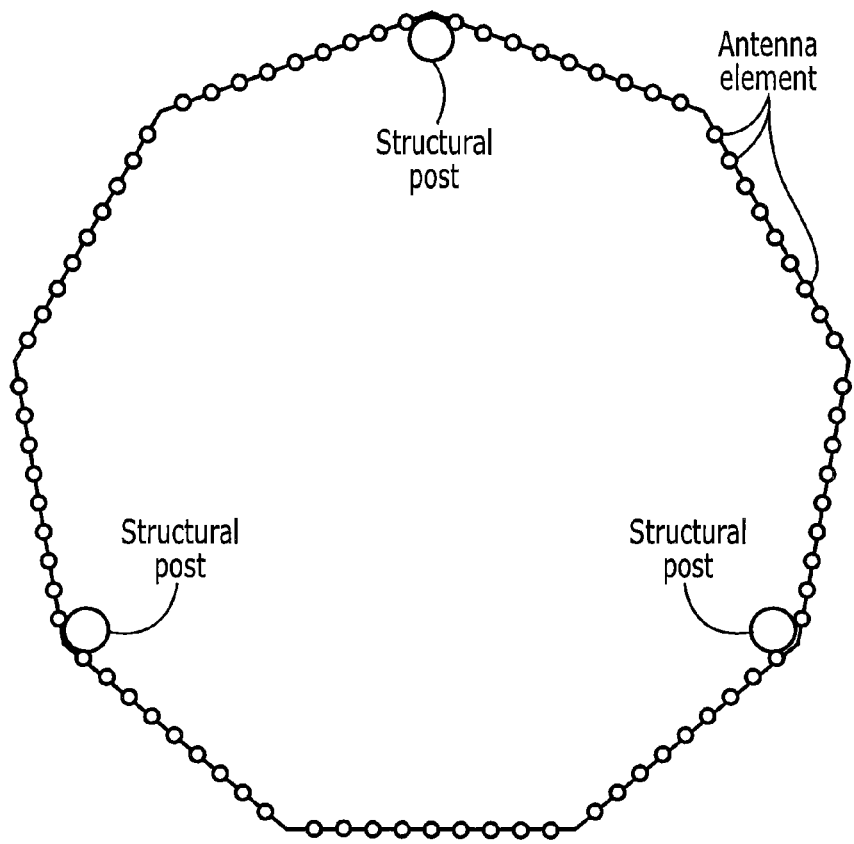
FIG. 25 further illustrates a top view of an electrical/mechanical architecture of a base station according to yet additional embodiments of the invention.

A two dimensional antenna array for a base station is illustrated in FIG. 24, in accordance with some embodiments, wherein a circular tubular architecture may be used that comprises a two-dimensional lattice of antenna elements, as is illustrated in FIG. 24. According to other embodiments, however, the architecture that comprises the two-dimensional lattice of antenna elements need not be circular tubular. FIG. 25, for example, illustrates a top view of a polygonal architecture according to some embodiments. The polygonal architecture may comprise any desired number of sides, such as, for example, 3, 4, 5, etc.; and, as it may readily be observed, as the number of sides of the polygonal architecture becomes very large (i.e., approaches infinity), the polygonal architecture approaches a circular tubular architecture, as has already been illustrated in FIG. 24. It will be understood that although the architectures that are illustrated in FIG. 24 and in FIG. 25 include only three vertical structural posts each, more than three (or less than three) vertical structural posts may be provided in further embodiments. Furthermore, it will be understood that although horizontal structural posts are not illustrated in FIG. 24 and FIG. 25, horizontal structural posts may also be provided in yet further embodiments. It will further be understood that any of the base station tower architectures illustrated herein may be encapsulated, at least partially by a radome material for protection against the elements (weather) and/or for climate control.

Those skilled in the art will appreciate that any of the embodiments described herein (or any element/portion of any embodiment that is described herein) may be combined with any other embodiment that is described herein (or element/portion thereof) to provide yet another embodiment. For example, elements of the embodiment that are illustrated in FIG. 22 may be combined with elements of the embodiment that are illustrated in FIG. 24 and/or in FIG. 25 to provide at least one other embodiment wherein a base station comprising a two-dimensional antenna array uses one or more wireless links to transport information back and/or forth between the two-dimensional antenna array and a processing facility associated with the base station. The processing facility may be proximate to, attached to, connected to and/or integrated with a base/foundation of the tower of the base station, in some embodiments, as has been described earlier, or it may be at a distance from the base/foundation of the tower of the base station, in other embodiments.

Accordingly, it is envisaged that, owing to an ever-increasing appetite for wireless broadband communications by various world communities (human and/or machine), systems, methods, architectures, devices, software, firmware and/or computer programs that improve spectral efficiency and communications capacity will be introduced, according to various embodiments of the present invention and/or other inventions, even though a signal processing complexity thereof may, currently and/or in the future, appear prohibitive. As is well understood and appreciated by those skilled in the art, anything that is associated with computationally prohibitive requirements today, in a decade or so will surrender to Moore's Law.

In the present specification and figures (and in the references that have been incorporated herein by reference in their entirety as if set forth fully herein), there have been disclosed embodiments of the invention and, although specific terms are employed, they are used in a generic and descriptive sense only and not for purposes of limitation; the following claims setting forth the scope of the present invention.

What is claimed is:
1. A communications method comprising:
receiving by a receiver a plurality of components of an overall signal; each component of the plurality of components comprising a characteristic value that is less than a corresponding characteristic value of the overall signal, wherein the characteristic value comprises a bandwidth;
configuring the receiver with a plurality of elements corresponding to the plurality of components of the overall signal;
receiving the overall signal by receiving by the receiver the plurality of components of the overall signal using the corresponding plurality of elements;
identifying that the overall signal to be received will exceed a limit associated with a subsystem of the receiver;
preventing the limit from being exceeded by refraining from receiving the overall signal via said subsystem of the receiver; and
receiving the plurality of components of the overall signal via the corresponding plurality of elements of the receiver.
2. The communications method according to claim 1, wherein the subsystem of the receiver comprises an antenna.
3. The communications method according to claim 1, wherein the limit is a bandwidth limit.

4. The communications method according to claim 1, wherein the subsystem of the receiver comprises an element of the receiver other than an antenna.

5. The communications method according to claim 1, wherein said overall signal comprises first and second frequency segments that are separated from one another by a frequency interval over which the overall signal is substantially devoid of frequency content.

6. The communications method according to claim 5, wherein the first and second frequency segments comprise an aggregate bandwidth of 100 MHz; the first frequency segment comprises a bandwidth of 40 MHz; and the second frequency segment comprises a bandwidth of 60 MHz.

7. The communications method according to claim 1, wherein said characteristic value further comprises a number of points of a Discrete Fourier Transform and/or a number of points of an Inverse Discrete Fourier transform.

8. The communications method according to claim 1, wherein a first and a second element of the plurality of elements comprise respective first and second antennas, first and second amplifiers, first and second Discrete Fourier Transforms and/or first and second Inverse Discrete Fourier transforms.

9. The communications method according to claim 8, wherein said configuring the receiver with a plurality of elements corresponding to the plurality of components of the overall signal comprises:
configuring the receiver with the first and second antennas, the first and second amplifiers, the first and second Discrete Fourier Transforms and/or the first and second Inverse Discrete Fourier transforms; and
wherein said receiving the overall signal by receiving by the receiver the plurality of components of the overall signal by using the corresponding plurality of elements comprises:
receiving a first component of the plurality of components by using the first antenna, the first amplifier, the first Discrete Fourier transform and/or the first Inverse Discrete Fourier Transform; and
receiving a second component of the plurality of components by using the second antenna, the second amplifier, the second Discrete Fourier transform and/or the second Inverse Discrete Fourier Transform.

10. The communications method according to claim 1, further comprising:
forming a matrix; and
processing the plurality of components by using the matrix.

11. The communications method according to claim 10, wherein the matrix comprises channel information.

12. The communications method according to claim 11, further comprising:
forming first and second matrices comprising respective first and second channel information;
processing a first component of the plurality of components by using the first matrix; and
processing a second component of the plurality of components by using the second matrix.

13. A communications system comprising:
a receiver comprising a plurality of elements corresponding to a plurality of components of an overall signal that is to be received by the receiver; each component of said plurality of components comprising a characteristic value that is less than a corresponding characteristic value of the overall signal, wherein the characteristic value comprises a bandwidth;
and a processor that is configured to:
receive the overall signal by processing the plurality of components of the overall signal via a respective plurality of elements;
identify that the overall signal to be received will exceed a limit associated with a subsystem of the receiver;
prevent the limit from being exceeded by refraining from processing the overall signal via said subsystem of the receiver;
and process the plurality of components via the respective plurality of elements of the receiver, thus receiving the overall signal.

14. The communications system according to claim 13, wherein the subsystem of the receiver comprises an antenna.

15. The communications system according to claim 13, wherein the limit is a bandwidth limit.

16. The communications system according to claim 13, wherein the subsystem of the receiver comprises an element of the receiver other than an antenna.

17. The communications system according to claim 13, wherein said overall signal comprises first and second frequency segments that are separated from one another by a frequency interval over which the overall signal is substantially devoid of frequency content.

18. The communications system according to claim 17, wherein the first and second frequency segments comprise an aggregate bandwidth of 100 MHz; the first frequency segment comprises a bandwidth of 40 MHz; and the second frequency segment comprises a bandwidth of 60 MHz.

19. The communications system according to claim 13, wherein said characteristic value further comprises a number of points of a Discrete Fourier Transform and/or a number of points of an Inverse Discrete Fourier transform.

20. The communications system according to claim 13, wherein a first and second element of the plurality of elements comprise respective first and second antennas, first and second amplifiers, first and second Discrete Fourier Transforms and/or first and second Inverse Discrete Fourier transforms.

21. The communications system according to claim 20, wherein the receiver comprises the first and second antennas, the first and second amplifiers, the first and second Discrete Fourier Transforms and/or the first and second Inverse Discrete Fourier transforms; and wherein the processor is further configured to receive a first component of the plurality of components by using the first antenna, the first amplifier, the first Discrete Fourier transform and/or the first Inverse Discrete Fourier Transform; and to receive a second component of the plurality of components by using the second antenna, the second amplifier, the second Discrete Fourier transform and/or the second Inverse Discrete Fourier Transform.

22. The communications system according to claim 13, wherein the processor is further configured to:
form a matrix; and
process the plurality of components by using the matrix.

23. The communications system according to claim 22, wherein said matrix comprises channel information; and wherein the processor is further configured to multiply the plurality of components by said matrix.

24. The communications system according to claim 22, wherein the processor is further configured to:
form first and second matrices;
process a first component of the plurality of components by using the first matrix; and
process a second component of the plurality of components by using the second matrix.

25. The communications system according to claim 13, further comprising a base station that is configured to:
receive information from a first terminal of a plurality of terminals and from a second terminal of the plurality of terminals; said plurality of terminals being within a service area of a sector of the base station;
determine, based on the received information, that the first terminal and the second terminal are sufficiently spaced apart from one another; and
provide communications to said first terminal and to said second terminal simultaneously and co-channel by using a multi-element antenna to form respective first and second antenna patterns that discriminate spatially, responsive to having determined that said first terminal and said second terminal are sufficiently spaced apart from one another.

26. A communications method comprising:
configuring a plurality of receiver chains;
receiving an overall signal by a receiver from a transmitter by using a first receiver chain of the plurality of receiver chains and a second receiver chain of the plurality of receiver chains to receive respective first and second different components of the overall signal over respective first and second mutually exclusive frequencies from the transmitter;
identifying that the overall signal to be received will exceed a limit associated with a subsystem of the receiver;
preventing the limit from being exceeded by refraining from receiving the overall signal via said subsystem of the receiver;
and receiving a plurality of components of the overall signal via the plurality of receiver chains thus receiving the overall signal and avoiding said exceeding.

27. The communications method according to claim 26, wherein the subsystem of the receiver comprises an antenna.

28. The communications method according to claim 26, wherein the limit is a bandwidth limit.

29. The communications method according to claim 26, wherein the subsystem of the receiver comprises an element of the receiver other than an antenna.

30. The communications method according to claim 26, wherein said overall signal comprises first and second frequency intervals over which the overall signal comprises frequency content; and wherein the first and second frequency intervals are separated from one another by a third frequency interval over which the overall signal is substantially devoid of frequency content.

31. The communications method according to claim 30, wherein the first and second frequency intervals comprise an aggregate bandwidth of 100 MHz; the first frequency interval comprises a bandwidth of 40 MHz; and the second frequency interval comprises a bandwidth of 60 MHz.

32. The communications method according to claim 26, wherein said first and second different components of the overall signal comprise respective first and second different frequency content, respective first and second different bandwidths and/or respective first and second different sub-carriers.

33. The communications method according to claim 26, wherein said first receiver chain of the plurality of receiver chains and said second receiver chain of the plurality of receiver chains comprise respective first and second different elements.

34. The communications method according to claim 33, wherein the respective first and second different elements comprise respective first and second different antennas, respective first and second different amplifiers, respective first and second different Discrete Fourier Transforms and/or respective first and second different Inverse Discrete Fourier transforms.

35. The communications method according to claim 34, wherein said configuring a plurality of receiver chains comprises:
providing the receiver with the first and second antennas, the first and second amplifiers, the first and second Discrete Fourier Transforms and/or the first and second Inverse Discrete Fourier transforms; and
wherein said receiving an overall signal by a receiver by using a first receiver chain of the plurality of receiver chains and a second receiver chain of the plurality of receiver chains to receive respective first and second different components of the overall signal over respective first and second mutually exclusive frequencies comprises:
receiving the first component of the overall signal by using the first antenna, the first amplifier, the first Discrete Fourier transform and/or the first Inverse Discrete Fourier Transform; and
receiving the second component of the overall signal by using the second antenna, the second amplifier, the second Discrete Fourier transform and/or the second Inverse Discrete Fourier Transform.

36. The communications method according to claim 26, further comprising:
forming a matrix; and
processing the first and second different components of the overall signal by using the matrix.

37. The communications method according to claim 36, wherein forming a matrix comprises using channel information; and wherein said processing the first and second different components of the overall signal by using the matrix comprises multiplying the first and second different components of the overall signal by the matrix.

38. The communications method according to claim 26, wherein said configuring a plurality of transmitter chains comprises:
using an antenna by the first receiver chain of the plurality of receiver chains and also using the antenna by the second receiver chain of the plurality of receiver chains.

39. A communications system comprising:
a receiver that comprises a plurality of receiver chains and a processor that is configured to perform operations comprising:
receiving an overall signal from a transmitter by using a first receiver chain of the plurality of receiver chains and a second receiver chain of the plurality of receiver chains to receive respective first and second different components of the overall signal over respective first and second mutually exclusive frequencies from the transmitter;
identifying that the overall signal to be received will exceed a limit associated with a subsystem of the receiver;
preventing the limit from being exceeded by refraining from processing the overall signal by said subsystem of the receiver; and
processing a plurality of components of the overall signal by the plurality of receiver chains.

40. The communications system according to claim 39, wherein the subsystem of the receiver comprises an antenna.

41. The communications system according to claim 39, wherein the limit is a bandwidth limit.

42. The communications system according to claim 39, wherein the subsystem of the receiver comprises an element of the receiver other than an antenna.

43. The communications system according to claim 39, wherein said overall signal comprises first and second frequency intervals over which the overall signal comprises frequency content; and wherein the first and second frequency intervals are separated from one another by a third frequency interval over which the overall signal is substantially devoid of frequency content.

44. The communications system according to claim 43, wherein the first and second frequency intervals comprise an aggregate bandwidth of 100MHz; the first frequency interval comprises a bandwidth of 40 MHz; and the second frequency interval comprises a bandwidth of 60 MHz.

45. The communications system according to claim 39, wherein said first and second different components of the overall signal comprise respective first and second different frequency content, respective first and second different bandwidths and/or respective first and second different sub-carriers.

46. The communications system according to claim 39, wherein said first receiver chain of the plurality of receiver chains and said second receiver chain of the plurality of receiver chains comprise respective first and second different elements.

47. The communications system according to claim 46, wherein the respective first and second different elements comprise respective first and second different antennas, respective first and second different amplifiers, respective first and second different Discrete Fourier Transforms and/or respective first and second different Inverse Discrete Fourier transforms.

48. The communications system according to claim 47, wherein the operations further comprise:
receiving the first component of the overall signal by using the first antenna, the first amplifier, the first Discrete Fourier transform and/or the first Inverse Discrete Fourier Transform; and
receiving the second component of the overall signal by using the second antenna, the second amplifier, the second Discrete Fourier transform and/or the second Inverse Discrete Fourier Transform.

49. The communications system according to claim 39, wherein the operations further comprise:
forming a matrix; and
processing the first and second different components of the overall signal by using the matrix.

50. The communications system according to claim 49, wherein said matrix comprises channel information.

51. The communications system according to claim 39, wherein the first receiver chain of the plurality of receiver chains and the second receiver chain of the plurality of receiver chains share a common antenna.

52. The communications system according to claim 39, wherein said overall signal comprises first and second frequency intervals over which the overall signal comprises frequency content; the first and second frequency intervals are separated from one another by a third frequency interval over which the overall signal is substantially devoid of frequency content; and wherein the first and second frequency intervals comprise an aggregate bandwidth of 100 MHz.

53. The communications system according to claim 52, wherein the first frequency interval comprises a bandwidth of 40 MHz.

54. The communications system according to claim 53, wherein the second frequency interval comprises a bandwidth of 60 MHz.

55. The communications system according to claim 52, wherein the second frequency interval comprises a bandwidth of 60 MHz.

56. The communications system according to claim 55, wherein the first frequency interval comprises a bandwidth of 40 MHz.

57. The communications system according to claim 39, further comprising a base station that is configured to:
receive information from a first terminal of a plurality of terminals and from a second terminal of the plurality of terminals; said plurality of terminals being within a service area of a sector of the base station;
determine, based on the received information, that the first terminal and the second terminal are sufficiently spaced apart from one another; and
provide communications to said first terminal and to said second terminal simultaneously and co-channel by using a multi-element antenna to form respective first and second antenna patterns that discriminate spatially, responsive to having determined that said first terminal and said second terminal are sufficiently spaced apart from one another.

* * * * *